United States Patent
Hampden-Smith et al.

(10) Patent No.: US 6,635,348 B1
(45) Date of Patent: *Oct. 21, 2003

(54) AEROSOL METHOD AND APPARATUS, PARTICULATE PRODUCTS, AND ELECTRONIC DEVICES MADE THEREFROM

(75) Inventors: Mark J. Hampden-Smith, Albuquer; Toivo T. Kodas, Albuquerque; Quint H. Powell, Albuquerque; Daniel J. Skamser, Albuquerque; James Caruso, Albuquerque, all of NM (US); Clive D. Chandler, Portland, OR (US)

(73) Assignee: Superior MicroPowders LLC, Albuquerque, NM (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/668,947

(22) Filed: Sep. 22, 2000

Related U.S. Application Data

(62) Division of application No. 09/030,057, filed on Feb. 24, 1998, now Pat. No. 6,338,809.
(60) Provisional application No. 60/039,450, filed on Feb. 24, 1997, and provisional application No. 60/038,258, filed on Feb. 24, 1997.

(51) Int. Cl.⁷ .................................................. B32B 5/16
(52) U.S. Cl. ........................ 428/402; 428/403; 428/545; 428/546; 428/552; 428/567; 428/570
(58) Field of Search .................................. 428/402, 403, 428/545, 546, 552–567, 570

(56) References Cited

U.S. PATENT DOCUMENTS

| | | | |
|---|---|---|---|
| 3,415,640 A | 12/1968 | Lambert | 75/0.5 |
| 3,510,291 A | 5/1970 | Brush | 75/0.5 |
| 3,510,292 A | 5/1970 | Hardy et al. | 75/5 |
| 3,617,358 A | 11/1971 | Dittrich | 117/105.2 |
| 3,846,345 A | 11/1974 | Mason et al. | 252/514 |
| 3,967,549 A | 7/1976 | Thompson et al. | 101/1 |
| 4,023,961 A | 5/1977 | Douglas et al. | 75/0.5 AC |
| 4,052,336 A | 10/1977 | van Montfoort et al. | 252/447 |
| 4,130,671 A | 12/1978 | Nagesh et al. | 427/125 |
| 4,136,059 A | 1/1979 | Jalan et al. | 252/447 |
| 4,241,042 A | 12/1980 | Matijevic et al. | 423/610 |

(List continued on next page.)

FOREIGN PATENT DOCUMENTS

| | | |
|---|---|---|
| EP | 0 537 502 | 4/1993 |
| EP | 0 593 167 | 4/1994 |
| EP | 0 776 717 | 6/1997 |
| JP | 62-2404 | 1/1987 |
| JP | 63-31522 | 2/1988 |
| JP | 1-179724 | 7/1989 |
| JP | 6-172802 | 6/1994 |
| JP | 8-170112 | 7/1996 |

OTHER PUBLICATIONS

Che, Shenglei et al., "Evolution of Particle Structure during the Formation of Single–Crystal Spherical Palladium Particles by Spray Pyrolysis," J. Ceram. Soc. Japan , vol. 105, No. 4 (1997), pp. 299–303.

(List continued on next page.)

Primary Examiner—Hoa T. Le
(74) Attorney, Agent, or Firm—Marsh Fischmann & Breyfogle LLP

(57) ABSTRACT

Provided is an aerosol method, and accompanying apparatus, for preparing powdered products of a variety of materials involving the use of an ultrasonic aerosol generator (106) including a plurality of ultrasonic transducers (120) underlying and ultrasonically energizing a reservoir of liquid feed (102) which forms droplets of the aerosol. Carrier gas (104) is delivered to different portions of the reservoir by a plurality of gas delivery ports (136) delivering gas from a gas delivery system. The aerosol is pyrolyzed to form particles, which are then cooled and collected. The invention also provides powders made by the method and devices made using the powders.

40 Claims, 33 Drawing Sheets

U.S. PATENT DOCUMENTS

| | | | |
|---|---|---|---|
| 4,266,977 A | 5/1981 | Steiger | 106/43 |
| 4,274,877 A | 6/1981 | Collier et al. | 75/252 |
| 4,395,279 A | 7/1983 | Houck | 75/0.5 BB |
| 4,396,420 A | 8/1983 | Schmidberger et al. | 75/0.5 AC |
| 4,482,641 A | 11/1984 | Wennerberg | 502/182 |
| 4,569,924 A | 2/1986 | Ozin et al. | 502/184 |
| 4,574,078 A | 3/1986 | Cortesi et al. | 423/592 |
| 4,594,181 A | 6/1986 | Siuta | 252/512 |
| 4,623,706 A | 11/1986 | Timm et al. | 526/88 |
| 4,652,537 A | 3/1987 | Tamura et al. | 502/5 |
| 4,724,134 A | 2/1988 | Good | 423/592 |
| 4,752,456 A | 6/1988 | Yoda et al. | 423/291 |
| 4,799,622 A | 1/1989 | Ishikawa et al. | 239/102.2 |
| 4,801,411 A | 1/1989 | Wellinghoff et al. | 264/7 |
| 4,804,167 A | 2/1989 | Kock et al. | 266/200 |
| 4,819,831 A | 4/1989 | Green et al. | 222/420 |
| 4,822,410 A | 4/1989 | Matovich | 75/0.5 B |
| 4,871,489 A | 10/1989 | Ketchem | 264/9 |
| 4,894,086 A | 1/1990 | Huether et al. | 75/0.5 A |
| 4,897,110 A | 1/1990 | Kock et al. | 75/0.5 A |
| H799 H | 7/1990 | Farthing et al. | 55/392 |
| 4,970,128 A | 11/1990 | Itoh et al. | 429/42 |
| 4,970,189 A | 11/1990 | Tachibana | 502/183 |
| 4,999,182 A | 3/1991 | Baumard et al. | 423/608 |
| 5,032,242 A | 7/1991 | Knudsen et al. | 204/157.41 |
| 5,068,161 A | 11/1991 | Keck et al. | 429/44 |
| 5,120,699 A | 6/1992 | Weiss et al. | 502/185 |
| 5,126,915 A | 6/1992 | Pepin et al. | 361/304 |
| 5,145,113 A | 9/1992 | Burwell et al. | 239/102.2 |
| 5,152,457 A | 10/1992 | Burwell et al. | 239/102.2 |
| 5,269,980 A | 12/1993 | Levendis et al. | 264/9 |
| 5,318,797 A | 6/1994 | Matijevic et al. | 427/213.31 |
| 5,338,330 A | 8/1994 | Polizzotti et al. | 75/228 |
| 5,356,842 A * | 10/1994 | Yamakawa et al. | 501/87 |
| 5,358,695 A | 10/1994 | Helble et al. | 423/592 |
| 5,368,834 A | 11/1994 | Kulwicki et al. | 423/598 |
| 5,402,305 A | 3/1995 | Asada et al. | 361/305 |
| 5,420,744 A | 5/1995 | Asada et al. | 361/305 |
| 5,421,854 A | 6/1995 | Kodas et al. | 75/355 |
| 5,429,657 A | 7/1995 | Glicksman et al. | 75/351 |
| 5,439,502 A | 8/1995 | Kodas et al. | 75/365 |
| 5,453,169 A | 9/1995 | Callstrom et al. | 204/242 |
| 5,495,386 A | 2/1996 | Kulkarni | 361/303 |
| 5,501,915 A | 3/1996 | Hards et al. | 429/42 |
| 5,520,715 A | 5/1996 | Oeftering | 75/335 |
| 5,545,360 A | 8/1996 | Yang | 264/9 |
| 5,567,662 A | 10/1996 | Dunmead et al. | 501/87 |
| 5,589,300 A | 12/1996 | Fauteux et al. | 429/218 |
| 5,628,937 A | 5/1997 | Oliver et al. | 264/9 |
| 5,876,867 A | 3/1999 | Itoh et al. | 429/44 |
| 6,103,393 A * | 8/2000 | Kodas et al. | 428/570 |
| 6,159,267 A * | 12/2000 | Hampden-Smith et al. | 75/252 |
| 6,165,247 A | 12/2000 | Kodas et al. | 75/331 |
| 6,180,029 B1 | 1/2001 | Hampden-Smith et al. | 252/301.4 R |
| 6,316,100 B1 | 11/2001 | Kodas et al. | 428/357 |

OTHER PUBLICATIONS

Che, Shenglei et al., "Preparation and Formation Mechanism of Silica–Encapsulated Palladium Particles by Spray Pyrolysis," J. Ceram. Soc. Japan, vol. 105, No. 3 (1997), pp. 269–271 [Japanese text with English Abstract].

Che, Shenglei et al., "Effect of calcium modification on the microstructure and oxidation property of submicron spherical palladium powders," J. Mater. Res., vol. 12, No. 2 (Feb. 1997), pp. 392–397.

Che, Shenglei et al., "Effects of Starting Materials on the Preparation of Spherical Pd Powders by Ultrasonic Spray Pyrolysis," J. Ceram. Soc. Japan, vol. 104, Int. Ed. (1996), pp. 39–44.

Chein, HungMin and Dale A. Lundgren, A High–Output, Size–Selective Aerosol Generator, Aerosol Sci.,& Tech., 23 (1995), pp. 510–520.

Chein, Hungmin and Dale A. Lundgren, "A Virtual Impactor with Clean Air Core for the Generation of Aerosols with Narrow Size Distributions," Aerosol Sci., & Tech. , 18 (1993), pp. 376–388.

Tohge, Noboru et al., "Formation of Fine Particles of Zinc Sulfide from Thiourea Complexes by Spray Pyrolysis," Jpn. J. Appl. Phys., vol. 34, Part 2, No. 2B (Feb. 1995), pp. L207–L209.

Denton, M.B. and D.B. Swartz, "An improved ultrasonic nebulizer system for the generation of high density aerosol dispersions," Rev. Sci. Instrum., vol. 45, No. 1 (Jan. 1974), pp. 81–83.

Gurav, Abhijit et al., "Aerosol Processing of Materials," Aerosol Sci. & Tech. ,19 (1993), pp. 411–452.

Jain, Sanjeev et al., "In Situ Formation of Coated and Composite Palladium Particles via Spray Pyrolysis," J. Electrochem. Soc., vol. 143, No. 11 (Nov. 1996), pp. 3762–3770.

Kang, Yun Chan et al., "Preparation of CaTiO3:Pr Phosphor by Spray Pyrolysis Using Filter Expansion Aerosol Generator," J. Aerosol Sci., vol. 28, Suppl. 1 (1997), pp. S541–S542, Kang, Yun Chan et al., "Preparation of Submicron Size Gamma Lithium Aluminate Particles from the Mixture of Alumina Sol and Lithium Salt by Ultrasonic Spray Pyrolysis," J. Colloid & Interface Sci , 182 (1996), pp. 59–62.

Kang, Yun Chan and Seung Bin Park, "Morphology and Size of Fine Silver Particles Prepared by Using the Filter Expansion Aerosol Generator," J. Korean Institute of Chemical Engineers, vol. 34, No. 2 (Apr. 1996), pp. 183–187 [Korean Text, with English Abstract].

Lenggoro, I.W. and K. Okuyana, "Preparation of Nanometer–Sized Zinc Sulfide Particles by Electrospray Pyrolysis," J. Aerosol Sci., vol. 28, Suppl. 1 (1997), pp. S351–S352.

Mayville, Francis C. et al., "Preparation of Uniform Spherical Titania Particles Coated with Polyurea by the Aerosol Technique," J. Colloid & Interface Sci., 120 (Nov. 1987) pp. 135–139.

Nagashima, K. et al., "Properties of conductive films made from fine spherical silver–palladium alloy particles," J. Mater Sci., 26 (1991), pp. 2477–2482.

Nagashima, Kazuro et al., "Preparation of fine Ni particles by the spray–pyrolysis technique and their film forming properties in the think film method," J. Mater. Res., vol. 5, No. 12 (Dec. 1990), pp. 2828–2834.

Park, Seung Bin and Yun Chan Kang, "Preparation of Fine Silver Particles by Decomposing Droplets Produced from Filter Expansion Aerosol Generator," J. Aerosol Sci., vol. 26, Suppl. 1 (1995), pp. S605–S606.

Pillai, R.S. et al., "Generation of Concentrated Aerosols for Inhalation Studies," J. Aerosol Sci., vol. 25, No. 1 (1994), pp. 187–197.

Pluym, Tammy C. et al., "Silver–palladium alloy particle production by spray pyrolysis," J. Mater. Res., vol. 10, No. 7 (Jul. 1995), pp. 1661–1673.

Pluym, T.C. et al., "Solid Silver Particle Production by Spray Pyrolysis," J. Aerosol Sci., vol. 24, No. 3 (1993), pp. 383–392.

Rodes, C. et al., "Measurements of the Size Distribution of Aerosols Produced by Ultrasonic Humidification," Aerosol Sci. & Tech., 13 (1990), pp. 220–229.

Sioutas, C. et al., "Development and Evaluation of a Low Cutpoint Virtual Impactor," Aerosol Sci. & Tech., 21 (1994), pp. 223–235.

* cited by examiner

102 → AEROSOL GENERATOR 106 → 108 → AEROSOL CONCENTRATOR 236 → 240 → FURNACE 110 → 112 → PARTICLE COLLECTOR 114

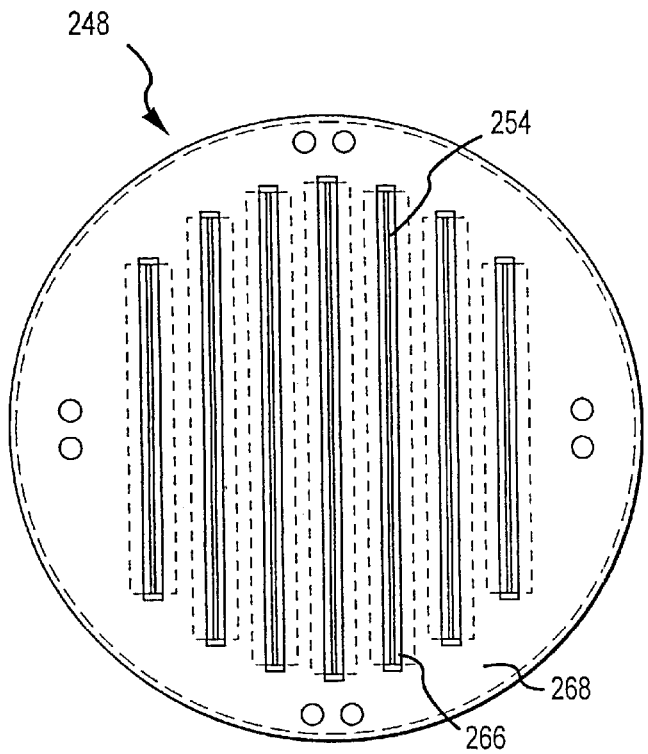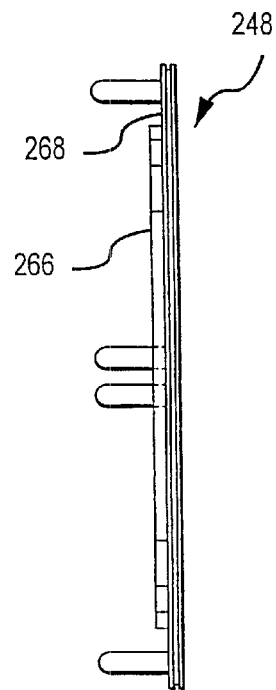
FIG.27          FIG.29
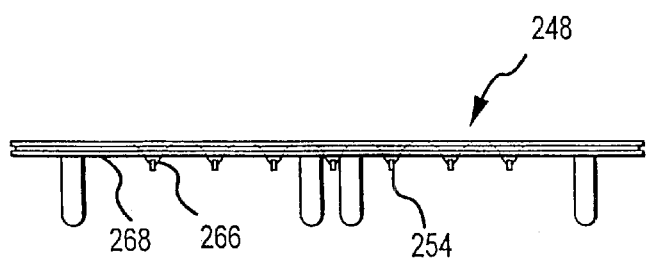
FIG.28

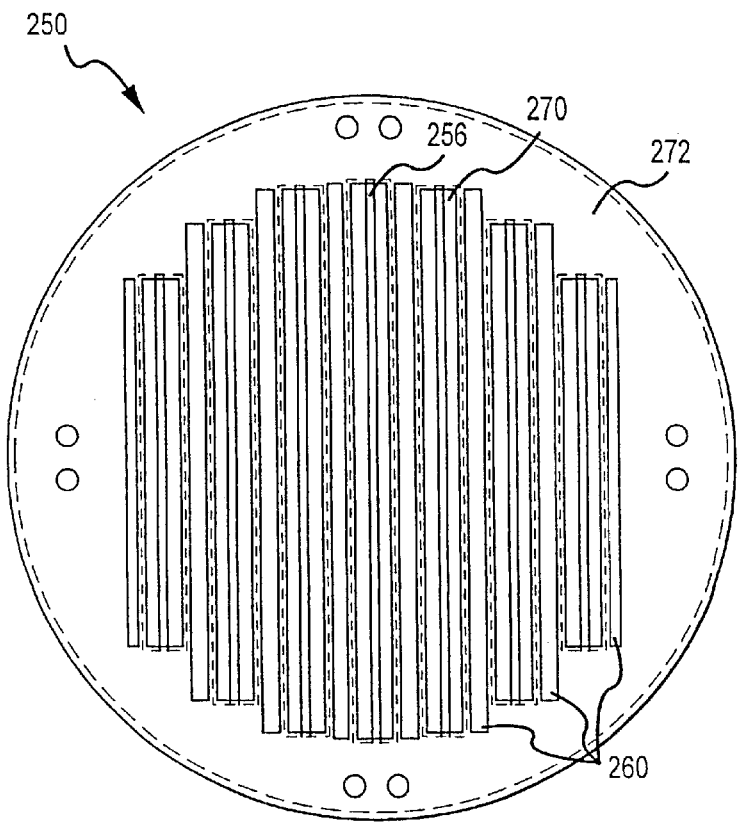
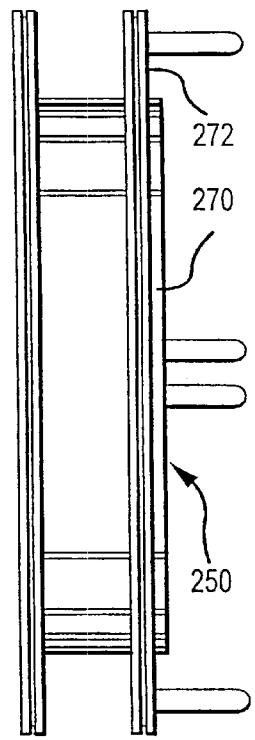
FIG.30  FIG.32
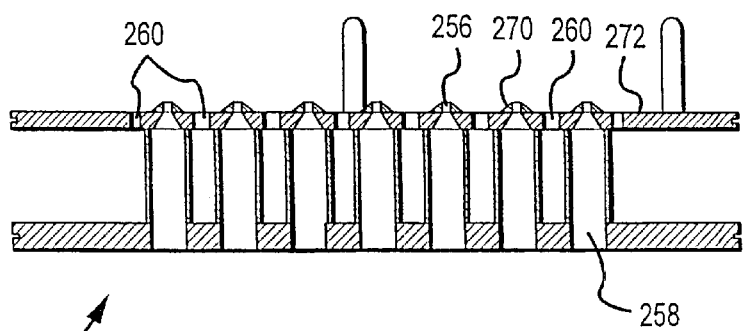
FIG.31

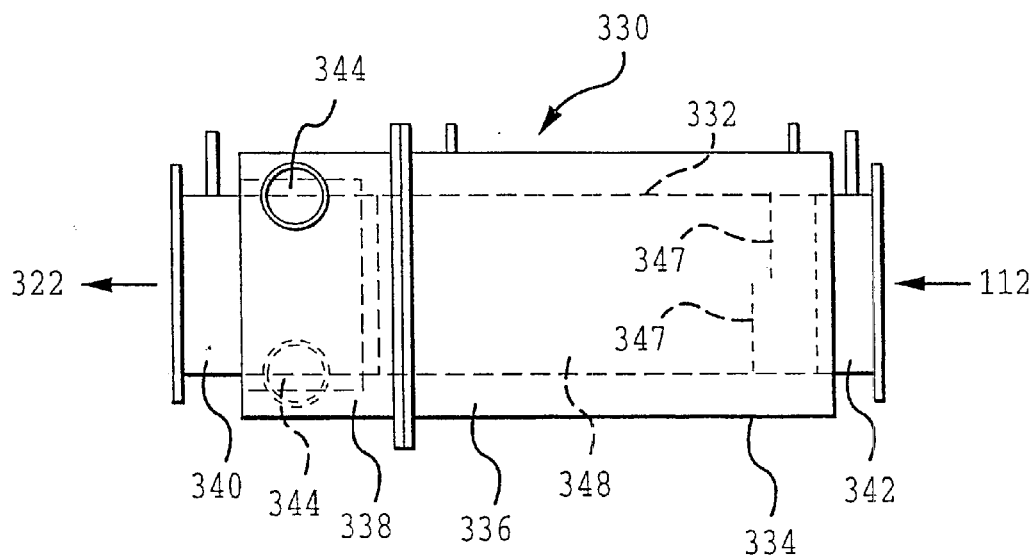
FIG. 41
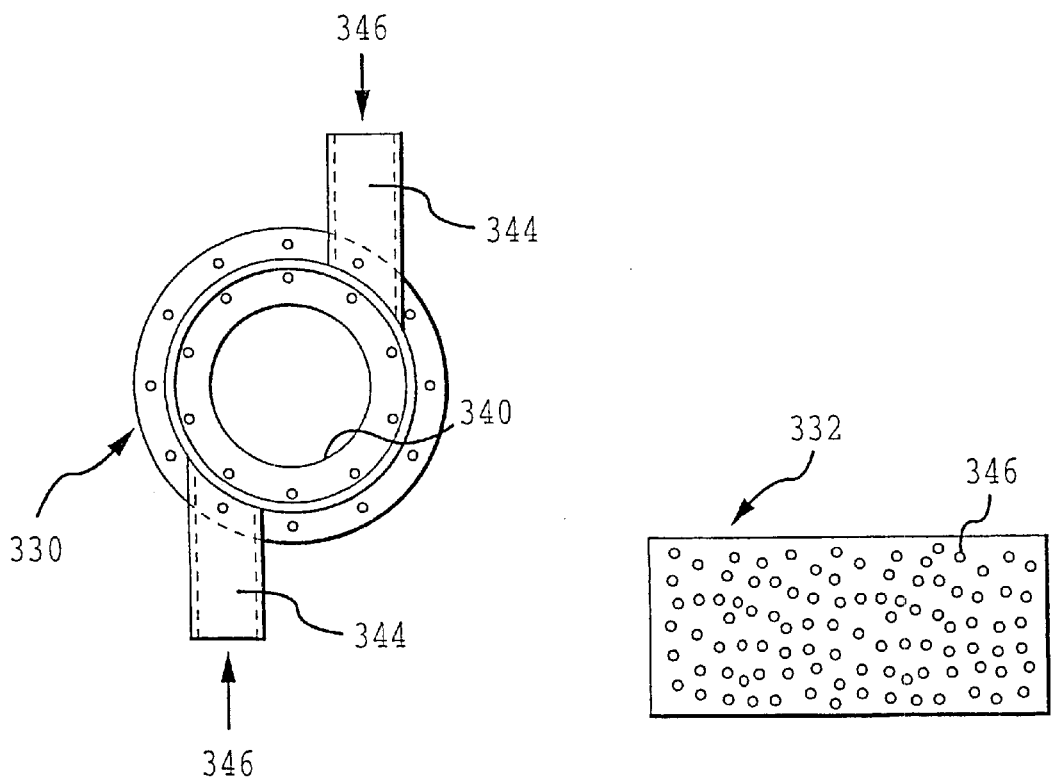
FIG. 42
FIG. 43

AEROSOL METHOD AND APPARATUS, PARTICULATE PRODUCTS, AND ELECTRONIC DEVICES MADE THEREFROM

CROSS-REFERENCE TO RELATED APPLICATIONS

This application is a divisional application of U.S. patent application Ser. No. 09/030,057, entitled "AEROSOL METHOD AND APPARATUS, PARTICULATE PRODUCTS, AND ELECTRONIC DEVICES MADE THEREFROM", filed Feb. 24, 1998 now U.S. Pat. No. 6,338,509, the enter contents of which is incorporated herein, and which claims priority to U.S. Provisional Patent Application No. 60/039,450 filed Feb. 24, 1997, and to U.S. Provisional Patent Application No. 60/038,258 filed Feb. 24, 1997.

FIELD OF THE INVENTION

The present invention involves aerosol production of finely-divided particles of a variety of compositions. The present invention also involves the particles so manufactured and electronic devices made using the particles.

BACKGROUND OF THE INVENTION

Powdered materials are used in many manufacturing processes. One large use for powders is for thick film deposition to prepare films of a variety of materials. Some thick film applications include, for example, deposition of phosphor materials for flat panel displays, and patterning of eclectically conductive features for electronic products.

For thick film applications, and for other applications, there is a trend to use powders of ever smaller particles. Generally desirable features in small particles include a small particle size; a narrow particle size distribution; a dense, spherical particle morphology; and a crystalline grain structure. Existing technologies for preparing powdered products, however, often could be improved with respect to attaining all, or substantially all, of these desired features for particles used in thick film applications.

One method that has been used to make small particles is to precipitate the particles from a liquid medium. Such liquid precipitation techniques are often difficult to control to produce particles with the desired characteristics. Also, particles prepared by liquid precipitation routes often are contaminated with significant quantities of surfactants or other organic materials used during the liquid phase processing.

Aerosol methods have also been used to make a variety of small particles. One aerosol method for making small particles is spray pyrolysis, in which an aerosol spray is generated and then converted in a reactor to the desired particles. Spray pyrolysis systems have, however, been mostly experimental, and unsuitable for commercial particle production. Furthermore, control of particle size distribution is a concern with spray pyrolysis. Also, spray pyrolysis systems are often inefficient in the use of carrier gases that suspend and carry liquid droplets of the aerosol. This inefficiency is a major consideration for commercial applications of spray pyrolysis systems.

There is a significant need for improved manufacture techniques for making powders of small particles for use in thick film and other applications.

Not only would improved particle manufacture techniques be desirable, but improved materials would also be desirable for a variety of applications. For example, there is a significant problem in cofire processes, such as cofiring of multi-layer ceramic capacitors and other components, of delaminations and other failures that can occur due to sintering/densification/shrinkage mismatch between adjoining layers. Improved techniques for providing high quality particles to reduce these problems would be desirable.

SUMMARY OF THE INVENTION

The present invention provides an aerosol process for manufacturing finely-divided powders of a variety of materials having desirable properties and at commercially acceptable rates. Apparatus is also provided for implementing the manufacturing method.

An important aspect of the present invention is aerosol generation. An aerosol generator and aerosol generation method are provided that are capable of producing large quantities of a high quality, dense aerosol for spray pyrolysis operations. This is significantly different from aerosol generation that has previously occurred with respect to spray pyrolysis particle manufacture in small-scale, laboratory systems. An aerosol generator is provided including an array of ultrasonic transducers underlying a single reservoir of precursor Solution that is ultrasonically energized to produce the aerosol. Careful distribution of carrier gas to different portions of the reservoir results in an efficient use of carrier gas in making a dense aerosol and at a high rate suitable for commercial applications.

The process is versatile for preparing powders of a number of materials. An important group of powders prepared with the process of the present invention include multi-phase particles.

Particularly advantageous are multi-phase particles designed for use in manufacturing electrically-conductive metallic films for electronic products. The multi-phase particles include a metallic phase and a non-metallic phase. In one preferred type of multi-phase particles, the non-metallic phase comprises at least one of silica, alumina, titania and zirconia. In another preferred type of multi-phase particles, the non-metallic phase includes a titanate, such as barium titanate, neodymium titanate or other titanates as discussed below.

Yet another important type of multi-phase particles of the present invention include those having a metallic phase and a non-metallic phase including elemental carbon. These multi-phase particles are useful as electrode materials and as catalysts.

The present invention also provides electronic products including a dielectric layer adjoining an electrically conductive film that has been formed using multi-phase particles of the present invention, and especially using multi-phase particles including a titanate as the non-metallic phase. In this way, the electrically conductive film may be cofired with a titanate dielectric layer with improved compatibility between the layers, for reduced delaminations and other failures.

These and other aspects of the invention are discussed in more detail below.

BRIEF DESCRIPTION OF THE DRAWINGS

FIG. 25 is a process block diagram of one embodiment in the present invention including an aerosol concentrator.

FIG. 27 is a front view of an upstream plate assembly of the virtual impactor shown in FIG. 26.

FIG. 28 is a top view of the upstream plate assembly shown in FIG. 27.

FIG. 29 is a side view of the upstream plate assembly shown in FIG. 27.

FIG. 30 is a front view of a downstream plate assembly of the virtual impactor shown in FIG. 26.

FIG. 31 is a top view of the downstream plate assembly shown in FIG. 30.

FIG. 32 is a side view of the downstream plate assembly shown in FIG. 30.

FIG. 41 is a top view of a gas quench cooler of the present invention.

FIG. 42 is an end view of the gas quench cooler shown in FIG. 41.

FIG. 43 is a side view of a perforated conduit of the quench cooler shown in FIG. 41.

DETAILED DESCRIPTION OF THE INVENTION

Figure 1:
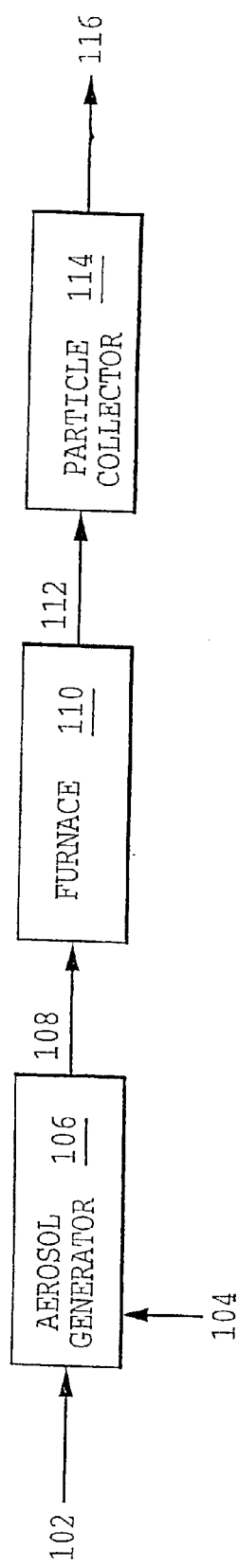
FIG. 1 is a process block diagram showing one embodiment of the process of the present invention.
Figure 2:
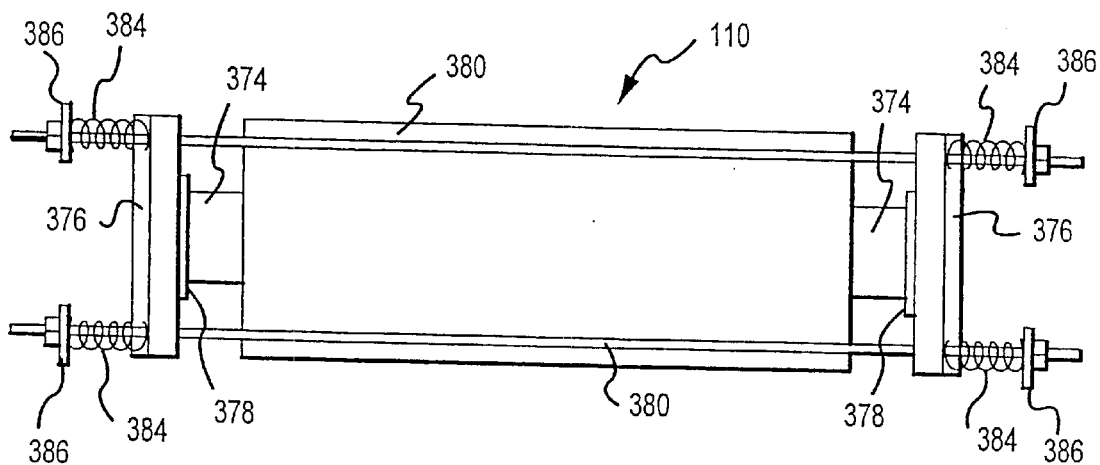
FIG. 2 is a side view of a furnace and showing one embodiment of the present invention for sealing the end of a furnace tube.
Figure 3:
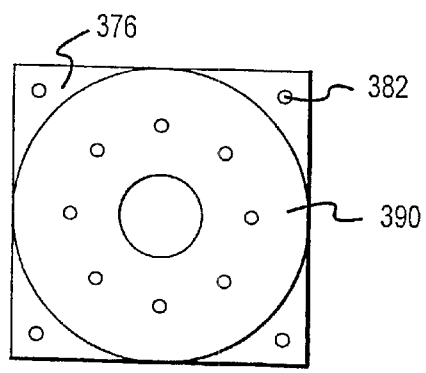
FIG. 3 is a view of the side of an end cap that faces away from the furnace shown in FIG. 2.
Figure 4:
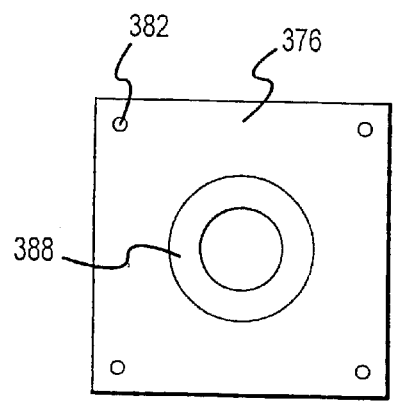
FIG. 4 is a view of the side of an end cap that faces toward the furnace shown in FIG. 2.

In one aspect, the present invention provides a method for preparing a particulate product. A feed of liquid-containing, flowable medium, including at least one precursor for the desired particulate product, is converted to aerosol form, with droplets of the medium being dispersed in and suspended by a carrier gas. Liquid from the droplets in the aerosol is then removed to permit formation in a dispersed state of the desired particles. Typically, the feed precursor is pyrolyzed in a furnace to make the particles. In one embodiment, the particles are subjected, while still in a dispersed state, to compositional or structural modification, if desired. Compositional modification may include, for example, coating the particles. Structural modification may include, for example, crystallization, recrystallization or morphological alteration of the particles. The term powder is often used herein to refer to the particulate product of the present invention. The use of the term powder does not indicate, however, that the particulate product must be dry or in any particular environment. Although the particulate product is typically manufactured in a dry state, the particulate product may, after manufacture, be placed in a wet environment, such as in a slurry.

The process of the present invention is particularly well suited or the production of particulate products of finely divided particles having a weight average size, for most applications, in a range having a lower limit of about 0.1 micron, preferably about 0.3 micron, more preferably about 0.5 micron and most preferably about 0.8 micron; and having an upper limit of about 4 microns, preferably about 3 microns, more preferably about 2.5 microns and more preferably about 2 microns. A particularly preferred range for many applications is a weight average size of from about 0.5 micron to about 3 microns, and more particularly from about 0.5 micron to about 2 microns. For some applications, however, other weight average particle sizes may be particularly preferred.

In addition to making particles within a desired range of weight average particle size, with the present invention the particles may be produced with a desirably narrow size distribution, thereby providing size uniformity that is desired for many applications.

In addition to control over particle size and size distribution, the method of the present invention provides significant flexibility for producing particles of varying composition, crystallinity and morphology. For example, the present invention may be used to produce homogeneous particles involving only a single phase or multi-phase particles including multiple phases. In the case of multi-phase particles, the phases may be present in a variety of morphologies. For example, one phase may be uniformly dispersed throughout a matrix of another phase. Alternatively, one phase may form an interior core while another phase forms a coating that surrounds the core. Other morphologies are also possible, as discussed more fully below.

Referring now to FIG. 1, one embodiment of the process of the present invention is described. A liquid feed 102, including at least one precursor for the desired particles, and a carrier gas 104 are fed to an aerosol generator 106 where an aerosol 108 is produced. The aerosol 108 is then fed to a furnace 110 where liquid in the aerosol 108 is removed to produce particles 112 that are dispersed in and suspended by gas exiting the furnace 110. The particles 112 are then collected in a particle collector 114 to produce a particulate product 116.

As used herein, the liquid feed 102 is a feed that includes one or more flowable liquids as the major constituent(s), such that the feed is a flowable medium. The liquid feed 102 need not comprise only liquid constituents. The liquid feed 102 may comprise only constituents in one or more liquid phase, or it may also include particulate material suspended in a liquid phase. The liquid feed 102 must, however, be capable of being atomized to form droplets of sufficiently small size for preparation of the aerosol 108. Therefore, if the liquid feed 102 includes suspended particles, those particles should be relatively small in relation to the size of droplets in the aerosol 108. Such suspended particles should typically be smaller than about 1 micron in size, preferably smaller than about 0.5 micron in size, and more preferably smaller than about 0.3 micron in size and most preferably smaller than about 0.1 micron in size. Most preferably, the suspended particles should be able to form a colloid. The suspended particles could be finely divided particles, or could be agglomerate masses comprised of agglomerated smaller primary particles. For example, 0.5 micron particles could be agglomerates of nanometer-sized primary particles. When the liquid feed 102 includes suspended particles, the particles typically comprise no greater than about 25 to 50 weight percent of the liquid feed.

As noted, the liquid feed 102 includes at least one precursor for preparation of the particles 112. The precursor may be a substance in either a liquid or solid phase of the liquid feed 102. Frequently, the precursor will be a material, such as a salt, dissolved in a liquid solvent of the liquid feed 102. Typical precursor salts include nitrate, chloride, sulfate, acetate and oxalate salts and the like. The precursor may undergo one or more chemical reactions in the furnace 110 to assist in production of the particles 112. Alternatively, the precursor material may contribute to formation of the particles 112 without undergoing chemical reaction. This could be the case, for example, when the liquid feed 102 includes, as a precursor material, suspended particles that are not chemically modified in the furnace 110. In any event, the particles 112 comprise at least one component originally contributed by the precursor.

The liquid feed 102 may include multiple precursor materials, which may be present together in a single phase or separately in multiple phases. For example, the liquid feed 102 may include multiple precursors in solution in a single liquid vehicle. Alternatively, one precursor material could be in a solid particulate phase and a second precursor material could be in a liquid phase. Also, one precursor material could be in one liquid phase and a second precursor material could be in a second liquid phase, such as could be the case when the liquid feed 102 comprises an emulsion. Different components contributed by different precursors may be present in the particles together in a single material phase, or the different components may be present in different material phases when the particles 112 are composites of multiple phases.

When the liquid feed 102 includes a soluble precursor, the precursor solution should be unsaturated to avoid the formation of precipitates. Solutions of salts will typically be used in concentrations in a range to provide a solution including from about 1 to about 50 weight percent solute. Most often, the liquid feed will include a solution with from about 5 weight percent to about 40 weight percent solute, and more preferably to about 30 weight percent solute. Preferably the solvent is aqueous-based for ease of operation, although other solvents, such as toluene or other organic solvents, may be desirable for specific materials. The use of organic solvents, however, can sometimes lead to undesirable carbon contamination in the particles. The pH of the aqueous-based solutions can be adjusted to alter the solubility characteristics of the precursor or precursors in the solution.

The carrier gas 104 may comprise any gaseous medium in which droplets produced from the liquid feed 102 may be dispersed in aerosol form. Also, the carrier gas 104 may be inert, in that the carrier gas 104 does not participate in formation of the particles 112. Alternatively, the carrier gas may have one or more active component(s) that contribute to formation of the particles 112. In that regard, the carrier gas may include one or more reactive components that react in the furnace 110 to contribute to formation of the particles 112.

The aerosol generator 106 atomizes the liquid feed 102 to form droplets in a manner to permit the carrier gas 104 to sweep the droplets away to form the aerosol 108. The droplets comprise liquid from the liquid feed 102. The droplets may, however, also include nonliquid material, such as one or more small particles held in the droplet by the liquid. For example, when the particles 112 are composite, or multi-phase, particles, one phase of the composite may be provided in the liquid feed 102 in the form of suspended precursor particles and a second phase of the composite may be produced in the furnace 110 from one or more precursors in the liquid phase of the liquid feed 102. Furthermore the precursor particles could be included in the liquid feed 102, and therefore also in droplets of the aerosol 108, for the purpose only of dispersing the particles for subsequent compositional or structural modification during or after processing in the furnace 110.

An important aspect of the present invention is generation of the aerosol 108 with droplets of a small average size, narrow size distribution. In this manner, the particles 112 may be produced at a desired small size with a narrow size distribution, which are advantageous for many applications.

The aerosol generator 106 is capable of producing the aerosol 108 such that it includes droplets having a weight average size in a range having a lower limit of about 1 micron and preferably about 2 microns; and an upper limit of about 10 microns, preferably about 7 microns, more preferably about 5 microns and most preferably about 4 microns. A weight average droplet size in a range of from about 2 microns to about 4 microns is more preferred for most applications, with a weight average droplet size of about 3 microns being particularly preferred for some applications. The aerosol generator is also capable of producing the aerosol 108 such that it includes droplets in a narrow size distribution. Preferably, the droplets in the aerosol are such that at least about 70 percent (more preferably at least about 80 weight percent and most preferably at least about 85 weight percent) of the droplets are smaller than about 10 microns and more preferably at least about 70 weight percent (more preferably at least about 80 weight percent and most preferably at least about 85 weight percent) are smaller than about 5 microns. Furthermore, preferably no greater than about 30 weight percent, more preferably no greater than about 25 weight percent and most preferably no greater than about 20 weight percent, of the droplets in the aerosol 108 are larger than about twice the weight average droplet size.

Another important aspect of the present invention is that the aerosol 108 may be generated without consuming excessive amounts of the carrier gas 104. The aerosol generator 106 is capable of producing the aerosol 108 such that it has a high loading, or high concentration, of the liquid feed 102 in droplet form. In that regard, the aerosol 108 preferably includes greater than about $1 \times 10^6$ droplets per cubic centimeter of the aerosol 108, more preferably greater than about $5 \times 10^6$ droplets per cubic centimeter, still more preferably greater than about $1 \times 10^7$ droplets per cubic centimeter, and most preferably greater than about $5 \times 10^7$ droplets per cubic centimeter. That the aerosol generator 106 can produce such a heavily loaded aerosol 108 is particularly surprising considering the high quality of the aerosol 108 with respect to small average droplet size and narrow droplet size distribution. Typically, droplet loading in the aerosol is such that the volumetric ratio of liquid feed 102 to carrier gas 104 in the aerosol 108 is larger than about 0.04 milliliters of liquid feed 102 per liter of carrier gas 104 in the aerosol 108, preferably larger than about 0.083 milliliters of liquid feed 102 per liter of carrier gas 104 in the aerosol 108, more preferably larger than about 0.167 milliliters of liquid feed 102 per liter of carrier gas 104, still more preferably larger than about 0.25 milliliters of liquid feed 102 per liter of carrier gas 104, and most preferably larger than about 0.333 milliliters of liquid feed 102 per liter of carrier gas 104.

This capability of the aerosol generator 106 to produce a heavily loaded aerosol 108 is even more surprising given the high droplet output rate of which the aerosol generator 106 is capable, as discussed more fully below. It will be appreciated that the concentration of liquid feed 102 in the aerosol 108 will depend upon the specific components and attributes of the liquid feed 102 and, particularly, the size of the droplets in the aerosol 108. For example, when the average droplet size is from about 2 microns to about 4 microns, the droplet loading is preferably larger than about 0.15 milliliters of aerosol feed 102 per liter of carrier gas 104, more preferably larger than about 0.2 milliliters of liquid feed 102 per liter of carrier gas 104, even more preferably larger than about 0.2 milliliters of liquid feed 102 per liter of carrier gas 104, and most preferably larger than about 0.3 milliliters of liquid feed 102 per liter of carrier gas 104. When reference is made herein to liters of carrier gas 104, it refers to the volume that the carrier gas 104 would occupy under conditions of standard temperature and pressure.

The furnace 110 may be any suitable device for heating the aerosol 108 to evaporate liquid from the droplets of the aerosol 108 and thereby permit formation of the particles 112. For most applications, maximum average stream temperatures in the furnace 110 will generally be in a range of from about 500° C. to about 1500° C., and preferably in the range of from about 900° C. to about 1300° C. The maximum average stream temperature refers to the maximum average temperature that an aerosol stream attains while flowing through the furnace. This is typically determined by a temperature probe inserted into the furnace.

Although longer residence times are possible, for many applications, residence time in the heating zone of the furnace 110 of shorter than about 4 seconds is typical, with shorter than about 2 seconds being preferred, shorter than about 1 second being more preferred, shorter than about 0.5 second being even more preferred, and shorter than about 0.2 second being most preferred. The residence time should be long enough, however to assure that the particles 112 attain the desired maximum average stream temperature for a given heat transfer rate. In that regard, with extremely short residence times, higher furnace temperatures could be used to increase the rate of heat transfer so long as the particles 112 attain a maximum temperature within the desired stream temperature range. That mode of operation, however, is not preferred. Also, it is preferred that, in most cases, the maximum average stream temperature not be attained in the furnace 110 until substantially at the end of the heating zone in the furnace 110. For example, the heating zone will often include a plurality of heating sections that are each independently controllable. The a maximum average stream temperature should typically not be attained until the final heating section, and more preferably until substantially at the end of the last heating section. This is important to reduce the potential for thermophoretic losses of material. Also, it is noted that as used herein, residence time refers to the actual time for a material to pass through the relevant process equipment. In the case of the furnace, this includes the effect of increasing velocity with gas expansion due to heating.

Typically, the furnace 110 will be a tube-shaped furnace, so that the aerosol 108 moving into and through the furnace does not encounter sharp edges on which droplets could collect. Loss of droplets to collection at sharp surfaces results in a lower yield of particles 112. More important, however, the accumulation of liquid at sharp edges can result in re-release of undesirably large droplets back into the aerosol 108, which can cause contamination of the particulate product 116 with undesirably large particles. Also, over time, such liquid collection at sharp surfaces can cause fouling of process equipment, impairing process performance.

The furnace 110 may include a heating tube made of any suitable material. The tube material may be a ceramic material, for example, mullite, silica or alumina. Alternatively, the tube may be metallic. Advantages of using a metallic tube are low cost, ability to withstand steep temperature gradients and large thermal shocks, machinability and weldability, and ease of providing a seal between the tube and other process equipment. Disadvantages of using a metallic tube include limited operating temperature and increased reactivity in some reaction systems.

When a metallic tube is used in the furnace 110, it is preferably a high nickel content stainless steel alloy, such as a 330 stainless steel, or a nickel-based super alloy. As noted, one of the major advantages of using a metallic tube is that the tube is relatively easy to seal with other process equipment. In that regard, flange fittings may be welded directly to the tube for connecting with other process equipment. Metallic tubes are generally preferred for making particles that do not require a maximum tube wall temperature of higher than about 1100° C. during particle manufacture.

When higher temperatures are required, ceramic tubes are typically used. One major problem with ceramic tubes, however, is that the tubes can be difficult to seal with other process equipment, especially when the ends of the tubes are maintained at relatively high temperatures, as is often the case with the present invention.

One configuration for sealing a ceramic tube is shown in FIGS. 2, 3 and 4. The furnace 110 includes a ceramic tube 374 having an end cap 376 fitted to each end of the tube 374, with a gasket 378 disposed between corresponding ends of the ceramic tube 374 and the end caps 376. The gasket may be of any suitable material for sealing at the temperature encountered at the ends of the tubes 374. Examples of gasket materials for sealing at temperature below about 250° C. include silicone, TEFLON™ and VITON™. Examples of gasket materials for higher temperatures include graphite, ceramic paper, thin sheet metal, and combinations thereof.

Tension rods 380 extend over the length of the furnace 110 and through rod holes 382 through the end caps 376. The tension rods 380 are held in tension by the force of springs 384 bearing against bearing plates 386 and the end caps 376. The tube 374 is, therefore, in compression due to the force of the springs 384. The springs 384 may be compressed any desired amount to form a seal between the end caps 376 and the ceramic tube 374 through the gasket 378. As will be appreciated, by using the springs 384, the tube 374 is free to move to some degree as it expands upon heating and contracts upon cooling. To form the seal between the end caps 376 and the ceramic tube 374, one of the gaskets 378 is seated in a gasket seat 388 on the side of each end cap 376 facing the tube 374. A mating face 390 on the side of each of the end caps 376 faces away from the tube 374, for mating with a flange surface for connection with an adjacent piece of equipment.

Also, although the present invention is described with primary reference to a furnace reactor, which is preferred, it should be recognized that, except as noted, any other thermal reactor, including a flame reactor or a plasma reactor, could be used instead. A furnace reactor is, however, preferred, because of the generally even heating characteristic of a furnace for attaining a uniform stream temperature.

The particle collector 114, may be any suitable apparatus for collecting particles 112 to produce the particulate product 116. One preferred embodiment of the particle collector 114 uses one or more filter to separate the particles 112 from gas. Such a filter may be of any type, including a bag filter. Another preferred embodiment of the particle collector uses one or more cyclone to separate the particles 112. Other apparatus that may be used in the particle collector 114 includes an electrostatic precipitator. Also, collection should normally occur at a temperature above the condensation temperature of the gas stream in which the particles 112 are suspended. Also, collection should normally be at a temperature that is low enough to prevent significant agglomeration of the particles 112.

The process and apparatus of the present invention are well-suited for producing commercial-size batches of extremely high quality particles. In that regard, the process and the accompanying apparatus provide versatility for preparing powder including a wide variety of materials, and easily accommodate shifting of production between different specialty batches of particles.

Of significant importance to the operation of the process of the present invention is the aerosol generator 106, which must be capable of producing a high quality aerosol with high droplet loading, as previously noted. With reference to FIG. 5, one embodiment of an aerosol generator 106 of the present invention is described. The aerosol generator 106 includes a plurality of ultrasonic transducer discs 120 that are each mounted in a transducer housing 122. The transducer housings 122 are mounted to a transducer mounting plate 124, creating an array of the ultrasonic transducer discs 120. Any convenient spacing may be used for the ultrasonic transducer discs 120. Center-to-center spacing of the ultrasonic transducer discs 120 of about 4 centimeters is often adequate. The aerosol generator 106, as shown in FIG. 5, includes forty-nine transducers in a 7×7 array. The array configuration is as shown in FIG. 6, which depicts the locations of the transducer housings 122 mounted to the transducer mounting plate 124.

With continued reference to FIG. 5, a separator 126, in spaced relation to the transducer discs 120, is retained between a bottom retaining plate 128 and a top retaining plate 130. Gas delivery tubes 132 are connected to gas distribution manifolds 134, which have gas delivery ports 136. The gas distribution manifolds 134 are housed within a generator body 138 that is covered by generator lid 140. A transducer driver 144, having circuitry for driving the transducer discs 120, is electronically connected with the transducer discs 120 via electrical cables 146.

During operation of the aerosol generator 106, as shown in FIG. 5, the transducer discs 120 are activated by the transducer driver 144 via the electrical cables 146. The transducers preferably vibrate at a frequency of from about 1 MHz to about 5 MHz, more preferably from about 1.5 MHz to about 3 MHz. Frequently used frequencies are at about 1.6 MHz and about 2.4 MHz. Furthermore, all of the transducer discs 110 should be operating at substantially the same frequency when an aerosol with a narrow droplet size distribution is desired. This is important because commercially available transducers can vary significantly in thickness, sometimes by as much as 10%. It is preferred, however, that the transducer discs 120 operate at frequencies within a range of 5% above and below the median transducer frequency, more preferably within a range of 2.5%, and most preferably within a range of 1%. This can be accomplished by careful selection of the transducer discs 120 so that they all preferably have thicknesses within 5% of the median transducer thickness, more preferably within 2.5%, and most preferably within 1%.

Liquid feed 102 enters through a feed inlet 148 and flows through flow channels 150 to exit through feed outlet 152. An ultrasonically transmissive fluid, typically water, enters through a water inlet 154 to fill a water bath volume 156 and flow through flow channels 158 to exit through a water outlet 160. A proper flow rate of the ultrasonically transmissive fluid is necessary to cool the transducer discs 120 and to prevent overheating of the ultrasonically transmissive fluid. Ultrasonic signals from the transducer discs 120 are transmitted, via the ultrasonically transmissive fluid, across the water bath volume 156, and ultimately across the separator 126, to the liquid feed 102 in flow channels 150.

The ultrasonic signals from the ultrasonic transducer discs 120 cause atomization cones 162 to develop in the liquid feed 102 at locations corresponding with the transducer discs 120. Carrier gas 104 is introduced into the gas delivery tubes 132 and delivered to the vicinity of the atomization cones 162 via gas delivery ports 136. Jets of carrier gas exit the gas delivery ports 136 in a direction so as to impinge on the atomization cones 162, thereby sweeping away atomized droplets of the liquid feed 102 that are being generated from the atomization cones 162 and creating the aerosol 108, which exits the aerosol generator 106 through an aerosol exit opening 164.

Efficient use of the carrier gas 104 is an important aspect of the aerosol generator 106. The embodiment of the aerosol generator 106 shown in FIG. 5 includes two gas exit ports per atomization cone 162, with the gas ports being positioned above the liquid medium 102 over troughs that develop between the atomization cones 162, such that the exiting carrier gas 104 is horizontally directed at the surface of the atomization cones 162, thereby efficiently distributing the carrier gas 104 to critical portions of the liquid feed 102 for effective and efficient sweeping away of droplets as they form about the ultrasonically energized atomization cones 162. Furthermore, it is preferred that at least a portion of the opening of each of the gas delivery ports 136, through which the carrier gas exits the gas delivery tubes, should be located below the top of the atomization cones 162 at which the carrier gas 104 is directed. This relative placement of the gas delivery ports 136 is very important to efficient use of carrier gas 104. Orientation of the gas delivery ports 136 is also important. Preferably, the gas delivery ports 136 are positioned to horizontally direct jets of the carrier gas 104 at the atomization cones 162. The aerosol generator 106 permits generation of the aerosol 108 with heavy loading with droplets of the carrier liquid 102, unlike aerosol generator designs that do not efficiently focus gas delivery to the locations of droplet formation.

Figure 5:
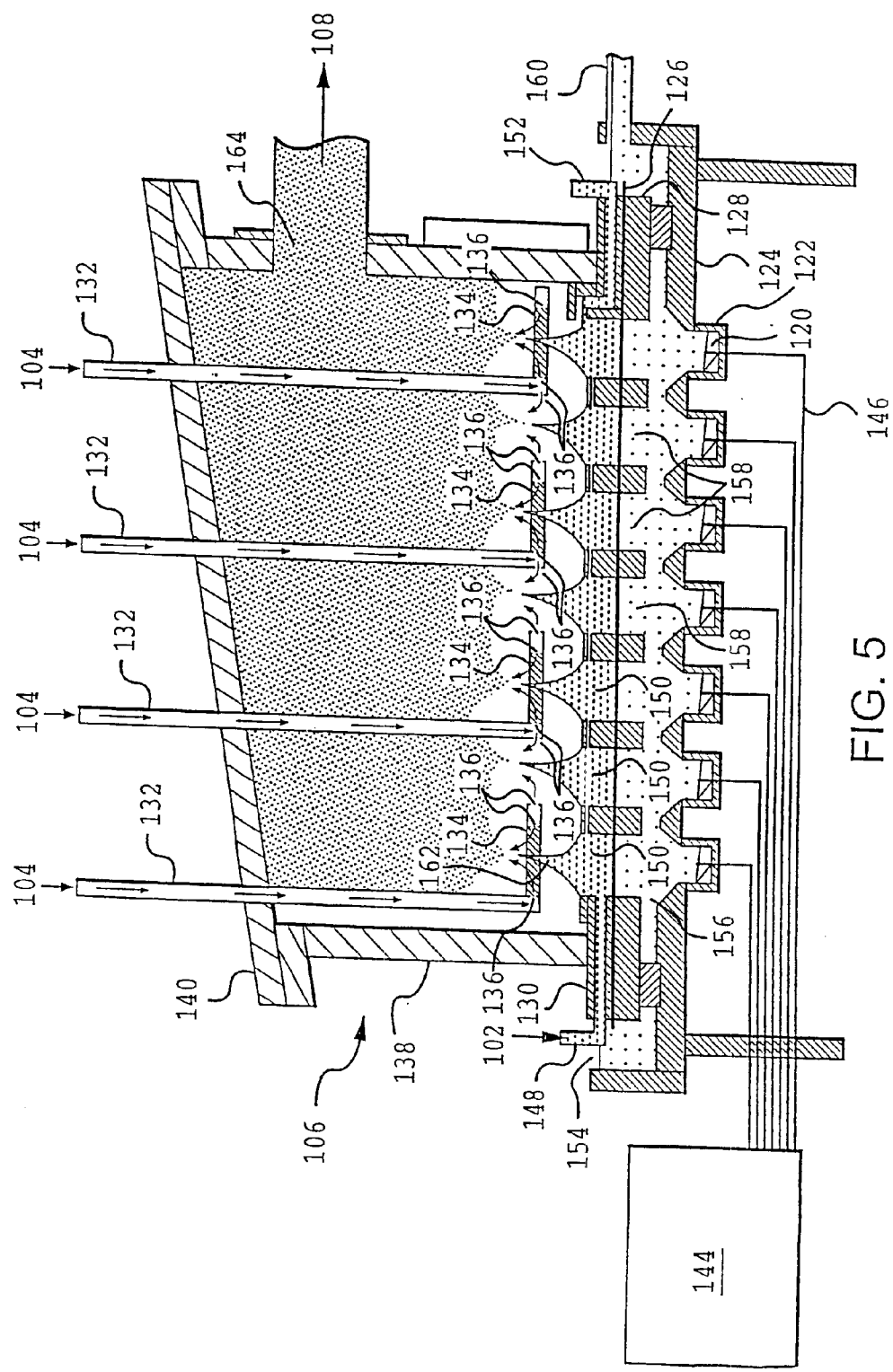
FIG. 5 is a side view in cross section of one embodiment of aerosol generator of the present invention.
Figure 6:
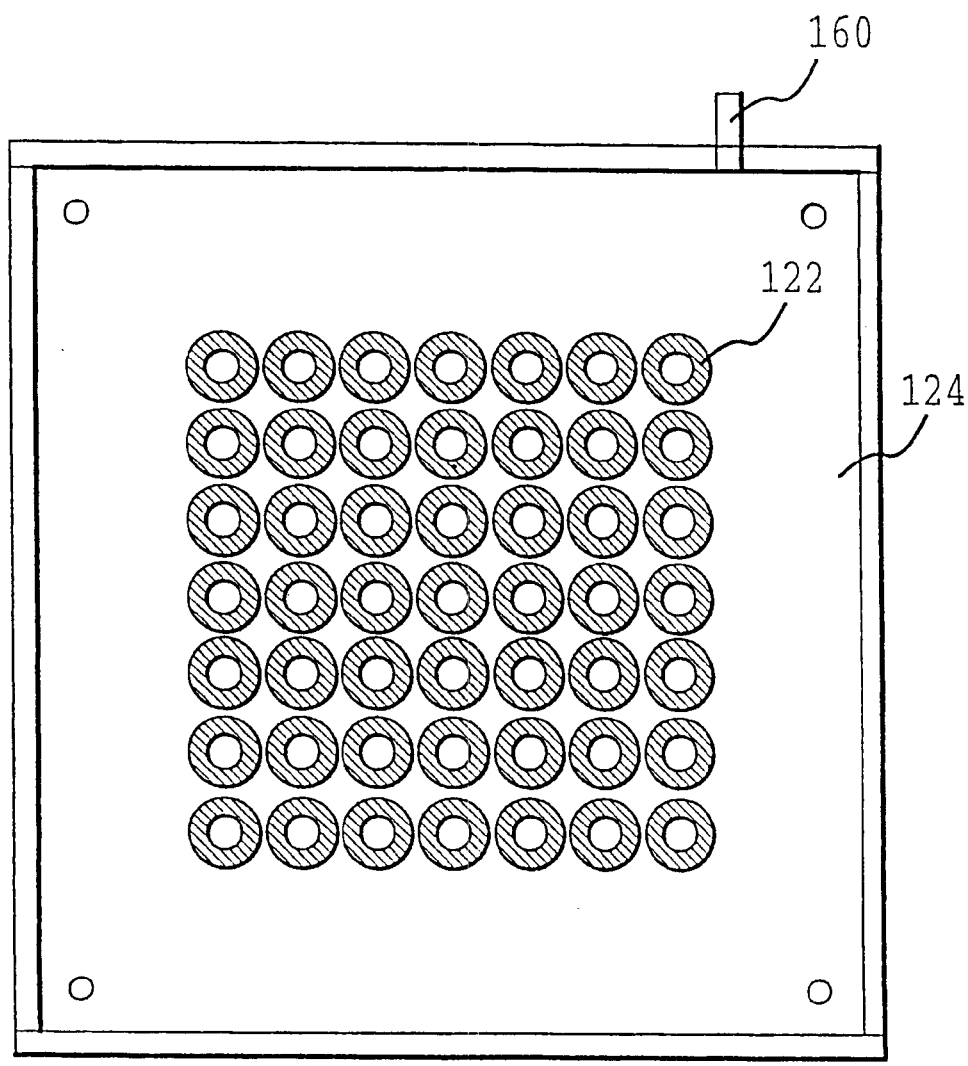
FIG. 6 is a top view of a transducer mounting plate showing a 49 transducer array for use in an aerosol generator of the present invention.
Figure 7:
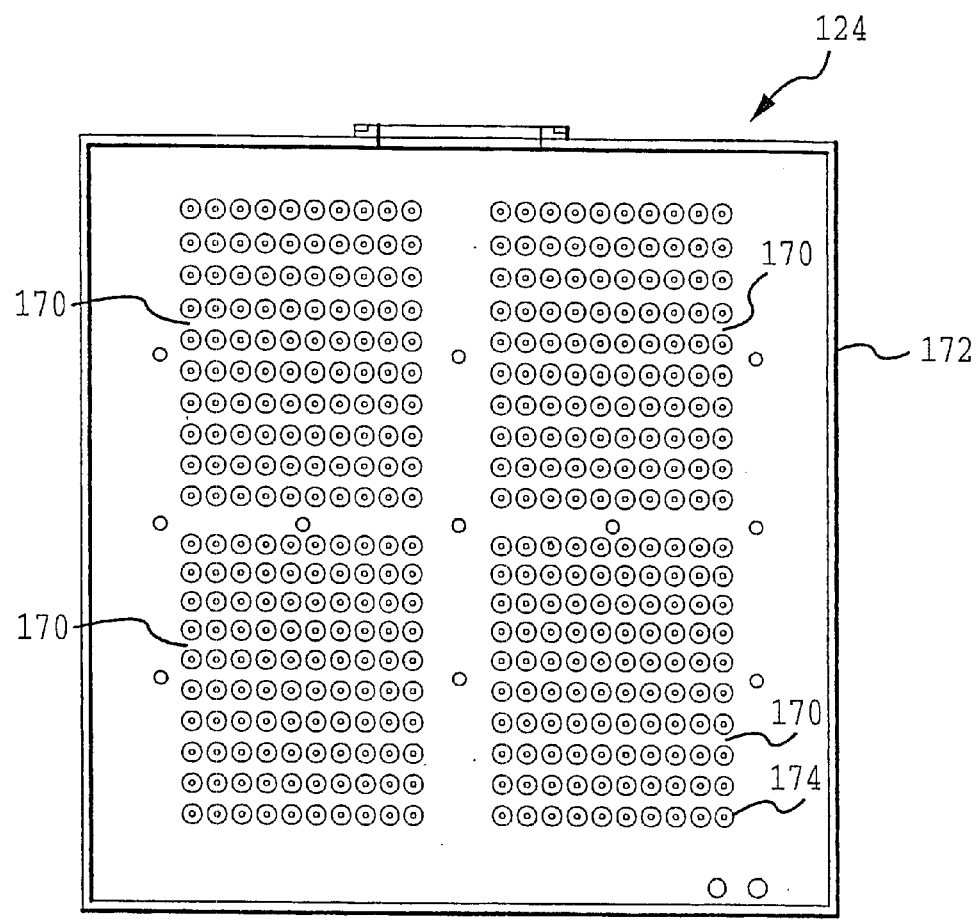
FIG. 7 is a top view of a transducer mounting plate for a 400 transducer array for use in an ultrasonic generator of the present invention.
Figure 8:
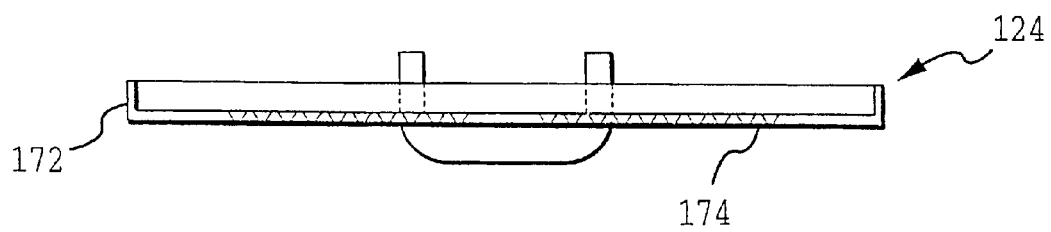
FIG. 8 is a side view of the transducer mounting plate shown in FIG. 7.
Figure 9:
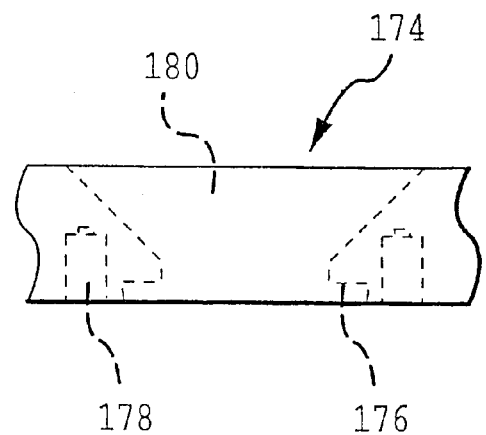
FIG. 9 is a partial side view showing the profile of a single transducer mounting receptacle of the transducer mounting plate shown in FIG. 7.
Figure 10:
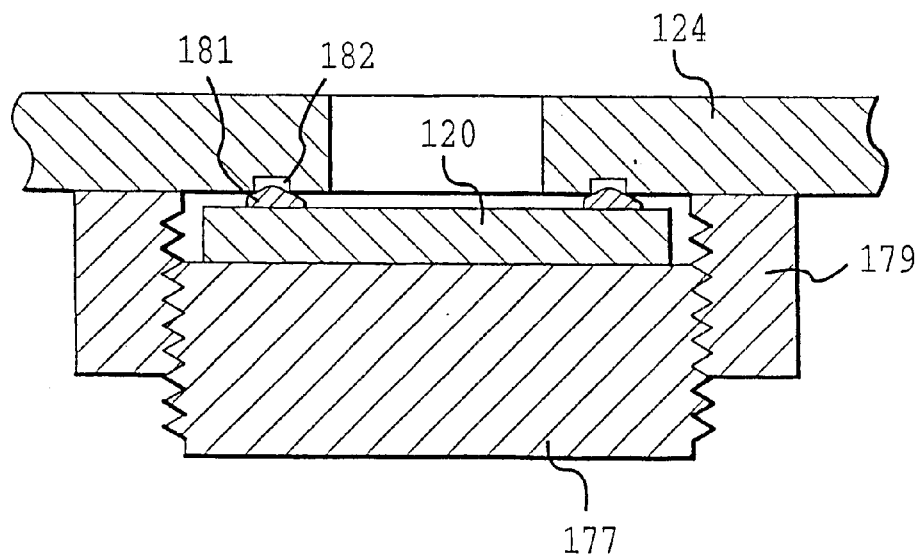
FIG. 10 is a partial side view in cross-section showing an alternative embodiment for mounting an ultrasonic transducer.
Figure 11:
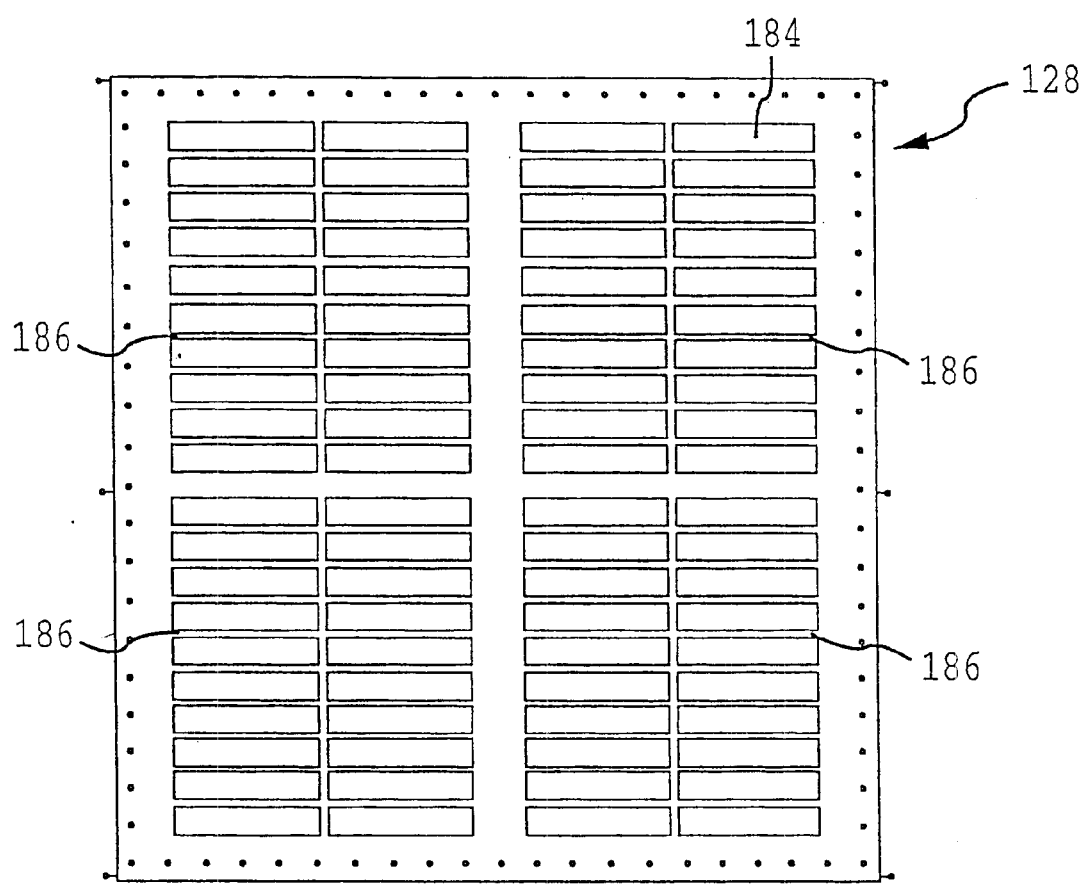
FIG. 11 is a top view of a bottom retaining plate for retaining a separator for use in an aerosol generator of the present invention.

Another important feature of the aerosol generator 106, as shown in FIG. 5, is the use of the separator 126, which protects the transducer discs 120 from direct contact with the liquid feed 102, which is often highly corrosive. The height of the separator 126 above the top of the transducer discs 120 should normally be kept as small as possible, and is often in the range of from about 1 centimeter to about 2 centimeters. The top of the liquid feed 102 in the flow channels above the tops of the ultrasonic transducer discs 120 is typically in a range of from about 2 centimeters to about 5 centimeters, whether or not the aerosol generator includes the separator 126, with a distance of about 3 to 4 centimeters being preferred. Although the aerosol generator 106 could be made without the separator 126, in which case the liquid feed 102 would be in direct contact with the transducer discs 120, the highly corrosive nature of the liquid feed 102 can often cause premature failure of the transducer discs 120. The use of the separator 126, in combination with use of the ultrasonically transmissive fluid in the water bath volume 156 to provide ultrasonic coupling, significantly extending the life of the ultrasonic transducers 120. One disadvantage of using the separator 126, however, is that the rate of droplet production from the atomization cones 162 is reduced, often by a factor of two or more, relative to designs in which the liquid feed 102 is in direct contact with the ultrasonic transducer discs 102. Even with the separator 126, however, the aerosol generator 106 used with the present invention is capable of producing a high quality aerosol with heavy droplet loading, as previously discussed. Suitable materials for the separator 126 include, for example, polyamides (such as Kapton™ membranes from DuPont) and other polymer materials, glass, and plexiglass. The main requirements for the separator 126 are that it be ultrasonically transmissive, corrosion resistant and impermeable.

One alternative to using the separator 126 is to bind a corrosion-resistant protective coating onto the surface of the ultrasonic transducer discs 120, thereby preventing the liquid feed 102 from contacting the surface of the ultrasonic transducer discs 120. When the ultrasonic transducer discs 120 have a protective coating, the aerosol generator 106 will typically be constructed without the water bath volume 156 and the liquid feed 102 will flow directly over the ultrasonic transducer discs 120. Examples of such protective coating materials include platinum, gold, TEFLON™, epoxies and various plastics. Such coating typically significantly extends transducer life. Also, when operating without the separator 126, the aerosol generator 106 will typically produce the aerosol 108 with a much higher droplet loading than when the separator 126 is used.

One surprising finding with operation of the aerosol generator 106 of the present invention is that the droplet loading in the aerosol may be affected by the temperature of the liquid feed 102. It has been found that when the liquid feed 102 includes an aqueous liquid at an elevated temperature, the droplet loading increases significantly. The temperature of the liquid feed 102 is preferably higher than about 30° C., more preferably higher than about 35° C. and most preferably higher than about 40° C. If the temperature becomes too high, however, it can have a detrimental effect on droplet loading in the aerosol 108. Therefore, the temperature of the liquid feed 102 from which the aerosol 108 is made should generally be lower than about 50° C., and preferably lower than about 45° C. The liquid feed 102 may be maintained at the desired temperature in any suitable fashion. For example, the portion of the aerosol generator 106 where the liquid feed 102 is converted to the aerosol 108 could be maintained at a constant elevated temperature. Alternatively, the liquid feed 102 could be delivered to the aerosol generator 106 from a constant temperature bath maintained separate from the aerosol generator 106. When the ultrasonic generator 106 includes the separator 126, the ultrasonically transmissive fluid adjacent the ultrasonic transducer disks 120 are preferably also at an elevated temperature in the ranges just discussed for the liquid feed 102.

Figure 14:
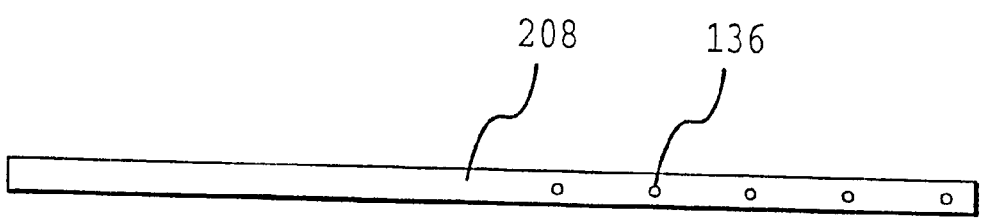
FIG. 14 is a side view of a gas tube for delivering gas within an aerosol generator of the present invention.
Figure 15:
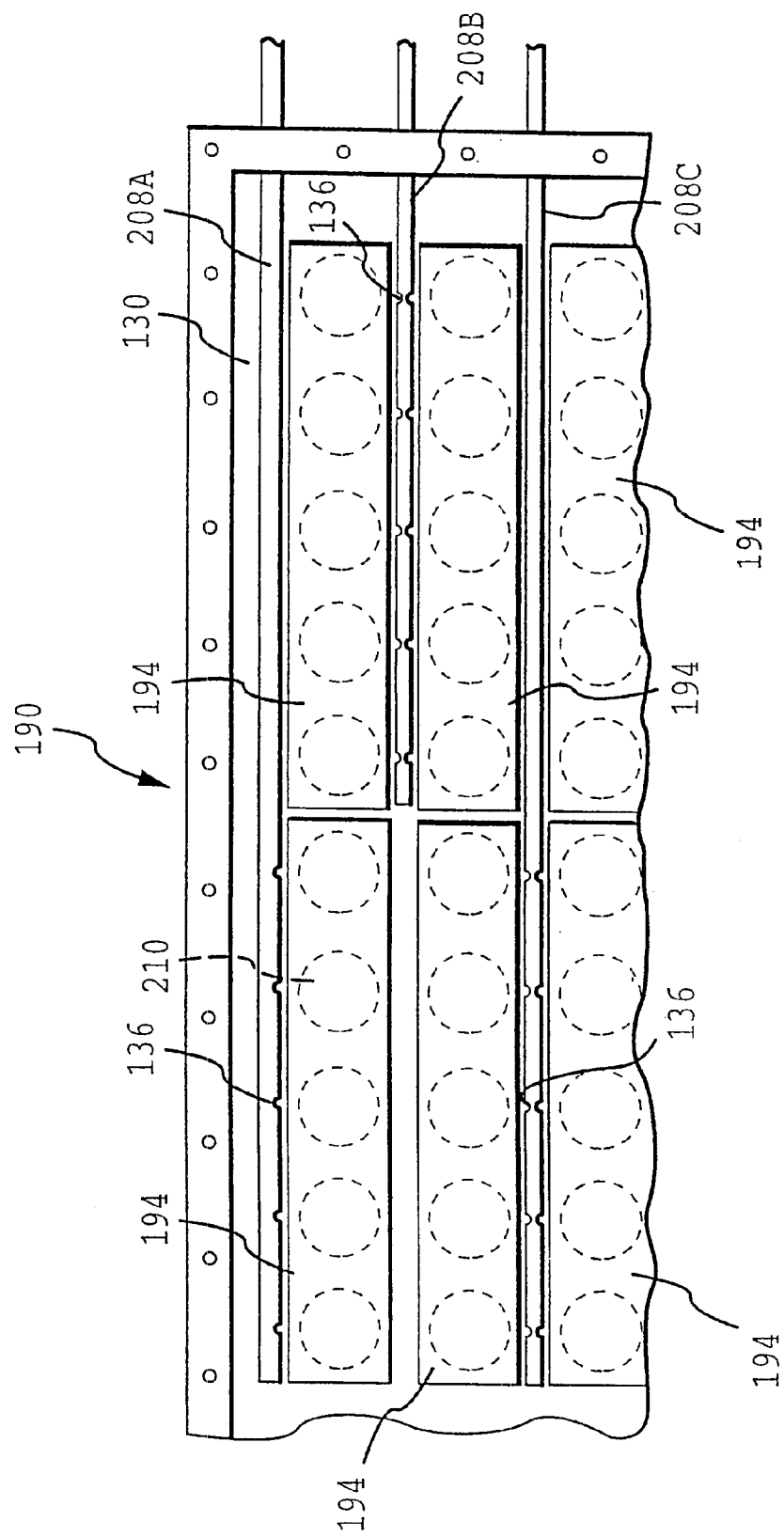
FIG. 15 shows a partial top view of gas tubes positioned in a liquid feed box for distributing gas relative to ultrasonic transducer positions for use in an aerosol generator of the present invention.
Figure 16:
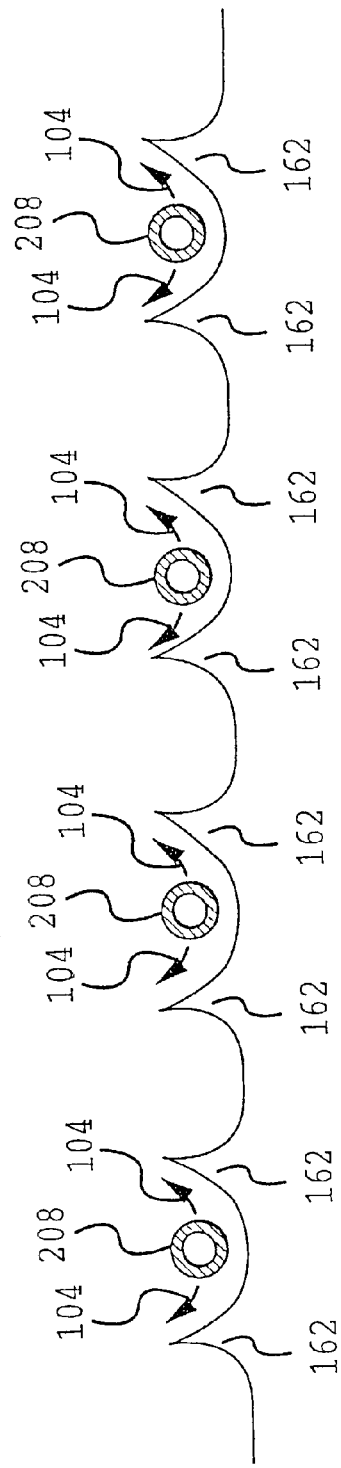
FIG. 16 shows one embodiment for a gas distribution configuration for the aerosol generator of the present invention.

The design for the aerosol generator 106 based on an array of ultrasonic transducers is versatile and is easily modified to accommodate different generator sizes for different specialty applications. The aerosol generator 106 may be designed to include a plurality of ultrasonic transducers in any convenient number. Even for smaller scale production, however, the aerosol generator 106 preferably has at least nine ultrasonic transducers, more preferably at least 16 ultrasonic transducers, and even more preferably at least 25 ultrasonic transducers. For larger scale production, however, the aerosol generator 106 includes at least 40 ultrasonic transducers, more preferably at least 100 ultrasonic transducers, and even more preferably at least 400 ultrasonic transducers. In some large volume applications, the aerosol generator may have at least 1000 ultrasonic transducers.

FIGS. 7–24 show component designs for an aerosol generator 106 including an array of 400 ultrasonic transducers. Referring first to FIGS. 7 and 8, the transducer mounting plate 124 is shown with a design to accommodate an array of 400 ultrasonic transducers, arranged in four subarrays of 100 ultrasonic transducers each. The transducer mounting plate 124 has integral vertical walls 172 for containing the ultrasonically transmissive fluid, typically water, in a water bath similar to the water bath volume 156 described previously with reference to FIG. 5.

As shown in FIGS. 7 and 8, four hundred transducer mounting receptacles 174 are provided in the transducer mounting plate 124 for mounting ultrasonic transducers for the desired array. With reference to FIG. 9, the profile of an individual transducer mounting receptacle 174 is shown. A mounting seat 176 accepts an ultrasonic transducer for mounting, with a mounted ultrasonic transducer being held in place via screw holes 178. Opposite the mounting receptacle 176 is a flared opening 180 through which an ultrasonic signal may be transmitted for the purpose of generating the aerosol 108, as previously described with reference to FIG. 5.

A preferred transducer mounting configuration, however, is shown in FIG. 10 for another configuration for the transducer mounting plate 124. As seen in FIG. 10, an ultrasonic transducer disc 120 is mounted to the transducer mounting plate 124 by use of a compression screw 177 threaded into a threaded receptacle 179. The compression screw 177 bears against the ultrasonic transducer disc 120, causing an o-ring 181, situated in an o-ring seat 182 on the transducer mounting plate, to be compressed to form a seal between the transducer mounting plate 124 and the ultrasonic transducer disc 120. This type of transducer mounting is particularly preferred when the ultrasonic transducer disc 120 includes a protective surface coating, as discussed previously, because the seal of the o-ring to the ultrasonic transducer disc 120 will be inside of the outer edge of the protective seal, thereby preventing liquid from penetrating under the protective surface coating from the edges of the ultrasonic transducer disc 120.

Referring now to FIG. 11, the bottom retaining plate 128 for a 400 transducer array is shown having a design for mating with the transducer mounting plate 124 (shown in FIGS. 7–8). The bottom retaining plate 128 has eighty openings 184, arranged in four subgroups 186 of twenty openings 184 each. Each of the openings 184 corresponds with five of the transducer mounting receptacles 174 (shown in FIGS. 7 and 8) when the bottom retaining plate 128 is mated with the transducer mounting plate 124 to create a volume. for a water bath between the transducer mounting plate 124 and the bottom retaining plate 128. The openings 184, therefore, provide a pathway for ultrasonic signals generated by ultrasonic transducers to be transmitted through the bottom retaining plate.

Referring now to FIGS. 12 and 13, a liquid feed box 190 for a 400 transducer array is shown having the top retaining plate 130 designed to fit over the bottom retaining plate 128 (shown in FIG. 11), with a separator 126 (not shown) being retained between the bottom retaining plate 128 and the top retaining plate 130 when the aerosol generator 106 is assembled. The liquid feed box 190 also includes vertically extending walls 192 for containing the liquid feed 102 when the aerosol generator is in operation. Also shown in FIGS. 12 and 13 is the feed inlet 148 and the feed outlet 152. An adjustable weir 198 determines the level of liquid feed 102 in the liquid feed box 190 during operation of the aerosol generator 106.

The top retaining plate 130 of the liquid feed box 190 has eighty openings 194 therethrough, which are arranged in four subgroups 196 of twenty openings 194 each. The openings 194 of the top retaining plate 130 correspond in size with the openings 184 of the bottom retaining plate 128 (shown in FIG. 11). When the aerosol generator 106 is assembled, the openings 194 through the top retaining plate 130 and the openings 184 through the bottom retaining plate 128 are aligned, with the separator 126 positioned therebetween, to permit transmission of ultrasonic signals when the aerosol generator 106 is in operation.

Referring now to FIGS. 12–14, a plurality of gas tube feed-through holes 202 extend through the vertically extending walls 192 to either side of the assembly including the feed inlet 148 and feed outlet 152 of the liquid feed box 190. The gas tube feed-through holes 202 are designed to permit insertion therethrough of gas tubes 208 of a design as shown in FIG. 14. When the aerosol generator 106 is assembled, a gas tube 208 is inserted through each of the gas tube feed-through holes 202 so that gas delivery ports 136 in the gas tube 208 will be properly positioned and aligned adjacent the openings 194 in the top retaining plate 130 for delivery of gas to atomization cones that develop in the liquid feed box 190 during operation of the aerosol generator 106. The gas delivery ports 136 are typically holes having a diameter of from about 1.5 millimeters to about 3.5 millimeters.

Referring now to FIG. 15, a partial view of the liquid feed box 190 is shown with gas tubes 208A, 208B and 208C positioned adjacent to the openings 194 through the top retaining plate 130. Also shown in FIG. 15 are the relative locations that ultrasonic transducer discs 120 would occupy when the aerosol generator 106 is assembled. As seen in FIG. 15, the gas tube 208A, which is at the edge of the array, has five gas delivery ports 136. Each of the gas delivery ports 136 is positioned to divert carrier gas 104 to a different one of atomization cones that develop over the array of ultrasonic transducer discs 120 when the aerosol generator 106 is operating. The gas tube 208B, which is one row in from the edge of the array, is a shorter tube that has ten gas delivery ports 136, five each on opposing sides of the gas tube 208B. The gas tube 208B, therefore, has gas delivery ports 136 for delivering gas to atomization cones corresponding with each of ten ultrasonic transducer discs 120. The third gas tube, 208C, is a longer tube that also has ten gas delivery ports 136 for delivering gas to atomization cones corresponding with ten ultrasonic transducer discs 120. The design shown in FIG. 15, therefore, includes one gas delivery port per ultrasonic transducer disc 120. Although this is a lower density of gas delivery ports 136 than for the embodiment of the aerosol generator 106 shown in FIG. 5, which includes two gas delivery ports per ultrasonic transducer disc 120, the design shown in FIG. 15 is, nevertheless, capable of producing a dense, high-quality aerosol without unnecessary waste of gas.

Referring now to FIG. 16, the flow of carrier gas 104 relative to atomization cones 162 during operation of the aerosol generator 106 having a gas distribution configuration to deliver carrier gas 104 from gas delivery ports on both sides of the gas tubes 208, as was shown for the gas tubes 208A, 208B and 208C in the gas distribution configuration shown in FIG. 14. The carrier gas 104 sweeps both directions from each of the gas tubes 208.

Figure 17:
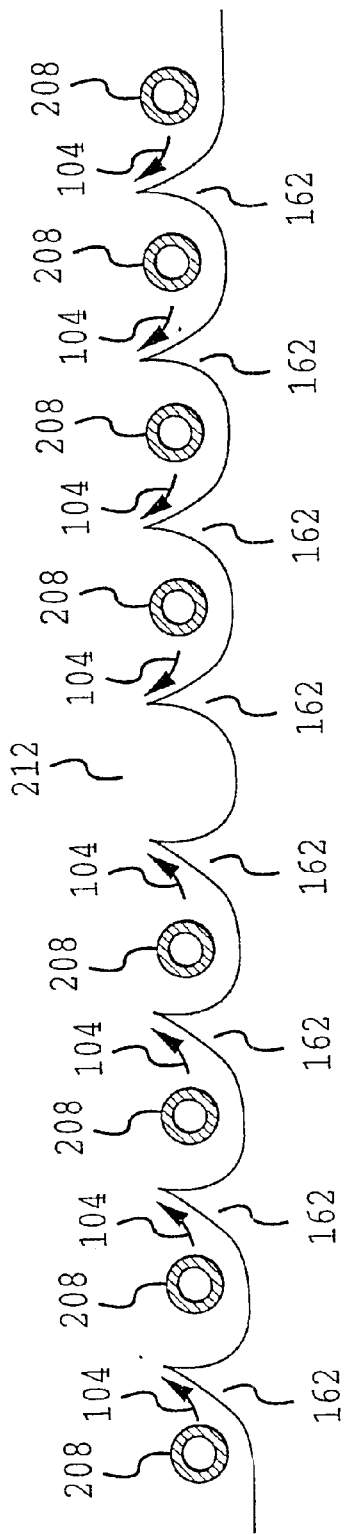
FIG. 17 shows another embodiment for a gas distribution configuration for the aerosol generator of the present invention.

An alternative, and preferred, flow for carrier gas 104 is shown in FIG. 17. As shown in FIG. 17, carrier gas 104 is delivered from only one side of each of the gas tubes 208. This results in a sweep of carrier gas from all of the gas tubes 208 toward a central area 212. This results in a more uniform flow pattern for aerosol generation that may significantly enhance the efficiency with which the carrier gas 104 is used to produce an aerosol. The aerosol that is generated, therefore, tends to be more heavily loaded with liquid droplets.

Figure 18:
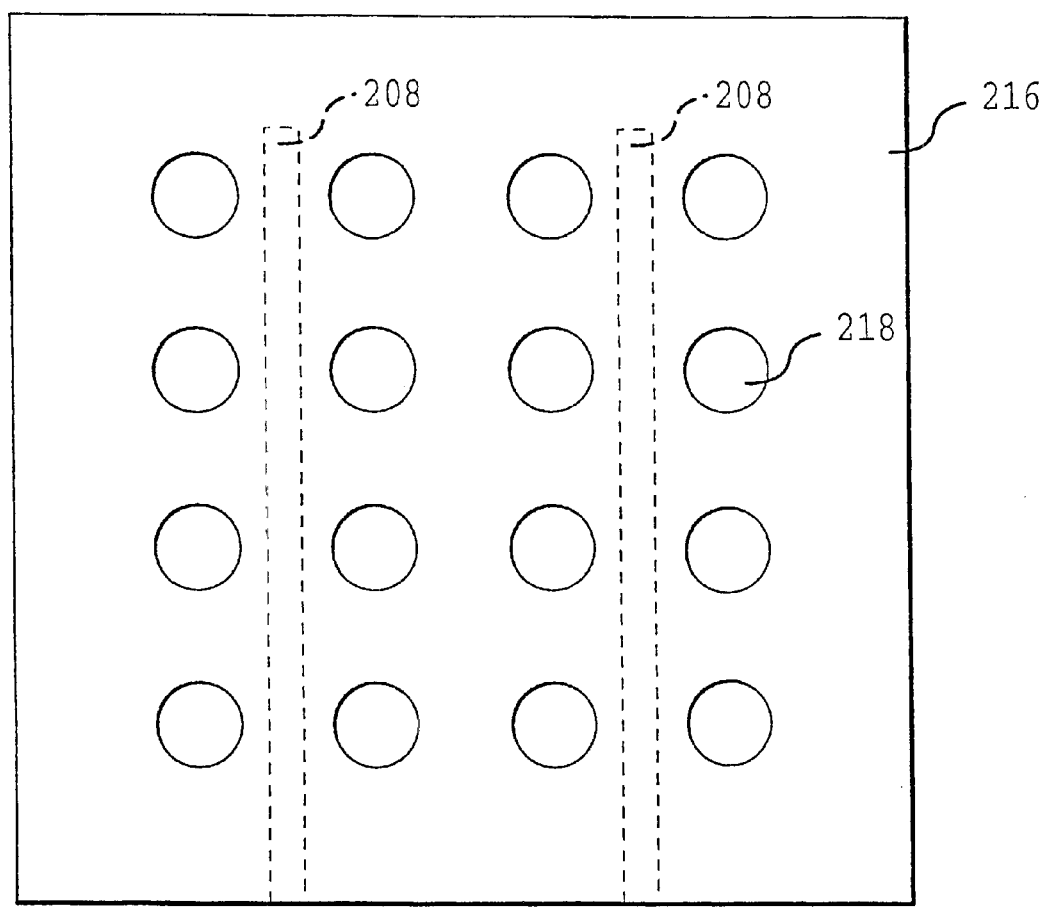
FIG. 18 is a top view of one embodiment of a gas distribution plate/gas tube assembly of the aerosol generator of the present invention.
Figure 19:
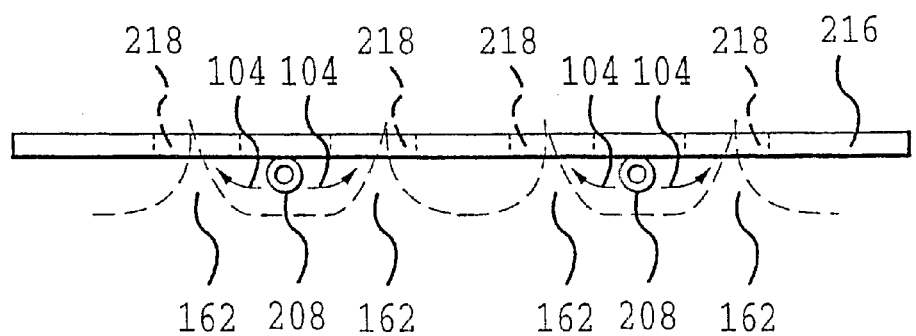
FIG. 19 is a side view of one embodiment of the gas distribution plate/gas tube assembly shown in FIG. 18.

Another configuration for distributing carrier gas in the aerosol generator 106 is shown in FIGS. 18 and 19. In this configuration, the gas tubes 208 are hung from a gas distribution plate 216 adjacent gas flow holes 218 through the gas distribution plate 216. In the aerosol generator 106, the gas distribution plate 216 would be mounted above the liquid feed, with the gas flow holes positioned to each correspond with an underlying ultrasonic transducer. Referring specifically to FIG. 19, when the ultrasonic generator 106 is in operation, atomization cones 162 develop through the gas flow holes 218, and the gas tubes 208 are located such that carrier gas 104 exiting from ports in the gas tubes 208 impinge on the atomization cones and flow upward through the gas flow holes. The gas flow holes 218, therefore, act to assist in efficiently distributing the carrier gas 104 about the atomization cones 162 for aerosol formation. It should be appreciated that the gas distribution plates 218 can be made to accommodate any number of the gas tubes 208 and gas flow holes 218. For convenience of illustration, the embodiment shown in FIGS. 18 and 19 shows a design having only two of the gas tubes 208 and only 16 of the gas flow holes 218. Also, it should be appreciated that the gas distribution plate 216 could be used alone, without the gas tubes 208. In that case, a slight positive pressure of carrier gas 104 would be maintained under the gas distribution plate 216 and the gas flow holes 218 would be sized to maintain the proper velocity of carrier gas 104 through the gas flow holes 218 for efficient aerosol generation. Because of the relative complexity of operating in that mode, however, it is not preferred.

Figure 20:
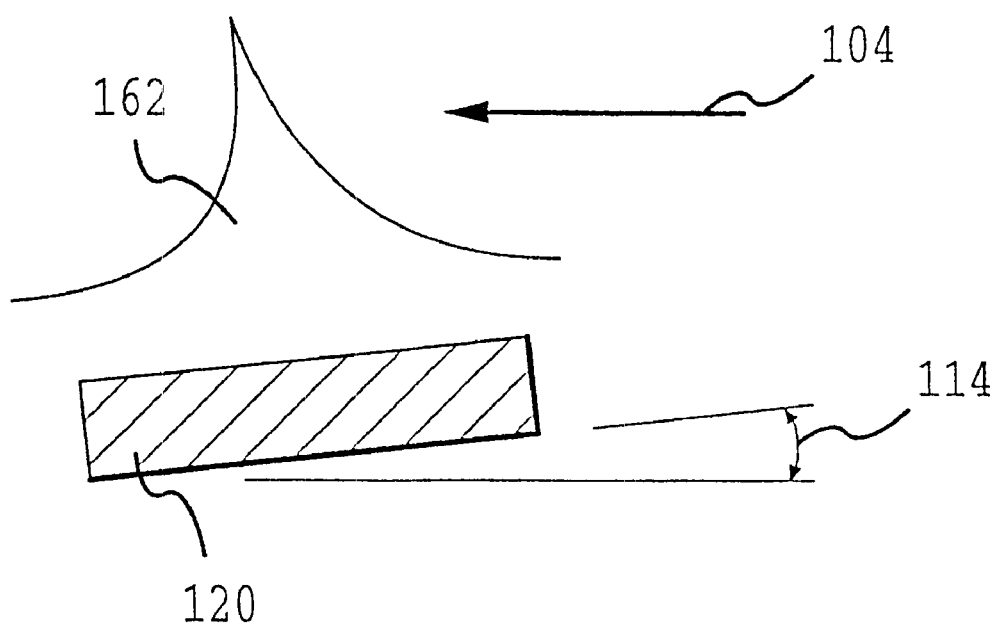
FIG. 20 shows one embodiment for orienting a transducer in the aerosol generator of the present invention.

Aerosol generation may also be enhanced through mounting of ultrasonic transducers at a slight angle and directing the carrier gas at resulting atomization cones such that the atomization cones are tilting in the same direction as the direction of flow of carrier gas. Referring to FIG. 20, an ultrasonic transducer disc 120 is shown. The ultrasonic transducer disc 120 is tilted at a tilt angle 114 (typically less than 10 degrees), so that the atomization cone 162 will also have a tilt. It is preferred that the direction of flow of the carrier gas 104 directed at the atomization cone 162 is in the same direction as the tilt of the atomization cone 162.

Figure 21:
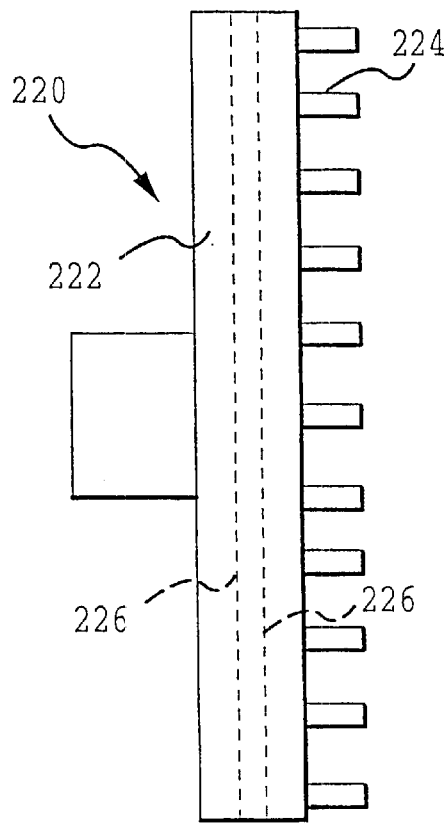
FIG. 21 is a top view of a gas manifold for distributing gas within an aerosol generator of the present invention.
Figure 22:
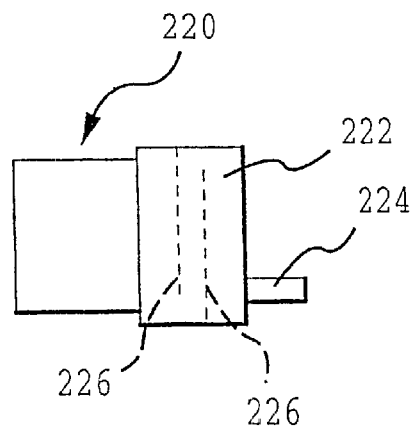
FIG. 22 is a side view of the gas manifold shown in FIG. 21.

Referring now to FIGS. 21 and 22, a gas manifold 220 is shown for distributing gas to the gas tubes 208 in a 400 transducer array design. The gas manifold 220 includes a gas distribution box 222 and piping stubs 224 for connection with gas tubes 208 (shown in FIG. 14). Inside the gas distribution box 222 are two gas distribution plates 226 that form a flow path to assist in distributing the gas equally throughout the gas distribution box 222, to promote substantially equal delivery of gas through the piping stubs 224. The gas manifold 220, as shown in FIGS. 21 and 22, is designed to feed eleven gas tubes 208. For the 400 transducer design, a total of four gas manifolds 220 are required.

Figure 12:
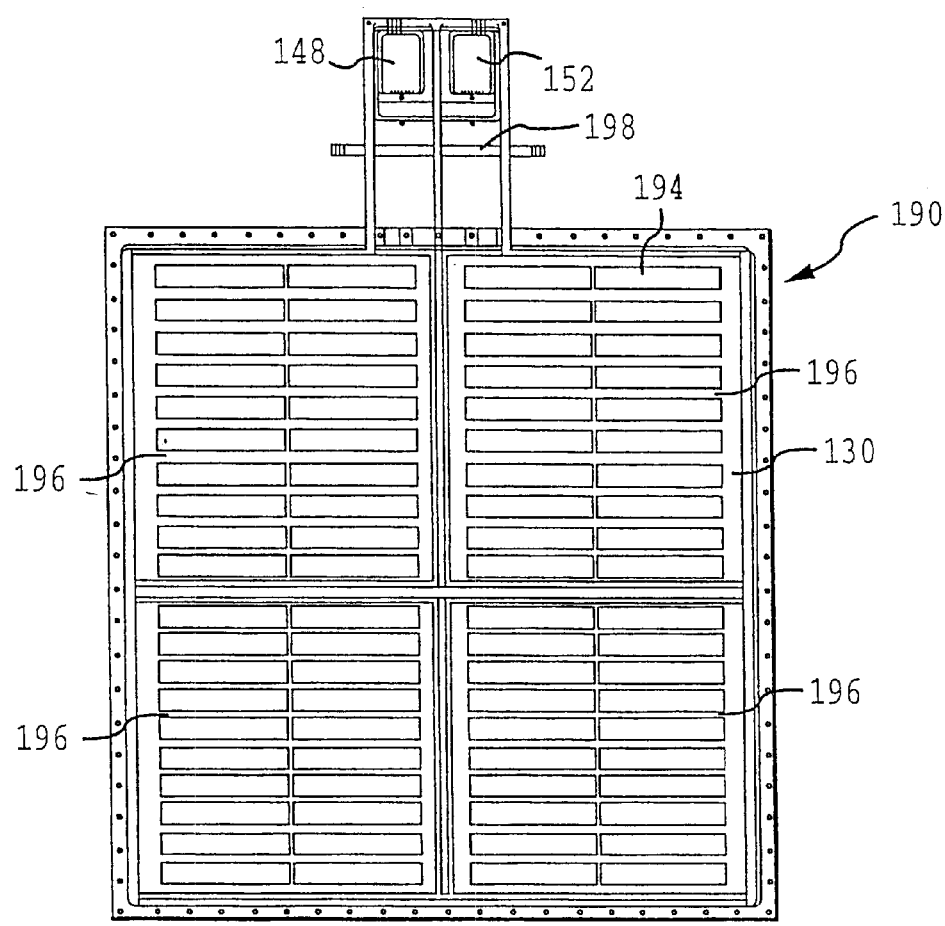
FIG. 12 is a top view of a liquid feed box having a bottom retaining plate to assist in retaining a separator for use in an aerosol generator of the present invention.
Figure 13:
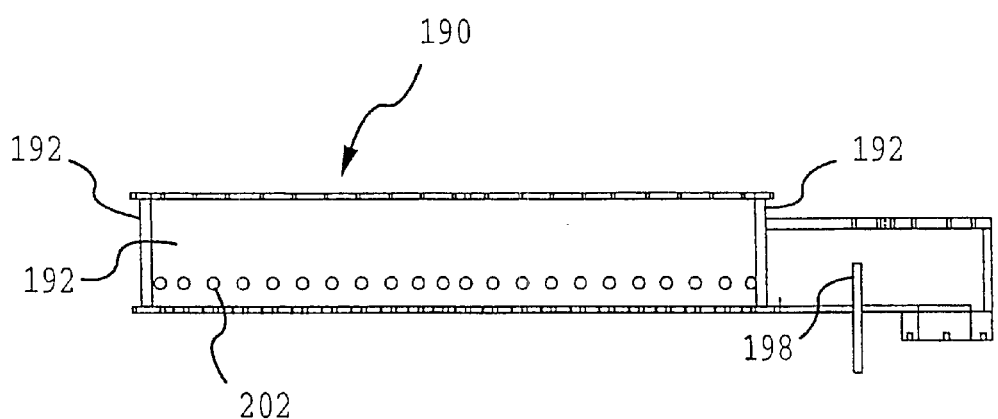
FIG. 13 is a side view of the liquid feed box shown in FIG. 8.
Figure 23:
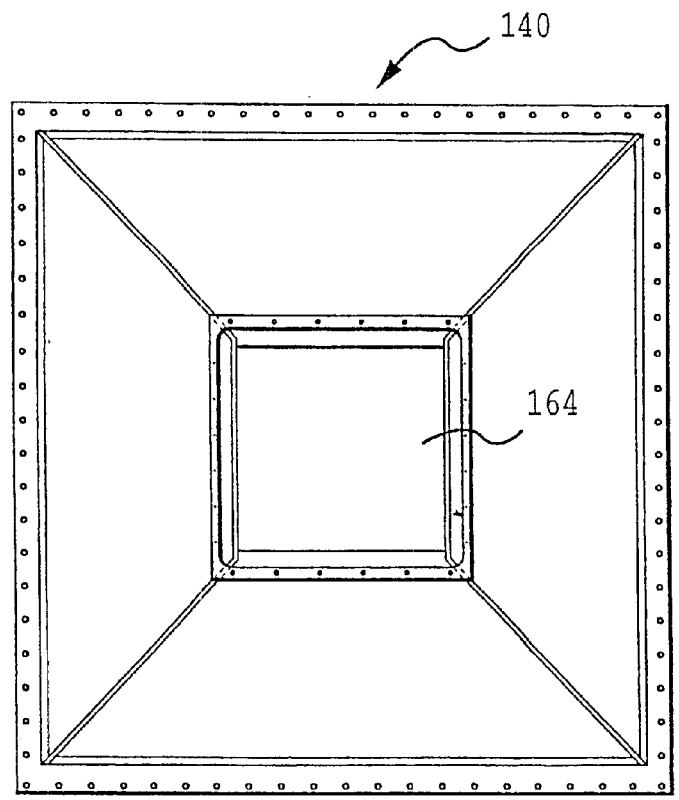
FIG. 23 is a top view of a generator lid of a hood design for use in an aerosol generator of the present invention.
Figure 24:
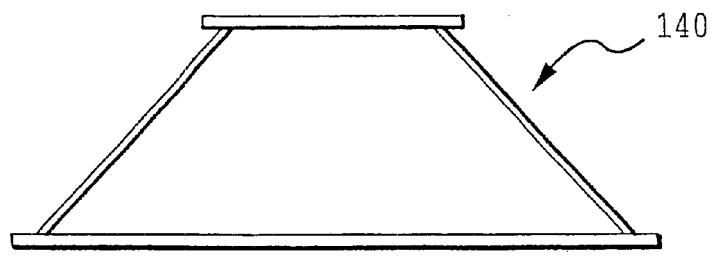
FIG. 24 is a side view of the generator lid shown in FIG. 23.
Figure 26:
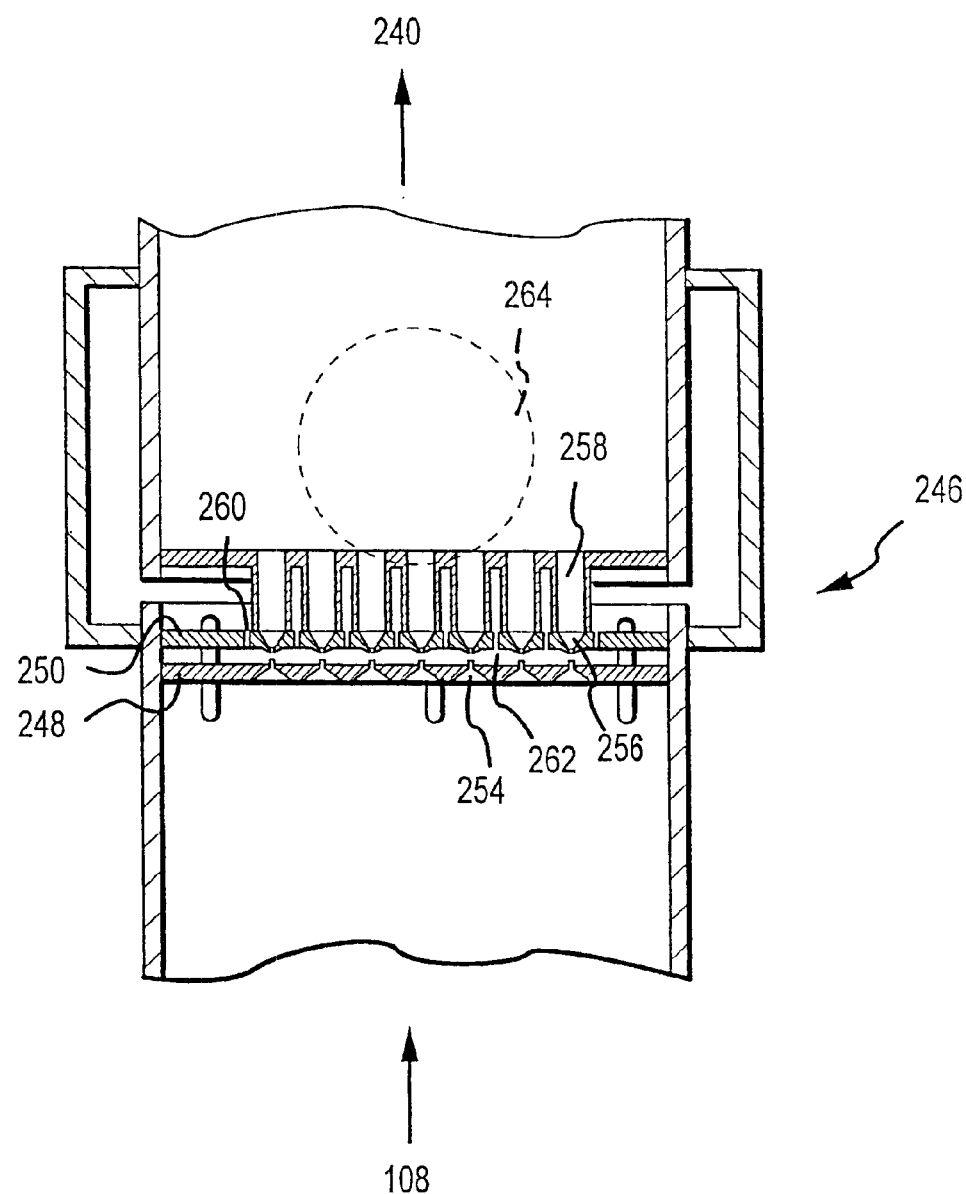
FIG. 26 is a top view in cross section of a virtual impactor that may be used for concentrating an aerosol according to the present invention.

Referring now to FIGS. 23 and 24, the generator lid 140 is shown for a 400 transducer array design. The generator lid 140 mates with and covers the liquid feed box 190 (shown in FIGS. 12 and 13). The generator lid 140, as shown in FIGS. 23 and 24, has a hood design to permit easy collection of the aerosol 108 without subjecting droplets in the aerosol 108 to sharp edges on which droplets may coalesce and be lost, and possibly interfere with the proper operation of the aerosol generator 106. When the aerosol generator 106 is in operation, the aerosol 108 would be withdrawn via the aerosol exit opening 164 through the generator cover 140.

The design and apparatus of the aerosol generator 106 described with reference to FIGS. 5–24, as well as a facility including other process equipment described herein for carrying out the process of the present invention for making powders are within the scope of the present invention.

Although the aerosol generator 106 produces a high quality aerosol 108 having a high droplet loading, it is often desirable to further concentrate the aerosol 108 prior to introduction into the furnace 110. Referring now to FIG. 25, a process flow diagram is shown for one embodiment of the present invention involving such concentration of the aerosol 108. As shown in FIG. 25, the aerosol 108 from the aerosol generator 106 is sent to an aerosol concentrator 236 where excess carrier gas 238 is withdrawn from the aerosol 108 to produce a concentrated aerosol 240, which is then fed to the furnace 110.

The aerosol concentrator 236 typically includes one or more virtual impactors capable of concentrating droplets in the aerosol 108 by a factor of greater than about 2, preferably by a factor of greater than about 5, and more preferably by a factor of greater than about 10, to produce the concentrated aerosol 240. According to the present invention, the concentrated aerosol 240 should typically contain greater than about $1\times10^7$ droplets per cubic centimeter, and more preferably from about $5\times10^7$ to about $5\times10^8$ droplets per cubic centimeter. A concentration of about $1\times10^8$ droplets per cubic centimeter of the concentrated aerosol is particularly preferred, because when the concentrated aerosol 240 is loaded more heavily than that, then the frequency of collisions between droplets becomes large enough to impair the properties of the concentrated aerosol 240, resulting in potential contamination of the particulate product 116 with an undesirably large quantity of over-sized particles. For example, if the aerosol 108 has a concentration of about $1\times10^7$ droplets per cubic centimeter, and the aerosol concentrator 236 concentrates droplets by a factor of 10, then the concentrated aerosol 240 will have a concentration of about $1\times10^8$ droplets per cubic centimeter. Stated another way, for example, when the aerosol generator generates the aerosol 108 with a droplet loading of about 0.167 milliliters liquid feed 102 per liter of carrier gas 104, the concentrated aerosol 240 would be loaded with about 1.67 milliliters of liquid feed 102 per liter of carrier gas 104, assuming the aerosol 108 is concentrated by a factor of 10.

Having a high droplet loading in aerosol feed to the furnace provides the important advantage of reducing the heating demand on the furnace 110 and the size of flow conduits required through the furnace. Also, other advantages of having a dense aerosol include a reduction in the demands on cooling and particle collection components, permitting significant equipment and operational savings.

Furthermore, as system components are reduced in size, powder holdup within the system is reduced, which is also desirable. Concentration of the aerosol stream prior to entry into the furnace 110, therefore, provides a substantial advantage relative to processes that utilize less concentrated aerosol streams.

The excess carrier gas 238 that is removed in the aerosol concentrator 236 typically includes extremely small droplets that are also removed from the aerosol 108. Preferably, the droplets removed with the excess carrier gas 238 have a weight average size of smaller than about 1.5 microns, and more preferably smaller than about 1 micron and the droplets retained in the concentrated aerosol 240 have an average droplet size of larger than about 2 microns. For example, a virtual impactor sized to treat an aerosol stream having a weight average droplet size of about three microns might be designed to remove with the excess carrier gas 238 most droplets smaller than about 1.5 microns in size. Other designs are also possible. When using the aerosol generator 106 with the present invention, however, the loss of these very small droplets in the aerosol concentrator 236 will typically constitute no more than about 10 percent by weight, and more preferably no more than about 5 percent by weight, of the droplets originally in the aerosol stream that is fed to the concentrator 236. Although the aerosol concentrator 236 is useful in some situations, it is normally not required with the process of the present invention, because the aerosol generator 106 is capable, in most circumstances, of generating an aerosol stream that is sufficiently dense. So long as the aerosol stream coming out of the aerosol generator 102 is sufficiently dense, it is preferred that the aerosol concentrator not be used. It is a significant advantage of the present invention that the aerosol generator 106 normally generates such a dense aerosol stream that the aerosol concentrator 236 is not needed. Therefore, the complexity of operation of the aerosol concentrator 236 and accompanying liquid losses may typically be avoided.

It is important that the aerosol stream (whether it has been concentrated or not) that is fed to the furnace 110 have a high droplet flow rate and high droplet loading as would be required for most industrial applications. With the present invention, the aerosol stream fed to the furnace preferably includes a droplet flow of greater than about 0.5 liters per hour, more preferably greater than about 2 liters per hour, still more preferably greater than about 5 liters per hour, even more preferably greater than about 10 liters per hour, particularly greater than about 50 liters per hour and most preferably greater than about 100 liters per hour; and with the droplet loading being typically greater than about 0.04 milliliters of droplets per liter of carrier gas, preferably greater than about 0.083 milliliters of droplets per liter of carrier gas 104, more preferably greater than about 0.167 milliliters of droplets per liter of carrier gas 104, still more preferably greater than about 0.25 milliliters of droplets per liter of carrier gas 104, particularly greater than about 0.33 milliliters of droplets per liter of carrier gas 104 and most preferably greater than about 0.83 milliliters of droplets per liter of carrier gas 104.

One embodiment of a virtual impactor that could be used as the aerosol concentrator 236 will now be described with reference to FIGS. 26–32. A virtual impactor 246 includes an upstream plate assembly 248 (details shown in FIGS. 27–29) and a downstream plate assembly 250 (details shown in FIGS. 30–32), with a concentrating chamber 262 located between the upstream plate assembly 248 and the downstream plate assembly 250.

Through the upstream plate assembly 248 are a plurality of vertically extending inlet slits 254. The downstream plate assembly 250 includes a plurality of vertically extending exit slits 256 that are in alignment with the inlet slits 254. The exit slits 256 are, however, slightly wider than the inlet slits 254. The downstream plate assembly 250 also includes flow channels 258 that extend substantially across the width of the entire downstream plate assembly 250, with each flow channel 258 being adjacent to an excess gas withdrawal port 260.

During operation, the aerosol 108 passes through the inlet slits 254 and into the concentrating chamber 262. Excess carrier gas 238 is withdrawn from the concentrating chamber 262 via the excess gas withdrawal ports 260. The withdrawn excess carrier gas 238 then exits via a gas duct port 264. That portion of the aerosol 108 that is not withdrawn through the excess gas withdrawal ports 260 passes through the exit slits 256 and the flow channels 258 to form the concentrated aerosol 240 Those droplets passing across the concentrating chamber 262 and through the exit slits 256 are those droplets of a large enough size to have sufficient momentum to resist being withdrawn with the excess carrier gas 238.

As seen best in FIGS. 27–32, the inlet slits 254 of the upstream plate assembly 248 include inlet nozzle extension portions 266 that extend outward from the plate surface 268 of the upstream plate assembly 248. The exit slits 256 of the downstream plate assembly 250 include exit nozzle extension portions 270 extending outward from a plate surface 272 of the downstream plate assembly 250. These nozzle extension portions 266 and 270 are important for operation of the virtual impactor 246, because having these nozzle extension portions 266 and 270 permits a very close spacing to be attained between the inlet slits 254 and the exit slits 256 across the concentrating chamber 262, while also providing a relatively large space in the concentrating chamber 262 to facilitate efficient removal of the excess carrier gas 238.

Also as best seen in FIGS. 27–32, the inlet slits 254 have widths that flare outward toward the side of the upstream plate assembly 248 that is first encountered by the aerosol 108 during operation. This flared configuration reduces the sharpness of surfaces encountered by the aerosol 108, reducing the loss of aerosol droplets and potential interference from liquid buildup that could occur if sharp surfaces were present. Likewise, the exit slits 256 have a width that flares outward towards the flow channels 258, thereby allowing the concentrated aerosol 240 to expand into the flow channels 258 without encountering sharp edges that could cause problems.

As noted previously, both the inlet slits 254 of the upstream plate assembly 248 and the exit slits 256 of the downstream plate assembly 250 are vertically extending. This configuration is advantageous for permitting liquid that may collect around the inlet slits 254 and the exit slits 256 to drain away. The inlet slits 254 and the exit slits 256 need not, however, have a perfectly vertical orientation. Rather, it is often desirable to slant the slits backward (sloping upward and away in the direction of flow) by about five to ten degrees relative to vertical, to enhance draining of liquid off of the upstream plate assembly 248 and the downstream plate assembly 250. This drainage function of the vertically extending configuration of the inlet slits 254 and the outlet slits 256 also inhibits liquid build-up in the vicinity of the inlet slits 248 and the exit slits 250, which liquid build-up could result in the release of undesirably large droplets into the concentrated aerosol 240.

As discussed previously, the aerosol generator 106 of the present invention produces a concentrated, high quality aerosol of micro-sized droplets having a relatively narrow size distribution. It has been found, however, that for many applications the process of the present invention is significantly enhanced by further classifying by size the droplets in the aerosol 108 prior to introduction of the droplets into the furnace 110. In this manner, the size and size distribution of particles in the particulate product 116 are further controlled.

Figure 33:
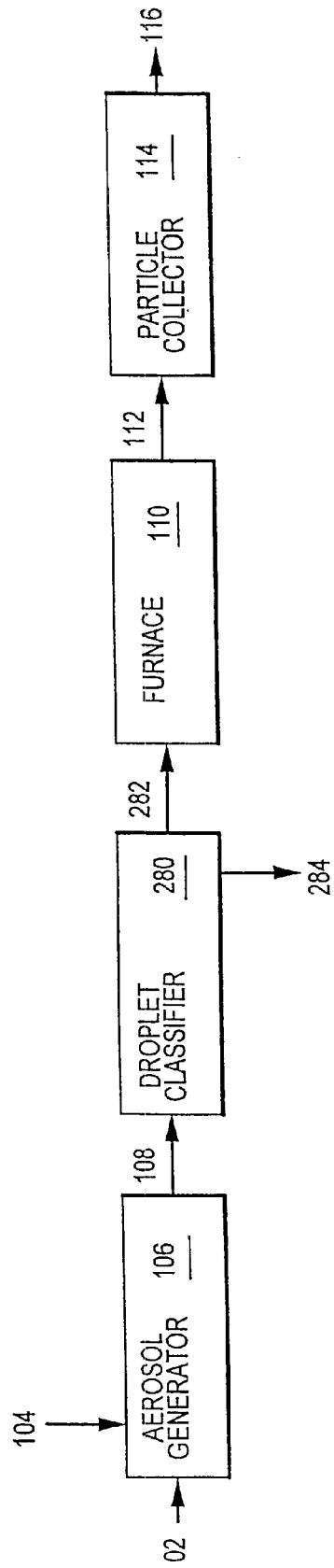
FIG. 33 is a process block diagram of one embodiment of the process of the present invention including a droplet classifier.

Referring now to FIG. 33, a process flow diagram is shown for one embodiment of the process of the present invention including such droplet classification. As shown in FIG. 33, the aerosol 108 from the aerosol generator 106 goes to a droplet classifier 280 where oversized droplets are removed from the aerosol 108 to prepare a classified aerosol 282. Liquid 284 from the oversized droplets that are being removed is drained from the droplet classifier 280. This drained liquid 284 may advantageously be recycled for use in preparing additional liquid feed 102.

Any suitable droplet classifier may be used for removing droplets above a predetermined size. For example, a cyclone could be used to remove over-size droplets. A preferred droplet classifier for many applications, however, is an impactor. One embodiment of an impactor for use with the present invention will now be described with reference to FIGS. 34–38.

Figure 34:
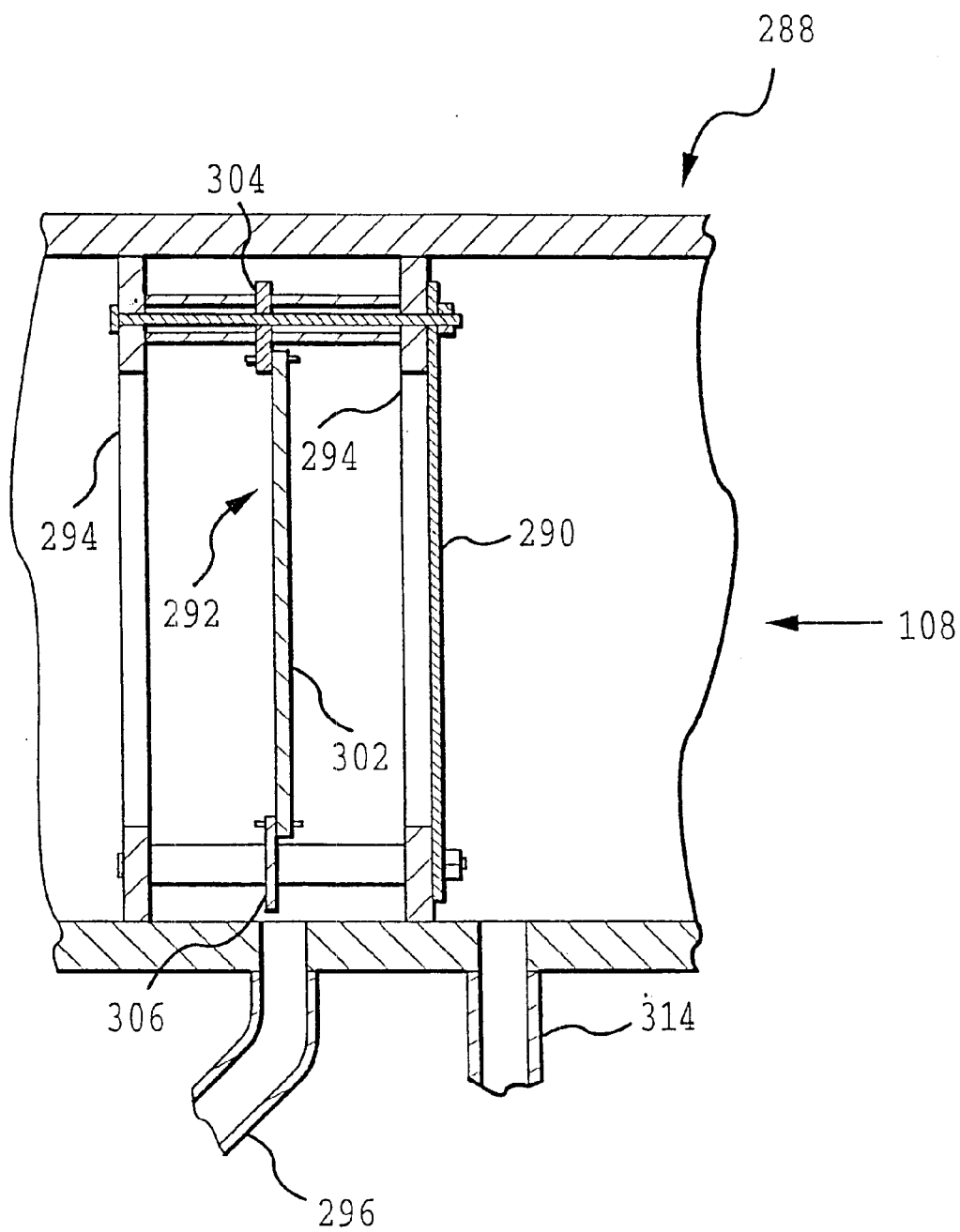
FIG. 34 is a top view in cross section of an impactor of the present invention for use in classifying an aerosol.

As seen in FIG. 34, an impactor 288 has disposed in a flow conduit 286 a flow control plate 290 and an impactor plate assembly 292. The flow control plate 290 is conveniently mounted on a mounting plate 294.

Figure 35:
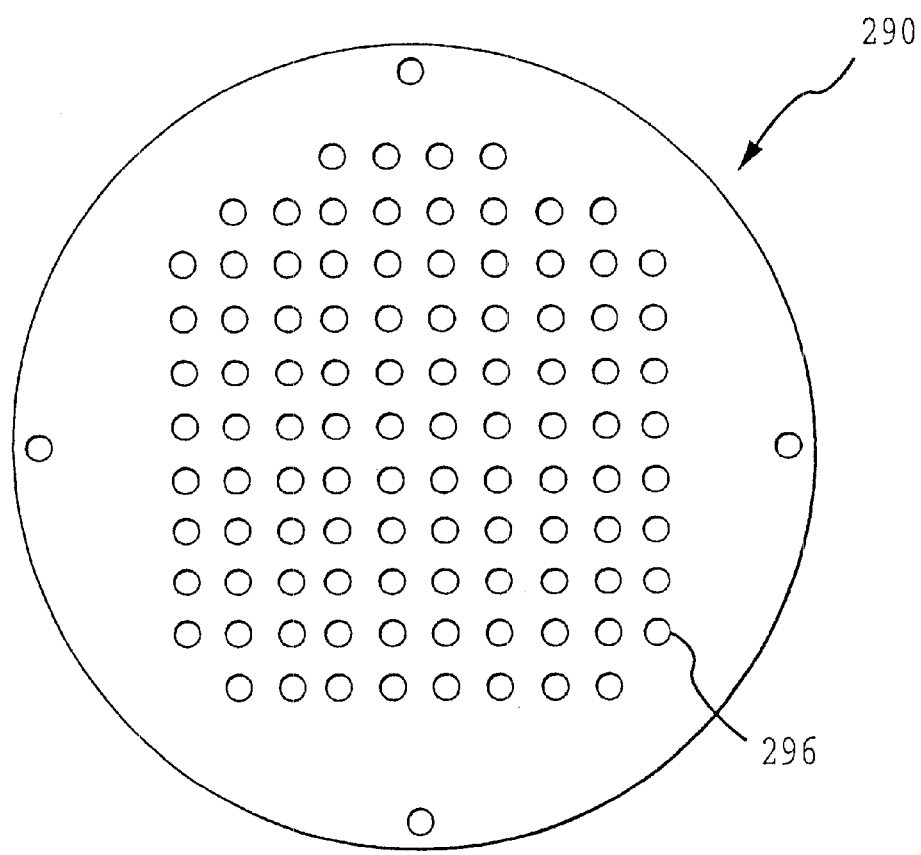
FIG. 35 is a front view of a flow control plate of the impactor shown in FIG. 34.

The flow control plate 290 is used to channel the flow of the aerosol stream toward the impactor plate assembly 292 in a manner with controlled flow characteristics that are desirable for proper impaction of oversize droplets on the impactor plate assembly 292 for removal through the drains 296 and 314. One embodiment of the flow control plate 290 is shown in FIG. 35. The flow control plate 290 has an array of circular flow ports 296 for channeling flow of the aerosol 108 towards the impactor plate assembly 292 with the desired flow characteristics.

Figure 36:
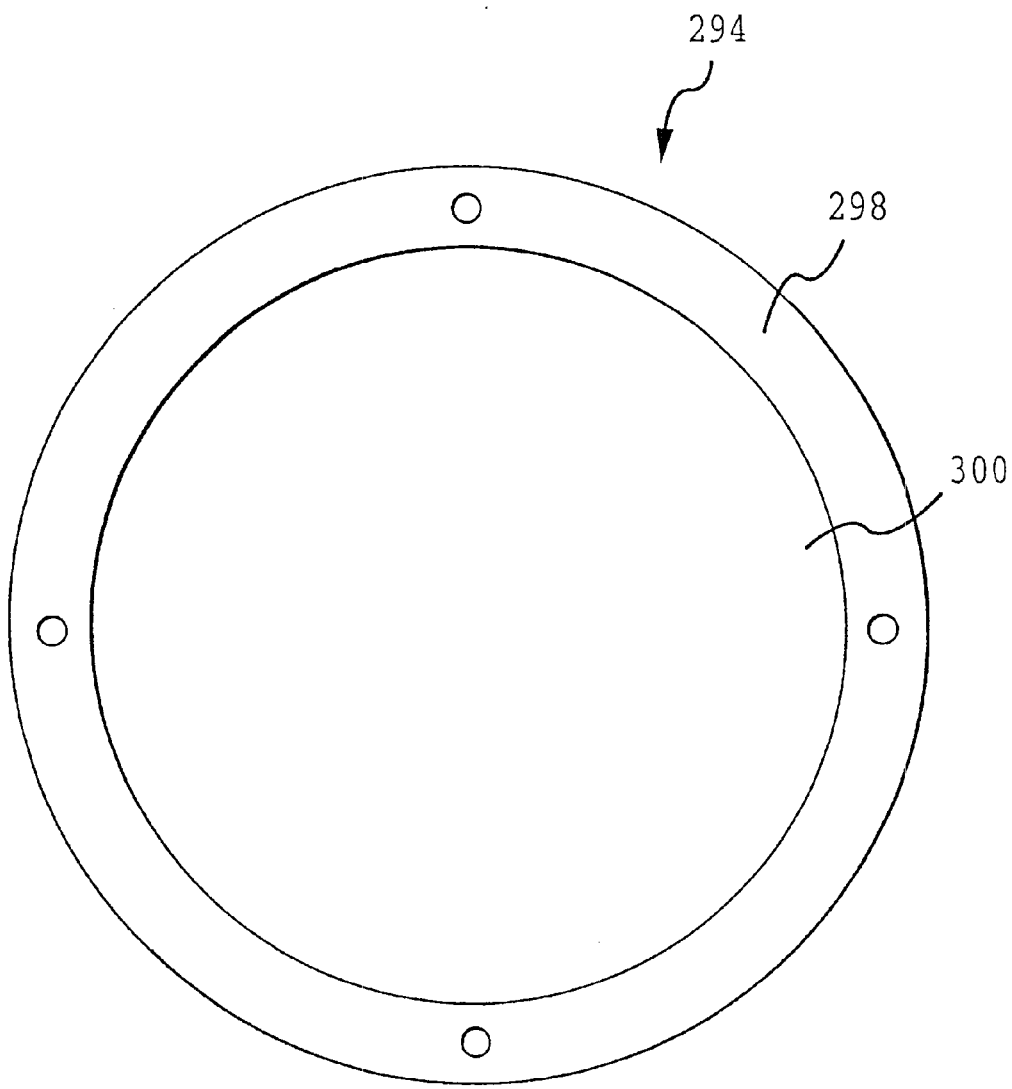
FIG. 36 is a front view of a mounting plate of the impactor shown in FIG. 34.

Details of the mounting plate 294 are shown in FIG. 36. The mounting plate 294 has a mounting flange 298 with a large diameter flow opening 300 passing therethrough to permit access of the aerosol 108 to the flow ports 296 of the flow control plate 290 (shown in FIG. 35).

Figure 37:
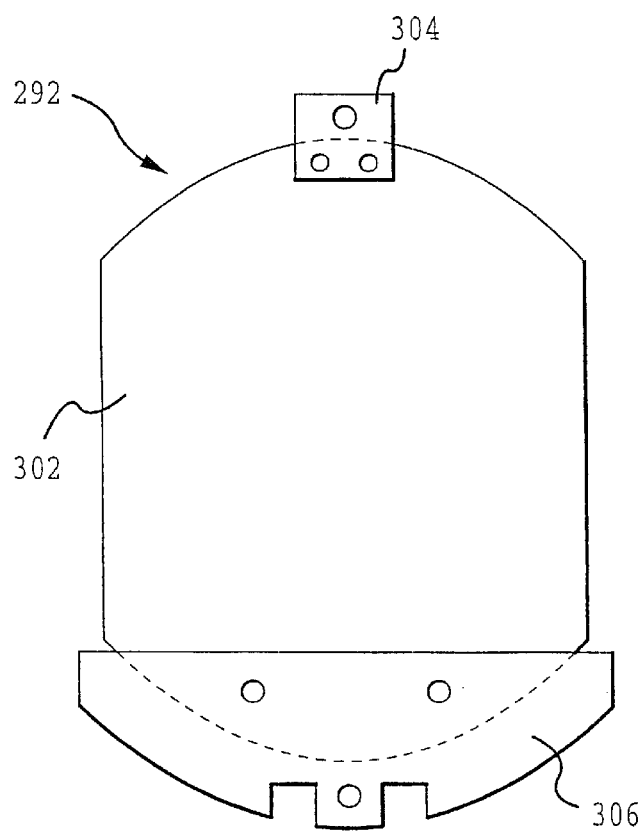
FIG. 37 is a front view of an impactor plate assembly of the impactor shown in FIG. 34.
Figure 38:
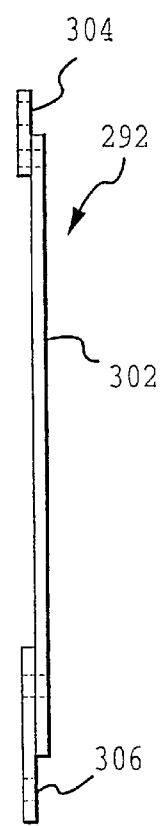
FIG. 38 is a side view of the impactor plate assembly shown in FIG. 37.

Referring now to FIGS. 37 and 38, one embodiment of an impactor plate assembly 292 is shown. The impactor plate assembly 292 includes an impactor plate 302 and mounting brackets 304 and 306 used to mount the impactor plate 302 inside of the flow conduit 286. The impactor plate 302 and the flow channel plate 290 are designed so that droplets larger than a predetermined size will have momentum that is too large for those particles to change flow direction to navigate around the impactor plate 302.

During operation of the impactor 288, the aerosol 108 from the aerosol generator 106 passes through the upstream flow control plate 290. Most of the droplets in the aerosol navigate around the impactor plate 302 and exit the impactor 288 through the downstream flow control plate 290 in the classified aerosol 282. Droplets in the aerosol 108 that are too large to navigate around the impactor plate 302 will impact on the impactor plate 302 and drain through the drain 296 to be collected with the drained liquid 284 (as shown in FIG. 34).

The configuration of the impactor plate 302 shown in FIG. 33 represents only one of many possible configurations for the impactor plate 302. For example, the impactor 288 could include an upstream flow control plate 290 having vertically extending flow slits therethrough that are offset from vertically extending flow slits through the impactor plate 302, such that droplets too large to navigate the change in flow due to the offset of the flow slits between the flow control plate 290 and the impactor plate 302 would impact on the impactor plate 302 to be drained away. Other designs are also possible.

In a preferred embodiment of the present invention, the droplet classifier 280 is typically designed to remove droplets from the aerosol 108 that are larger than about 15 microns in size, more preferably to remove droplets larger than about 10 microns in size, even more preferably to remove droplets of a size larger than about 8 microns in size and most preferably to remove droplets larger than about 5 microns in size. The droplet classification size in the droplet classifier is preferably smaller than about 15 microns, more preferably smaller than about 10 microns, even more preferably smaller than about 8 microns and most preferably smaller than about 5 microns. The classification size, also called the classification cut point, is that size at which half of the droplets of that size are removed and half of the droplets of that size are retained. Depending upon the specific application, however, the droplet classification size may be varied, such as by changing the spacing between the impactor plate 302 and the flow control plate 290 or increasing or decreasing aerosol velocity through the jets in the flow control plate 290. Because the aerosol generator 106 of the present invention initially produces a high quality aerosol 108, having a relatively narrow size distribution of droplets, typically less than about 30 weight percent of liquid feed 102 in the aerosol 108 is removed as the drain liquid 284 in the droplet classifier 288, with preferably less than about 25 weight percent being removed, even more preferably less than about 20 weight percent being removed and most preferably less than about 15 weight percent being removed. Minimizing the removal of liquid feed 102 from the aerosol 108 is particularly important for commercial applications to increase the yield of high quality particulate product 116. It should be noted, however, that because of the superior performance of the aerosol generator 106, it is frequently not required to use an impactor or other droplet classifier to obtain a desired absence of oversize droplets to the furnace. This is a major advantage, because the added complexity and liquid losses accompanying use of an impactor may often be avoided with the process of the present invention.

Figure 39:
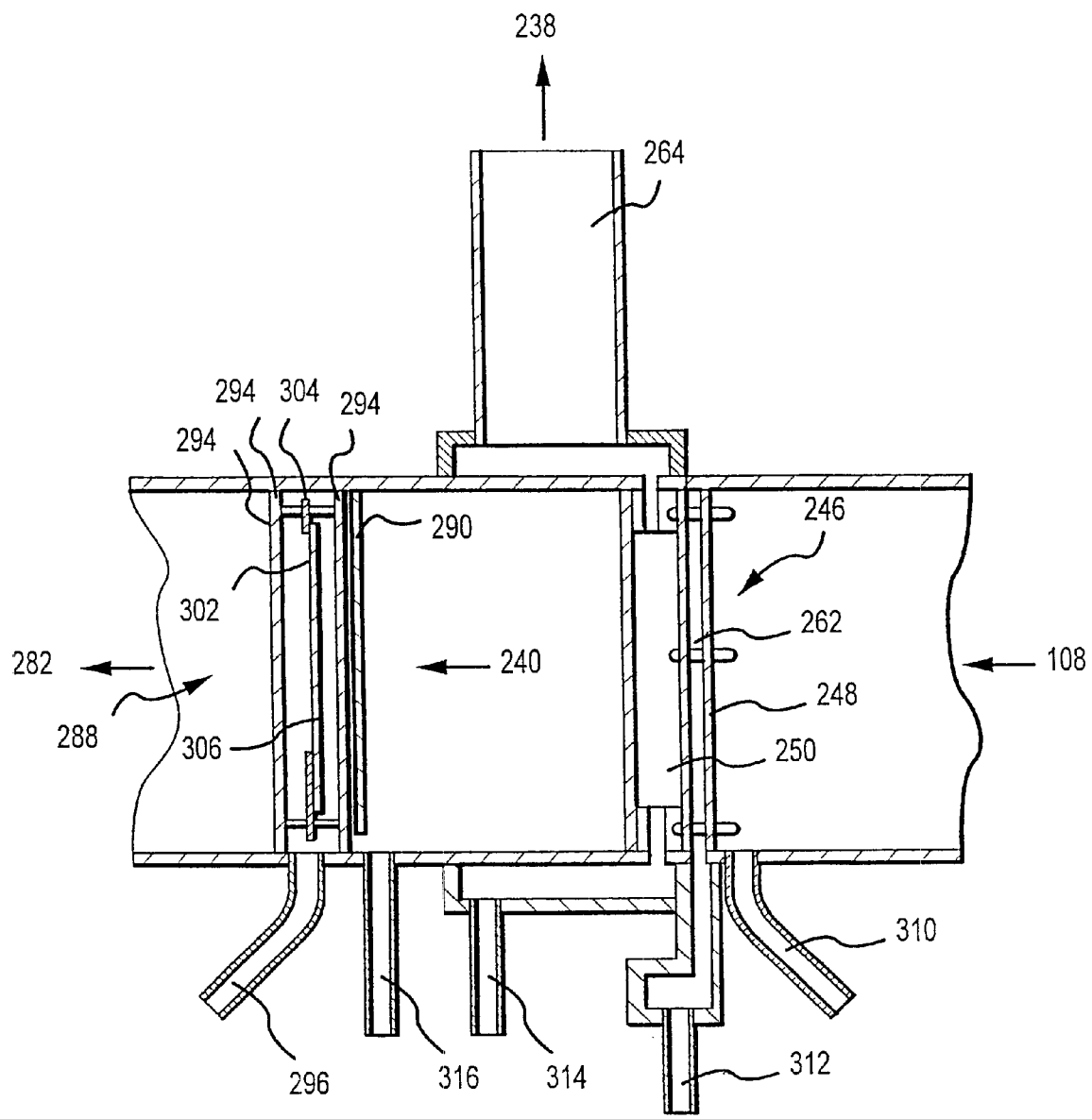
FIG. 39 shows a side view in cross section of a virtual impactor in combination with an impactor of the present invention for concentrating and classifying droplets in an aerosol.
Figure 40:
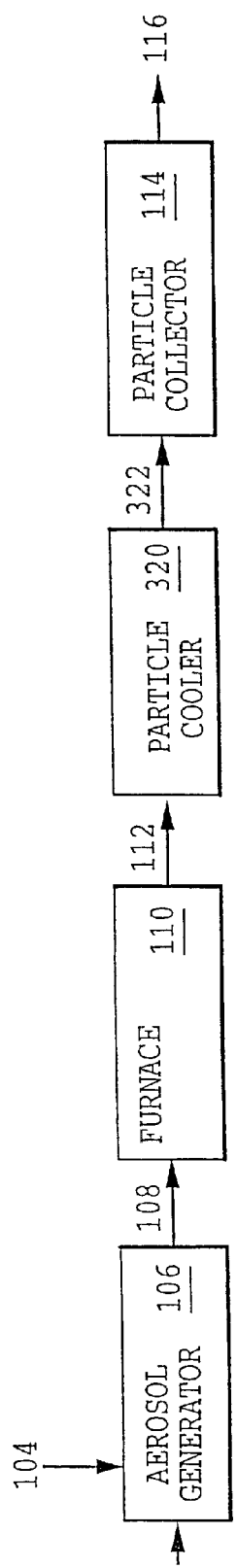
FIG. 40 is a process block diagram of one embodiment of the present invention including a particle cooler.
Figure 44:
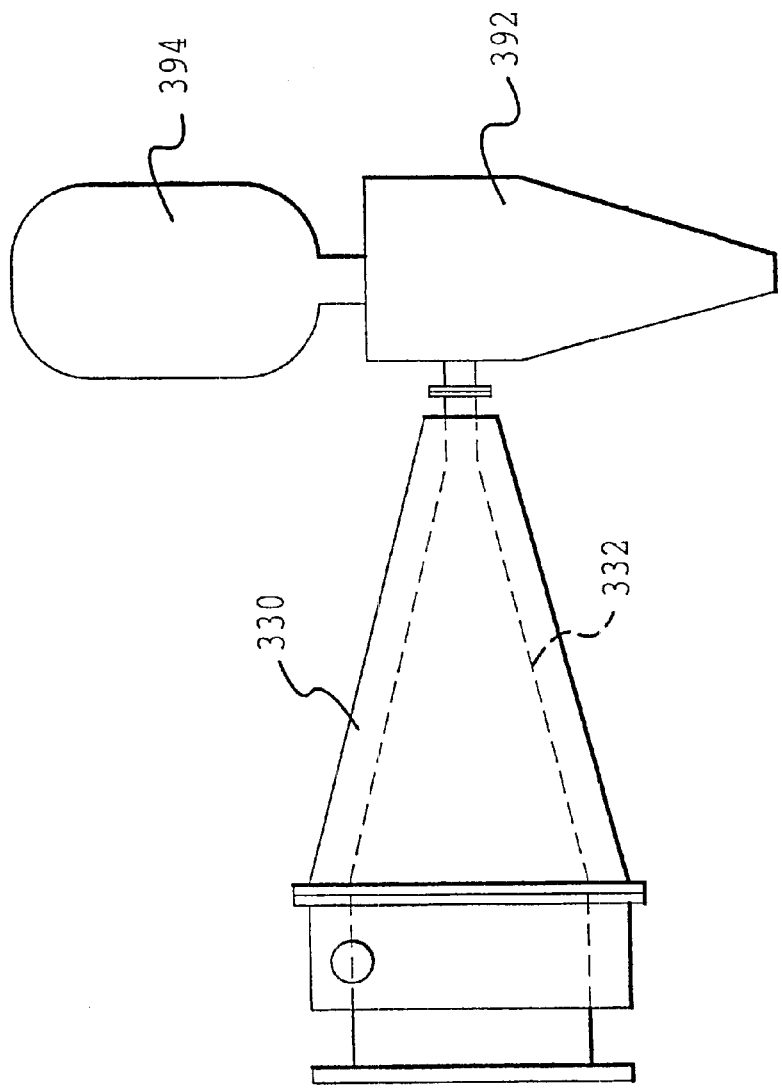
FIG. 44 is a side view showing one embodiment of a gas quench cooler of the present invention connected with a cyclone.

Sometimes it is desirable to use both the aerosol concentrator 236 and the droplet classifier 280 to produce an extremely high quality aerosol stream for introduction into the furnace for the production of particles of highly controlled size and size distribution. Referring now to FIG. 39, one embodiment of the present invention is shown incorporating both the virtual impactor 246 and the impactor 288. Basic components of the virtual impactor 246 and the impactor 288, as shown in FIG. 39, are substantially as previously described with reference to FIGS. 26–38. As seen in FIG. 39, the aerosol 108 from the aerosol generator 106 is fed to the virtual impactor 246 where the aerosol stream is concentrated to produce the concentrated aerosol 240. The concentrated aerosol 240 is then fed to the impactor 288 to remove large droplets therefrom and produce the classified aerosol 282, which may then be fed to the furnace 110. Also, it should be noted that by using both a virtual impactor and an impactor, both undesirably large and undesirably small droplets are removed, thereby producing a classified aerosol with a very narrow droplet size distribution. Also, the order of the aerosol concentrator and the aerosol classifier could be reversed, so that the aerosol concentrator 236 follows the aerosol classifier 280.

Figure 48:
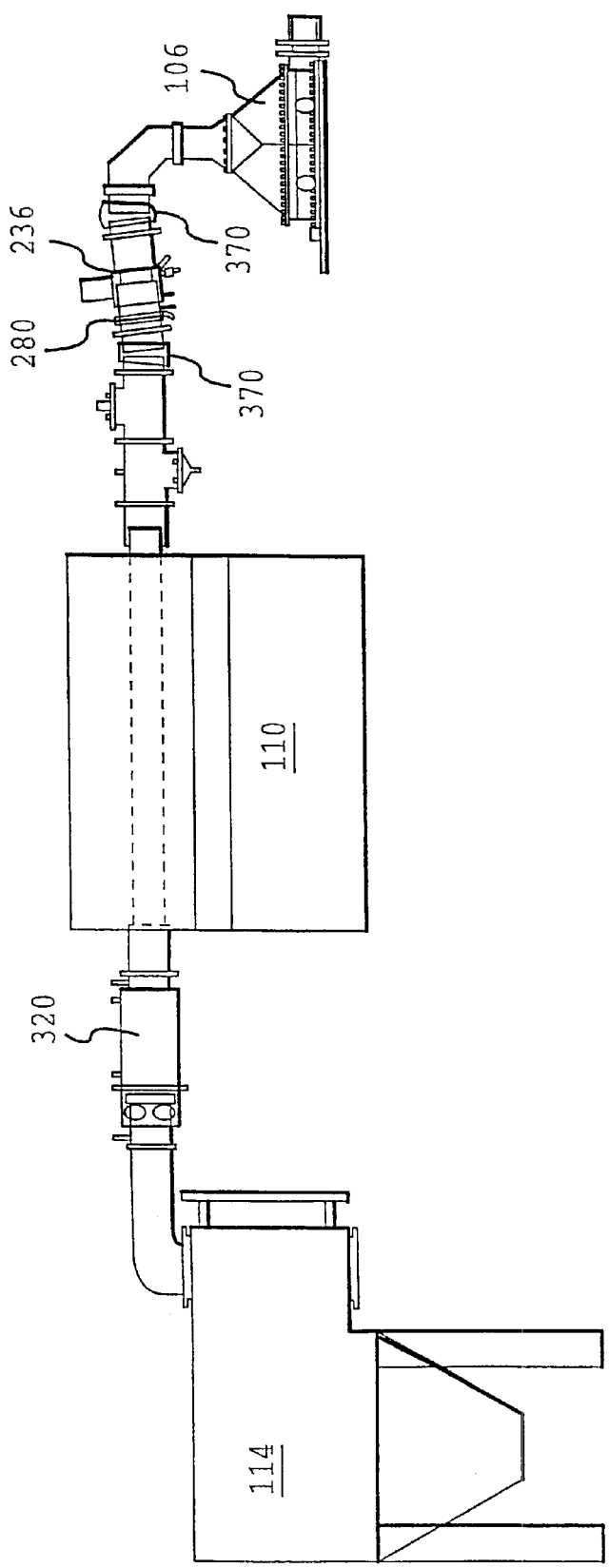
FIG. 48 shows a side view of one embodiment of apparatus of the present invention including an aerosol generator, an aerosol concentrator, a droplet classifier, a furnace, a particle cooler, and a particle collector.
Figure 49:
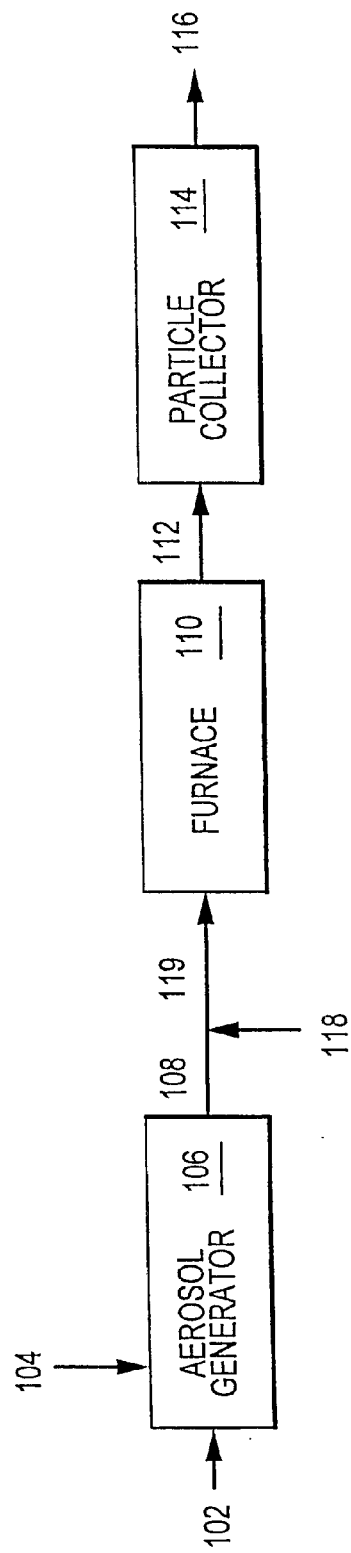
FIG. 49 is a block diagram of one embodiment of the process of the present invention including the addition of a dry gas between the aerosol generator and the furnace.

One important feature of the design shown in FIG. 39 is the incorporation of drains 310, 312, 314, 316 and 296 at strategic locations. These drains are extremely important for industrial-scale particle production because buildup of liquid in the process equipment can significantly impair the quality of the particulate product 116 that is produced. In that regard, drain 310 drains liquid away from the inlet side of the first plate assembly 248 of the virtual impactor 246. Drain 312 drains liquid away from the inside of the concentrating chamber 262 in the virtual impactor 246 and drain 314 removes liquid that deposits out of the excess carrier gas 238. Drain 316 removes liquid from the vicinity of the inlet side of the flow control plate 290 of the impactor, while the drain 296 removes liquid from the vicinity of the impactor plate 302. Without these drains 310, 312, 314, 316 and 296, the performance of the apparatus shown in FIG. 39 would be significantly impaired. All liquids drained in the drains 310, 312, 314, 316 and 296 may advantageously be recycled for use to prepare the liquid feed 102.

With some applications of the process of the present invention, it may be possible to collect the particles 112 directly from the output of the furnace 110. More often, however, it will be desirable to cool the particles 112 exiting the furnace 110 prior to collection of the particles 112 in the particle collector 114. Referring now to FIG. 40, one embodiment of the process of the present invention is shown in which the particles 112 exiting the furnace 110 are sent to a particle cooler 320 to produce a cooled particle stream 322, which is then feed to the particle collector 114. Although the particle cooler 320 may be any cooling apparatus capable of cooling the particles 112 to the desired temperature for introduction into the particle collector 114, traditional heat exchanger designs are not preferred. This is because a traditional heat exchanger design ordinarily directly subjects the aerosol stream, in which the hot particles 112 are suspended, to cool surfaces. In that situation, significant losses of the particles 112 occur due to thermophoretic deposition of the hot particles 112 on the cool surfaces of the heat exchanger. According to the present invention, a gas quench apparatus is provided for use as the particle cooler 320 that significantly reduces thermophoretic losses compared to a traditional heat exchanger.

Referring now to FIGS. 41–43, one embodiment of a gas quench cooler 330 is shown. The gas quench cooler includes a perforated conduit 332 housed inside of a cooler housing 334 with an annular space 336 located between the cooler housing 334 and the perforated conduit 332. In fluid communication with the annular space 336 is a quench gas inlet box 338, inside of which is disposed a portion of an aerosol outlet conduit 340. The perforated conduit 332 extends between the aerosol outlet conduit 340 and an aerosol inlet conduit 342. Attached to an opening into the quench gas inlet box 338 are two quench gas feed tubes 344. Referring specifically to FIG. 43, the perforated tube 332 is shown. The perforated tube 332 has a plurality of openings 345. The openings 345, when the perforated conduit 332 is assembled into the gas quench cooler 330, permit the flow of quench gas 346 from the annular space 336 into the interior space 348 of the perforated conduit 332. Although the openings 345 are shown as being round holes, any shape of opening could be used, such as slits. Also, the perforated conduit 332 could be a porous screen. Two heat radiation shields 347 prevent downstream radiant heating from the furnace. In most instances, however, it will not be necessary to include the heat radiation shields 347, because downstream radiant heating from the furnace is normally not a significant problem. Use of the heat radiation shields 347 is not preferred due to particulate losses that accompany their use.

With continued reference to FIGS. 41–43, operation of the gas quench cooler 330 will now be described. During operation, the particles 112, carried by and dispersed in a gas stream, enter the gas quench cooler 330 through the aerosol inlet conduit 342 and flow into the interior space 348 of perforated conduit 332. Quench gas 346 is introduced through the quench gas feed tubes 344 into the quench gas inlet box 338. Quench gas 346 entering the quench gas inlet box 338 encounters the outer surface of the aerosol outlet conduit 340, forcing the quench gas 346 to flow, in a spiraling, swirling manner, into the annular space 336, where the quench gas 346 flows through the openings 345 through the walls of the perforated conduit 332. Preferably, the gas 346 retains some swirling motion even after passing into the interior space 348. In this way, the particles 112 are quickly cooled with low losses of particles to the walls of the gas quench cooler 330. In this manner, the quench gas 346 enters in a radial direction into the interior space 348 of the perforated conduit 332 around the entire periphery, or circumference, of the perforated conduit 332 and over the entire length of the perforated conduit 332. The cool quench gas 346 mixes with and cools the hot particles 112, which then exit through the aerosol outlet conduit 340 as the cooled particle stream 322. The cooled particle stream 322 can then be sent to the particle collector 114 for particle collection. The temperature of the cooled particle stream 322 is controlled by introducing more or less quench gas. Also, as shown in FIG. 41, the quench gas 346 is fed into the quench cooler 330 in counter flow to flow of the particles. Alternatively, the quench cooler could be designed so that the quench gas 346 is fed into the quench cooler in concurrent flow with the flow of the particles 112. The amount of quench gas 346 fed to the gas quench cooler 330 will depend upon the specific material being made and the specific operating conditions. The quantity of quench gas 346 used, however, must be sufficient to reduce the temperature of the aerosol steam including the particles 112 to the desired temperature. Typically, the particles 112 are cooled to a temperature at least below about 200° C., and often lower. The only limitation on how much the particles 112 are cooled is that the cooled particle stream 322 must be at a temperature that is above the condensation temperature for water as another condensible vapor in the stream. The temperature of the cooled particle stream 322 is often at a temperature of from about 50° C. to about 120° C.

Because of the entry of quench gas 346 into the interior space 348 of the perforated conduit 322 in a radial direction about the entire circumference and length of the perforated conduit 322, a buffer of the cool quench gas 346 is formed about the inner wall of the perforated conduit 332, thereby significantly inhibiting the loss of hot particles 112 due to thermophoretic deposition on the cool wall of the perforated conduit 332. In operation, the quench gas 346 exiting the openings 345 and entering into the interior space 348 should have a radial velocity (velocity inward toward the center of the circular cross-section of the perforated conduit 332) of larger than the thermophoretic velocity of the particles 112 inside the perforated conduit 332 in a direction radially outward toward the perforated wall of the perforated conduit 332.

As seen in FIGS. 41–43, the gas quench cooler 330 includes a flow path for the particles 112 through the gas quench cooler of a substantially constant cross-sectional shape and area. Preferably, the flow path through the gas quench cooler 330 will have the same cross-sectional shape and area as the flow path through the furnace 110 and through the conduit delivering the aerosol 108 from the aerosol generator 106 to the furnace 110. In one embodiment, however, it may be necessary to reduce the cross-sectional area available for flow prior to the particle collector 114. This is the case, for example, when the particle collector includes a cyclone for separating particles in the cooled particle stream 322 from gas in the cooled particle stream 322. This is because of the high inlet velocity requirements into cyclone separators.

Referring now to FIG. 44, one embodiment of the gas quench cooler 330 is shown in combination with a cyclone separator 392. The perforated conduit 332 has a continuously decreasing cross-sectional area for flow to increase the velocity of flow to the proper value for the feed to cyclone separator 392. Attached to the cyclone separator 392 is a bag filter 394 for final clean-up of overflow from the cyclone separator 392. Separated particles exit with underflow from the cyclone separator 392 and may be collected in any convenient container. The use of cyclone separation is particularly preferred for powder having a weight average size of larger than about 1 micron, although a series of cyclones may sometimes be needed to get the desired degree of separation. Cyclone separation is particularly preferred for powders having a weight average size of larger than about 1.5 microns. Also, cyclone separation is best suited for high density materials. Preferably, when particles are separated using a cyclone, the particles are of a composition with specific gravity of greater than about 5.

In an additional embodiment, the process of the present invention can also incorporate compositional modification of the particles 112 exiting the furnace. Most commonly, the compositional modification will involve forming on the particles 112 a material phase that is different than that of the particles 112, such as by coating the particles 112 with a coating material. One embodiment of the process of the present invention incorporating particle coating is shown in FIG. 45. As shown in FIG. 45, the particles 112 exiting from the furnace 110 go to a particle coater 350 where a coating is placed over the outer surface of the particles 112 to form coated particles 352, which are then sent to the particle collector 114 for preparation of the particulate product 116.

In the particle coater 350, the particles 112 are coated using any suitable particle coating technology, such as by gas-to-particle conversion. Preferably, however, the coating is accomplished by chemical vapor deposition (CVD) and/or physical vapor deposition (PVD). In CVD coating, one or more vapor phase coating precursors are reacted to form a surface coating on the particles 112. Preferred coatings deposited by CVD include oxides, such as silica, and elemental metals. In PVD coating, coating material physically deposits on the surface of the particles 112. Preferred coatings deposited by PVD include organic materials and elemental metals, such as elemental silver, copper and gold. Another possible surface coating method is surface conversion of the surface portion of the particles 112 by reaction with a vapor phase reactant to convert a surface portion of the particles to a different material than that originally contained in the particles 112. Although any suitable apparatus may be used for the particle coater 350, when a gaseous coating feed involving coating precursors is used, such as for CVD and PVD, feed of the gaseous coating feed is introduced through a circumferentially perforated conduit, such as was described for the quench cooler 330 with reference to FIGS. 41–44. In some instances, the quench cooler 330 may also act as the particle coater 350, when coating material precursors are included in the quench gas 346.

With continued reference primarily to FIG. 45, in a preferred embodiment, when the particles 112 are coated according to the process of the present invention, the particles 112 are also manufactured via the aerosol process of the present invention, as previously described. The process of the present invention can, however, be used to coat particles that have been premanufactured by a different process, such as by a liquid precipitation route. When coating particles that have been premanufactured by a different route, such as by liquid precipitation, it is preferred that the particles remain in a dispersed state from the time of manufacture to the time that the particles are introduced in slurry form into the aerosol generator 106 for preparation of the aerosol 108 to form the dry particles 112 in the furnace 110, which particles 112 can then be coated in the particle coater 350. Maintaining particles in a dispersed state from manufacture through coating avoids problems associated with agglomeration and redispersion of particles if particles must be redispersed in the liquid feed 102 for feed to the aerosol generator 106. For example, for particles originally precipitated from a liquid medium, the liquid medium containing the suspended precipitated particles could be used to form the liquid feed 102 to the aerosol generator 106. It should be noted that the particle coater 350 could be an integral extension of the furnace 110 or could be a separate piece of equipment.

In a further embodiment of the present invention, following preparation of the particles 112 in the furnace 110, the particles 112 may then be structurally modified to impart desired physical properties prior to particle collection. Referring now to FIG. 46, one embodiment of the process of the present invention is shown including such structural particle modification. The particles 112 exiting the furnace 110 go to a particle modifier 360 where the particles are structurally modified to form modified particles 362, which are then sent to the particle collector 114 for preparation of the particulate product 116. The particle modifier 360 is typically a furnace, such as an annealing furnace, which may be integral with the furnace 110 or may be a separate heating device. Regardless, it is important that the particle modifier 360 have temperature control that is independent of the furnace 110, so that the proper conditions for particle modification may be provided separate from conditions required of the furnace 110 to prepare the particles 112. The particle modifier 360, therefore, typically provides a temperature controlled environment and necessary residence time to effect the desired structural modification of the particles 112.

The structural modification that occurs in the particle modifier 360 may be any modification to the crystalline structure or morphology of the particles 112. For example, the particles 112 may be annealed in the particle modifier 360 to densify the particles 112 or to recrystallize the particles 112 into a polycrystalline or single crystalline form. Also, especially in the case of composite particles 112, the particles may be annealed for a sufficient time to permit redistribution within the particles 112 of different material phases.

The initial morphology of composite particles made in the furnace 110, according to the present invention, could take a variety of forms, depending upon the specified materials involved and the specific processing conditions. Examples of some possible composite particle morphologies, manufacturable according to the present invention are shown in FIG. 47. These morphologies could be of the particles as initially produced in the furnace 110 or that result from structural modification in the particle modifier 360. Furthermore, the composite particles could include a mixture of the morphological attributes shown in FIG. 47.

Referring now to FIG. 48, an embodiment of the apparatus of the present invention is shown that includes the aerosol generator 106 (in the form of the 400 transducer array design), the aerosol concentrator 236 (in the form of a virtual impactor), the droplet classifier 280 (in the form of an impactor), the furnace 110, the particle cooler 320 (in the form of a gas quench cooler) and the particle collector 114 (in the form of a bag filter). All process equipment components are connected via appropriate flow conduits that are substantially free of sharp edges that could detrimentally cause liquid accumulations in the apparatus. Also, it should be noted that flex connectors 370 are used upstream and downstream of the aerosol concentrator 236 and the droplet classifier 280. By using the flex connectors 370, it is possible to vary the angle of slant of vertically extending slits in the aerosol concentrator 236 and/or the droplet classifier 280. In this way, a desired slant for the vertically extending slits may be set to optimize the draining characteristics off the vertically extending slits.

Aerosol generation with the process of the present invention has thus far been described with respect to the ultrasonic aerosol generator. Use of the ultrasonic generator is preferred for the process of the present invention because of the extremely high quality and dense aerosol generated. In some instances, however, the aerosol generator for the process of the present invention may have a different design depending upon the specific application. For example, when larger particles are desired, such as those having a weight average size of larger than about 3 microns, a spray nozzle atomizer may be preferred. For smaller-particle applications, however, and particularly for those applications to produce particles smaller than about 3 microns, and preferably smaller than about 2 microns in size, as is generally desired with the particles of the present invention, the ultrasonic generator, as described herein, is particularly preferred. In that regard, the ultrasonic generator of the present invention is particularly preferred for when making particles with a weight average size of from about 0.2 micron to about 3 microns.

Although ultrasonic aerosol generators have been used for medical applications and home humidifiers, use of ultrasonic generators for spray pyrolysis particle manufacture has largely been confined to small-scale, experimental situations. The ultrasonic aerosol generator of the present invention described with reference to FIGS. 5–24, however, is well suited for commercial production of high quality powders with a small average size and a narrow size distribution. In that regard, the aerosol generator produces a high quality aerosol, with heavy droplet loading and at a high rate of production. Such a combination of small droplet size, narrow size distribution, heavy droplet loading, and high production rate provide significant advantages over existing aerosol generators that usually suffer from at least one of inadequately narrow size distribution, undesirably low droplet loading, or unacceptably low production rate.

Through the careful and controlled design of the ultrasonic generator of the present invention, an aerosol may be produced typically having greater than about 70 weight percent (and preferably greater than about 80 weight percent) of droplets in the size range of from about 1 micron to about 10 microns, preferably in a size range of from about 1 micron to about 5 microns and more preferably from about 2 microns to about 4 microns. Also, the ultrasonic generator of the present invention is capable of delivering high output rates of liquid feed in the aerosol. The rate of liquid feed, at the high liquid loadings previously described, is preferably greater than about 25 milliliters per hour per transducer, more preferably greater than about 37.5 milliliters per hour per transducer, even more preferably greater than about 50 milliliters per hour per transducer and most preferably greater than about 100 millimeters per hour per transducer. This high level of performance is desirable for commercial operations and is accomplished with the present invention with a relatively simple design including a single precursor bath over an array of ultrasonic transducers. The ultrasonic generator is made for high aerosol production rates at a high droplet loading, and with a narrow size distribution of droplets. The generator preferably produces an aerosol at a rate of greater than about 0.5 liter per hour of droplets, more preferably greater than about 2 liters per hour o droplets, still more preferably greater than about 5 liters per hour of droplets, even more preferably greater than about 10 liters per hour of droplets and most preferably greater than about 40 liters per hour of droplets. For example, when the aerosol generator has a 400 transducer design, as described with reference to FIGS. 7–24, the aerosol generator is capable of producing a high quality aerosol having high droplet loading as previously described, at a total production rate of preferably greater than about 10 liters per hour of liquid feed, more preferably greater than about 15 liters per hour of liquid feed, even more preferably greater than about 20 liters per hour of liquid feed and most preferably greater than about 40 liters per hour of liquid feed.

Under most opera ting conditions, when using such an aerosol generator, total particulate product produced is preferably greater than about 0.5 gram per hour per transducer, more preferably greater than about 0.75 gram per hour per transducer, even more preferably greater than about 1.0 gram per hour per transducer and most preferably greater than about 2.0 grams per hour per transducer.

The concentrations of soluble precursors in the liquid feed 102 will vary depending upon the particular materials involved and the particular particle composition and particle morphology desired. For most applications, when soluble precursor(s) are used, the soluble precursor(s) are present at a concentration of from about 1–50 weight percent of the liquid feed. 102. In any event, however, when soluble precursors are used, the precursors should be at a low enough concentration to permit the liquid feed to be ultrasonically atomized and to prevent premature precipitation of materials from the liquid feed 102. The concentration of suspended particulate precursors will also vary depending upon the particular materials involved in the particular application.

One significant aspect of the process of the present invention for manufacturing particulate materials is the unique flow characteristics encountered in the furnace relative to laboratory scale systems. The maximum Reynolds number attained for flow in the furnace 110 with the present invention is very high, typically in excess of 500, preferably in excess of 1,000 and more preferably in excess of 2,000. In most instances, however, the maximum Reynolds number for flow in the furnace will not exceed 10,000, and preferably will not exceed 5,000. This is significantly different from lab-scale systems where the Reynolds number for flow in a reactor is typically lower than 50 and rarely exceeds 100.

The Reynolds number is a dimensionless quantity characterizing flow of a fluid which, for flow through a circular cross sectional conduit is defined as:

$$Re = \frac{\rho v d}{\mu}$$

where:
ρ=fluid density;
v=fluid mean velocity;
d=conduit inside diameter; and
μ=fluid viscosity.

It should be noted that the values for density, velocity and viscosity will vary along the length of the furnace 110. The maximum Reynolds number in the furnace 110 is typically attained when the average stream temperature is at a maximum, because the gas velocity is at a very high value due to gas expansion when heated.

One problem with operating under flow conditions at a high Reynolds number is that undesirable volatilization of components is much more likely to occur than in systems having flow characteristics as found in laboratory-scale systems. The volatilization problem occurs with the present invention, because the furnace is typically operated over a substantial section of the heating zone in a constant wall heat flux mode, due to limitations in heat transfer capability. This is significantly different than operation of a furnace at a laboratory scale, which typically involves operation of most of the heating zone of the furnace in a uniform wall temperature mode, because the heating load is sufficiently small that the system is not heat transfer limited.

With the present invention, it is typically preferred to heat the aerosol stream in the heating zone of the furnace as quickly as possible to the desired temperature range for particle manufacture. Because of flow characteristics in the furnace and heat transfer limitations, during rapid heating of the aerosol the wall temperature of the furnace can significantly exceed the maximum average target temperature for the stream. This is a problem because, even though the average stream temperature may be within the range desired, the wall temperature may become so hot that components in the vicinity of the wall are subjected to temperatures high enough to undesirably volatilize the components. This volatilization near the wall of the furnace can cause formation of significant quantities of ultrafine particles that are outside of the size range desired.

Therefore, with the present invention, it is preferred that when the flow characteristics in the furnace are such that the Reynolds number through any part of the furnace exceeds 500, more preferably exceeds 1,000, and most preferably exceeds 2,000, the maximum wall temperature in the furnace should be kept at a temperature that is below the temperature at which a desired component of the final particles would exert a vapor pressure not exceeding about 200 millitorr, more preferably not exceeding about 100 millitorr, and most preferably not exceeding about 50 millitorr. Furthermore, the maximum wall temperature in the furnace should also be kept below a temperature at which an intermediate component, from which a final component is to be at least partially derived, should also have a vapor pressure not exceeding the magnitudes noted for components of the final product.

In addition to maintaining the furnace wall temperature below a level that could create volatilization problems, it is also important that this not be accomplished at the expense of the desired average stream temperature. The maximum average stream temperature must be maintained at a high enough level so that the particles will have a desired high density. The maximum average stream temperature should, however, generally be a temperature at which a component in the final particles, or an intermediate component from which a component in the final particles is at least partially derived, would exert a vapor pressure not exceeding about 100 millitorr, preferably not exceeding about 50 millitorr, and most preferably not exceeding about 25 millitorr.

So long as the maximum wall temperature and the average stream temperature are kept below the point at which detrimental volatilization occurs, it is generally desirable to heat the stream as fast as possible and to remove resulting particles from the furnace immediately after the maximum average stream temperature is reached in the furnace. With the present invention, the average residence time in the heating zone of the furnace may typically be maintained at shorter than about 4 seconds, preferably shorter than about 2 seconds, more preferably shorter than about 1 second, still more preferably shorter than about 0.5 second, and most preferably shorter than about 0.2 second.

Another significant issue with respect to operating the process of the present invention, which includes high aerosol flow rates, is loss within the system of materials intended for incorporation into the final particulate product. Material losses in the system can be quite high if the system is not properly operated. If system losses are too high, the process would not be practical for use in the manufacture of particulate products of many materials. This has typically not been a major consideration with laboratory-scale systems.

One significant potential for loss with the process of the present invention is thermophoretic losses that occur when a hot aerosol stream is in the presence of a cooler surface. In that regard, the use of the quench cooler, as previously described, with the process of the present invention provides an efficient way to cool the particles without unreasonably high thermophoretic losses. There is also, however, significant potential for losses occurring near the end of the furnace and between the furnace and the cooling unit.

It has been found that thermophoretic losses in the back end of the furnace can be significantly controlled if the heating zone of the furnace is operated such that the maximum average stream temperature is not attained until near the end of the heating zone in the furnace, and at least not until the last third of the heating zone. When the heating zone includes a plurality of heating sections, the maximum average stream temperature should ordinarily not occur until at least the last heating section. Furthermore, the heating zone should typically extend to as close to the exit of the furnace as possible. This is counter to conventional thought which is to typically maintain the exit portion of the furnace at a low temperature to avoid having to seal the furnace outlet at a high temperature. Such cooling of the exit portion of the furnace, however, significantly promotes thermophoretic losses. Furthermore, the potential for operating problems that could result in thermophoretic losses at the back end of the furnace are reduced with the very short residence times in the furnace for the present invention, as discussed previously.

Typically, it would be desirable to instantaneously cool the aerosol upon exiting the furnace. This is not possible. It is possible, however, to make the residence time between the furnace outlet and the cooling unit as short as possible. Furthermore, it is desirable to insulate the aerosol conduit occurring between the furnace exit and the cooling unit entrance. Even more preferred is to insulate that conduit and, even more preferably, to also heat that conduit so that the wall temperature of that conduit is at least as high as the average stream temperature of the aerosol stream. Furthermore, it is desirable that the cooling unit operate in a manner such that the aerosol is quickly cooled in a manner to prevent thermophoretic losses during cooling. The quench cooler, described previously, is very effective for cooling with low losses. Furthermore, to keep the potential for thermophoretic losses very low, it is preferred that the residence time of the aerosol stream between attaining the maximum average stream temperature in the furnace and a point at which the aerosol has been cooled to an average stream temperature below about 200° C. is shorter than about 2 seconds, more preferably shorter than about 1 second, and even more preferably shorter than about 0.5 second and most preferably shorter than about 0.1 second. In most instances, the maximum average stream temperature attained in the furnace will be greater than about 800° C. Furthermore, the total residence time from the beginning of the heating zone in the furnace to a point at which the average stream temperature is at a temperature below about 200° C. should typically be shorter than about 5 seconds, preferably shorter than about 3 seconds, more preferably shorter than about 2 seconds, and most preferably shorter than about 1 second.

Another part of the process with significant potential for thermophoretic losses is after particle cooling until the particles are finally collected. Proper particle collection is very important to reducing losses within the system. The potential for thermophoretic losses is significant following particle cooling because the aerosol stream is still at an elevated temperature to prevent detrimental condensation of water in the aerosol stream. Therefore, cooler surfaces of particle collection equipment can result in significant thermophoretic losses.

To reduce the potential for thermophoretic losses before the particles are finally collected, it is important that the transition between the cooling unit and particle collection be as short as possible. Preferably, the output from the quench cooler is immediately sent to a particle separator, such as a filter unit or a cyclone. In that regard, the total residence time of the aerosol between attaining the maximum average stream temperature in the furnace and the final collection of the particles is preferably shorter than about 2 seconds, more preferably shorter than about 1 second, still more preferably shorter than about 0.5 second and most preferably shorter than about 0.1 second. Furthermore, the residence time between the beginning of the heating zone in the furnace and final collection of the particles is preferably shorter than about 6 seconds, more preferably shorter than about 3 seconds, even more preferably shorter than about 2 seconds, and most preferably shorter than about 1 second. Furthermore, the potential for thermophoretic losses may further be reduced by insulating the conduit section between the cooling unit and the particle collector and, even more preferably, by also insulating around the filter, when a filter is used for particle collection. The potential for losses may be reduced even further by heating of the conduit section between the cooling unit and the particle collection equipment, so that the internal equipment surfaces are at least slightly warmer than the aerosol stream average stream temperature. Furthermore, when a filter is used for particle collection, the filter could be heated. For example, insulation could be wrapped around a filter unit, with electric heating inside of the insulating layer to maintain the walls of the filter unit at a desired elevated temperature higher than the temperature of filter elements in the filter unit, thereby reducing thermophoretic particle losses to walls of the filter unit.

Even with careful operation to reduce thermophoretic losses, some losses will still occur. For example, some particles will inevitably be lost to walls of particle collection equipment, such as the walls of a cyclone or filter housing. One way to reduce these losses, and correspondingly increase product yield, is to periodically wash the interior of the particle collection equipment to remove particles adhering to the sides. In most cases, the wash fluid will be water, unless water would have a detrimental effect on one of the components of the particles. For example, the particle collection equipment could include parallel collection paths. One path could be used for active particle collection while the other is being washed. The wash could include an automatic or manual flush without disconnecting the equipment. Alternatively, the equipment to be washed could be disconnected to permit access to the interior of the equipment for a thorough wash. As an alternative to having parallel collection paths, the process could simply be shut down occasionally to permit disconnection of the equipment for washing. The removed equipment could be replaced with a clean piece of equipment and the process could then be resumed while the disconnected equipment is being washed.

For example, a cyclone or filter unit could periodically be disconnected and particles adhering to interior walls could be removed by a water wash. The particles could then be dried in a low temperature dryer, typically at a temperature of lower than about 50° C.

In one embodiment, wash fluid used to wash particles from the interior walls of particle collection equipment includes a surfactant. Some of the surfactant will adhere to the surface of the particles. This could be advantageous to reduce agglomeration tendency of the particles and to enhance dispersibility of the particles in a thick film past formulation. The surfactant could be selected for compatibility with the specific paste formulation anticipated.

Another area for potential losses in the system, and for the occurrence of potential operating problems, is between the outlet of the aerosol generator and the inlet of the furnace. Losses here are not due to thermophoresis, but rather to liquid coming out of the aerosol and impinging and collecting on conduit and equipment surfaces. Although this loss is undesirable from a material yield standpoint, the loss may be even more detrimental to other aspects of the process. For example, water collecting on surfaces may release large droplets that can lead to large particles that detrimentally contaminate the particulate product. Furthermore, if accumulated liquid reaches the furnace, the liquid can cause excessive temperature gradients within the furnace tube, which can cause furnace tube failure, especially for ceramic tubes. One way to reduce the potential for undesirable liquid buildup in the system is to provide adequate drains, as previously described. In that regard, it is preferred that a drain be placed as close as possible to the furnace inlet to prevent liquid accumulations from reaching the furnace. The drain should be placed, however, far enough in advance of the furnace inlet such that the stream temperature is lower than about 80° C. at the drain location.

Another way to reduce the potential for undesirable liquid buildup is for the conduit between the aerosol generator outlet and the furnace inlet be of a substantially constant cross sectional area and configuration. Preferably, the conduit beginning with the aerosol generator outlet, passing through the furnace and continuing to at least the cooling unit inlet is of a substantially constant cross sectional area and geometry.

Another way to reduce the potential for undesirable buildup is to heat at least a portion, and preferably the entire length, of the conduit between the aerosol generator and the inlet to the furnace. For example, the conduit could be wrapped with a heating tape to maintain the inside walls of the conduit at a temperature higher than the temperature of the aerosol. The aerosol would then tend to concentrate toward the center of the conduit due to thermophoresis. Fewer aerosol droplets would, therefore, be likely to impinge on conduit walls or other surfaces making the transition to the furnace.

Another way to reduce the potential for undesirable liquid buildup is to introduce a dry gas into the aerosol between the aerosol generator and the furnace. Referring now to FIG. 49, one embodiment of the process is shown for adding a dry gas 118 to the aerosol 108 before the furnace 110. Addition of the dry gas 118 causes vaporization of at least a part of the moisture in the aerosol 108, and preferably substantially all of the moisture in the aerosol 108, to form a dried aerosol 119, which is then introduced into the furnace 110.

The dry gas 118 will most often be dry air, although in some instances it may be desirable to use dry nitrogen gas or some other dry gas. If a sufficient quantity of the dry gas 118 is used, the droplets of the aerosol 108 are substantially completely dried to beneficially form dried precursor particles in aerosol form for introduction into the furnace 110, where the precursor particles are then pyrolyzed to make a desired particulate product. Also, the use of the dry gas 118 typically will reduce the potential for contact between droplets of the aerosol and the conduit wall, especially in the critical area in the vicinity of the inlet to the furnace 110. In that regard, a preferred method for introducing the dry gas 118 into the aerosol 108 is from a radial direction into the aerosol 108. For example, equipment of substantially the same design as the quench cooler, described previously with reference to FIGS. 41–43, could be used, with the aerosol 108 flowing through the interior flow path of the apparatus and the dry gas 118 being introduced through perforated wall of the perforated conduit. An alternative to using the dry gas 118 to dry the aerosol 108 would be to use a low temperature thermal preheater/dryer prior to the furnace 110 to dry the aerosol 108 prior to introduction into the furnace 110. This alternative is not, however, preferred.

Still another way to reduce the potential for losses due to liquid accumulation is to operate the process with equipment configurations such that the aerosol stream flows in a vertical direction from the aerosol generator to and through the furnace. For smaller-size particles, those smaller than about 1.5 microns, this vertical flow should, preferably, be vertically upward. For larger-size particles, such as those larger than about 1.5 microns, the vertical flow is preferably vertically downward.

Furthermore, with the process of the present invention, the potential for system losses is significantly reduced because the total system retention time from the outlet of the generator until collection of the particles is typically shorter than about 10 seconds, preferably shorter than about 7 seconds, more preferably shorter than about 5 seconds and most preferably shorter than about 3 seconds.

Powders of a variety of materials may be made according to the present invention, with the powders so produced being an important aspect of the invention.

With the present invention, these various powders may be made with very desirable attributes for a variety of applications. In that regard, the powders are typically made with a small weight average particle size, narrow particle size distribution, spheroidal particle shape, and high density relative to a theoretical density for the material of the particles. Also, the particles of the powder typically are either substantially single crystalline or are polycrystalline and with a large mean crystallite size.

With respect to particle size, the powders are characterized generally as having a weight average particle size that typically is in the range of from about 0.05 micron to about 4 microns, with most powders having a weight average size of from about 0.1 micron to about 3 microns. With the process of the present invention, however, particle size may generally be controlled to provide particles with a desired size. Particle size is varied primarily by altering the frequency of ultrasonic transducers in the aerosol generator and by altering the concentration of precursors in the liquid feed. Lower ultrasonic frequencies tend to produce larger particles, while higher frequencies tend to produce smaller particles. Also, higher precursor concentrations in the liquid feed tend to produce larger particles and lower precursor concentrations in the liquid feed tend to produce smaller particles. The particles are typically characterized as having a weight average particle size in a range having a lower limit, depending upon the application, of from about 0.1 micron, or about 0.2 micron, or about 0.3 micron, or about 0.5 micron, or about 0.8 micron, or about 1 micron; and having an upper limit, depending upon the application, of about 4 microns, or about 3 microns, or about 2.5 microns, or about 2 microns, or about 1 micron, or about 0.8 micron, or about 0.6 micron. Powders having a weight average size range defined by any combination of one of the specified upper limits and one of the specified lower limits are within the scope of the present invention, so long as the upper limit is larger than the lower limit. Some particularly preferred ranges for weight average particle size are provided below in discussions specific to certain material.

The powders are also characterized as having a narrow particle size distribution, typically with greater than about 75 weight percent, preferably greater than about 90 weight percent, and more preferably greater than about 95 weight percent of the particles in the powder having a size of smaller than two times the weight average particle size, and even more particularly smaller than about 1.5 times the weight average particle size.

The powders are also typically characterized as being comprised of spheroidal particles. In that regard, the particles are substantially spherical, in that the particles are not jagged or irregular in shape, although the particles may become faceted as the crystallite size in the particles increases. Spheroidal particles are advantageous because they typically have increased dispersibility and flowability in paste formulations relative to jagged or irregular particles.

Although in some instances the powders may be made as very porous or hollow particles, the powders are usually characterized as being very dense, with the particles typically having a density of at least about 80%, preferably at least about 90% and more preferably at least about 95%, of a theoretical density. The theoretical density is that density that particles would have assuming that the particles included zero porosity. As used herein, the density of a particle is as measured by helium pycnometry. High particle density is particularly advantageous for thick film applications involving a fired film, because higher density particles tend to exhibit reduced shrinkage during sintering than highly porous particles.

The powders are further characterized as typically having a high degree of purity, with generally no more than about 0.1 atomic percent impurities and preferably no more than about 0.01 atomic percent impurities. One significant characteristic of the powders of the present invention is that they may be made to be substantially free of organic materials, if desired, and particularly to be substantially free of surfactants. This is a significant advantage over particles made by a liquid route, which typically include residual surfactants. These residual surfactants can significantly impair the utility of the particles, especially in making thick film pastes.

As noted above, one group of powders of the present invention are metal-containing powders. The metal in the particles may include virtually any type of metal and can include both single-component metals and metal alloys. Particularly preferred metal-containing powder batches according to the present invention include at least one of palladium (Pd), silver (Ag), nickel (Ni), copper (Cu), gold (Au), platinum (Pt), molybdenum (Mo), tungsten (W), tantalum (Ta), aluminum (Al), and the like. Preferred alloys can include a Ag/Pd alloy, such as one having a Ag:Pd ratio of about 70:30.

Most preferred are metal-containing powders including at least one of palladium, silver, nickel, copper, gold and platinum, and even more particularly those including at least one of palladium, silver, nickel and copper.

The metal may be present in the particles in any convenient form, but is typically present in a metallic phase. The metallic phase may include substantially only a single metal or may include a metal alloy. The metal alloy may include any desired relative amounts of alloy constituents. When the powders include a metal alloy, the alloy is typically made by codissolving metal precursor salts in the liquid feed that is aerosolized to make the powder. Also, when reference is make herein to allows, it should be recognized that the discussion applies equally to intermetallic compounds, which are not true alloys.

These metal-containing powders are primarily used for the manufacture of electrically conductive thick film features in electronic products. These thick film features are typically made by applying a layer of a paste containing the powder to a substrate, drying the layer to remove volatile components from layer, and firing the layer to form the film. Extremely high quality powders are required for many of these microelectronic thick film applications and the presence of a significant quantities of ultrafine particles should be avoided. Therefore, when making the metal-containing powders of the present invention, care should be exercised during powder manufacture so that the vapor pressure of the metal components does not reach a detrimental level, as previously discussed.

Because of the relative importance of powders including at least one of palladium, silver, nickel, copper, gold and platinum, those particular metals will be discussed in greater detail.

Palladium-containing powders of the present invention are useful in making electrically conductive features for a variety of microelectronic devices. The powders may be used, for example, to make internal electrodes for multi-layer capacitors, conductive lines and other conductive pathways in multi-chip modules, and address electrodes for flat panel displays. One use for the palladium-containing particles is for making metallized terminations for multi-layer ceramic capacitors and other microelectronic devices.

Palladium precursors are typically palladium salts. Preferred precursors are nitrate salts. The palladium is typically present in the powders in a metallic phase, which may include substantially only palladium or may include the palladium in an alloy with one or more other metals. Alloying elements include, but are not limited to, silver (Ag), nickel (Ni), copper (Cu), platinum (Pt), molybdenum (Mo), tungsten (W), tantalum (Ta), aluminum (Al), gold (Au), indium (In), lead (Pb), tin (Sn), bismuth (Bi) and the like. Particularly preferred for alloying with palladium are silver and nickel, and particularly silver. The alloying element is typically present in the alloy in an amount of from about 0.1 to about 40 weight percent, with from about 1 to about 30 weight percent being more preferred, based on the total weight of the alloy, with the balance of the alloy typically comprising palladium.

The palladium-containing powders may have any convenient weight average particle size within the range of the invention, which will vary depending upon the application. For most applications, the weight average particle size will be in a range of from about 0.1 micron to about 2 microns. When used to make electrically conductive features in microelectronic devices, such as multi-layer ceramic capacitors or multi-chip modules, the powder preferably has a weight average particle size of from about 0.1 micron to about 0.8 micron. For use in making electrodes for flat panel displays, the particles preferably have a weight average particle size of from about 1 micron to about 3 microns. A preferred average particle size for metallized terminations for multi-layer ceramic capacitors and other microelectronic devices is from about 1 micron to about 3 microns.

Silver-containing powders of the present invention are useful in making electrically conductive features for a variety of microelectronic devices. The powders may be used, for example, to make internal electrodes for multi-layer capacitors, conductive lines and other conductive pathways in multi-chip modules, and address electrodes for flat panel displays. One significant use for the silver-containing particles is for making metallized terminations for multi-layer ceramic capacitors and other microelectronic devices. Another significant use is for use as particulate electrode materials, such as or electrochemical cells, including zinc-air cells.

Silver precursors are typically silver salts, with nitrate salts being preferred. The silver is typically present in the powders in a metallic phase, which may include substantially only silver or may include the silver in an alloy with one or more other metals. Alloying elements include, but are not limited to, palladium (Pd), nickel (Ni), copper (Cu), platinum (Pt), molybdenum (Mo), tungsten (W), tantalum (Ta), aluminum (Al), gold (Au), indium (In), lead (Pb), tin (Sn), bismuth (Bi) and the like. Particularly preferred for alloying with silver are palladium and platinum. The alloying element is typically present in the alloy in an amount of from about 0.1 to about 40 weight percent, with from about 1 to about 30 weight percent being more preferred, based on the total weight of the alloy, with the balance of the alloy typically comprising silver.

The silver-containing powders may have any convenient weight average particle size within the range of the invention, which will vary depending upon the application. For most applications, the weight average particle size will be in a range of from about 0.1 micron to about 2 microns. When used to make electrically conductive features in microelectronic devices, such as multi-layer ceramic capacitors or multi-chip modules, the powder preferably has a weight average particle size of from about 0.1 micron to about 0.8 micron. For use in making electrodes for flat panel displays, the particles preferably have a weight average particle size of from about 1 micron to about 3 microns. A preferred average particle size for metallized terminations for multi-layer ceramic capacitors and other microelectronic devices is from about 1 micron to about 3 microns.

Nickel-containing powders of the present invention are useful in making electrically conductive features for a variety of microelectronic devices. The powders may be used, for example, to make internal electrodes for multi-layer capacitors, conductive lines and other conductive pathways in multi-chip modules, and address electrodes for flat panel displays.

Precursors for making nickel-containing powders are typically nickel salts that are soluble in water, with nitrate salts being preferred. The nickel-containing powders may include the nickel in a metallic phase or a nonmetallic phase, such as in the form of nickel boride or nickel oxide. Most often, however, the nickel is in a metallic form.

When the nickel is present in a metallic phase, it may be in a phase of substantially only nickel, or it may be in the form of an alloy with one or more other metals. Alloying elements include, but are not limited to, palladium (Pd), silver (Ag), gold (Au), copper (Cu), tungsten (W), molybdenum (Mo), platinum (Pt), iron (Fe) and cobalt (Co). In one preferred embodiment, the alloying element is palladium. The alloying element is typically present in the alloy in an amount of from about 0.1 to about 40 weight percent, with from about 1 to about 15 weight percent being more preferred, based on the total weight of the alloy, with the balance of the alloy typically comprising nickel.

The nickel-containing powders may have any convenient weight average particle size within the range of the invention, which will vary depending upon the application. For most applications, the weight average particle size will be in a range of from about 0.1 micron to about 2 microns. When used to make electrically conductive features in microelectronic devices, such as multi-layer ceramic capacitors or multi-chip modules, the powder preferably has a weight average particle size of from about 0.1 micron to about 0.8 micron. For use in making electrodes for flat panel displays, the particles preferably have a weight average particle size of from about 1 micron to about 3 microns.

Copper-containing powders of the present invention are useful in making electrically conductive features for a variety of microelectronic devices. The powders may be used, for example, to make internal electrodes for multi-layer capacitors, conductive lines and other conductive pathways in multi-chip modules, and address electrodes for flat panel displays. One significant use for the copper-containing particles is for making metallized terminations for multi-layer ceramic capacitors and other microelectronic devices.

Precursors for making copper-containing powders are typically copper salts that are soluble in water, with nitrate salts being preferred. The copper is typically present in the powders in a metallic phase, which may include substantially only copper or may include the copper in an alloy with one or more other metals. Alloying elements include, but are not limited to, palladium (Pd), silver (Ag), gold (Au), nickel (Ni), tungsten (W), molybdenum (Mo), aluminum (Al), zinc (Zn), magnesium (Mg), tin (Sn), beryllium (Be) and platinum (Pt). Zinc is a particularly preferred alloying element for increasing the oxidation resistance of the copper metal. The alloying element is typically present in the alloy in an amount of from about 0.1 to about 40 weight percent, with from about 1 to about 15 weight percent being more preferred, based on the total weight of the alloy, with the balance of the alloy typically comprising copper.

The copper-containing powders may have any convenient weight average particle size within the range of the invention, which will vary depending upon the application. For most applications, the weight average particle size will be in a range of from about 0.1 micron to about 2 microns. When used to make electrically conductive features in microelectronic devices, such as multi-layer ceramic capacitors or multi-chip modules, the powder preferably has a weight average particle size of from about 0.1 micron to about 0.8 micron. For use in making electrodes for flat panel displays, the particles preferably have a weight average particle size of from about 1 micron to about 3 microns. A preferred average particle size for metallized terminations for multi-layer ceramic capacitors and other microelectronic devices is from about 1 micron to about 3 microns.

Gold-containing powders of the present invention are useful in making electrically conductive features for a variety of microelectronic devices.

Precursors used for the gold in gold-containing powders are typically water-soluble gold salts, with chloride salts being preferred. The gold is typically present in the powders in a metallic phase, which may include substantially only gold or may include the gold in an alloy with one or more other metals. Alloying elements include, but are not limited to, palladium (Pd), silver (Ag), nickel (Ni), tungsten (W), molybdenum (Mo) and platinum (Pt) Particularly preferred are alloys with platinum or palladium. The alloying element is typically present in the alloy in an amount of from about 0.1 to about 40 weight percent, with from about 1 to about 15 weight percent being more preferred, based on the total weight of the alloy, with the balance of the alloy typically comprising gold.

The gold-containing powders may have any convenient weight average particle size within the range of the invention, which will vary depending upon the application. For most applications, the weight average particle size will be in a range of from about 0.05 micron to about 2 microns. When used to make electrically conductive features in microelectronic devices, the powder preferably has a weight average particle size of from about 0.1 micron to about 1 micron.

Platinum-containing powders of the present invention are useful in making electrically conductive features for a variety of microelectronic devices.

Precursors for the platinum in the platinum-containing powders are typically water-soluble platinum compound. One preferred precursor is choroplatinic acid. The platinum is typically present in the powders in a metallic phase, which may include substantially only platinum or may include the platinum in an alloy with one or more other metals. Alloying elements include, but are not limited to, palladium (Pd), silver (Ag), nickel (Ni), copper (Cu), tungsten (W), molybdenum (Mo) and gold (Au). Particularly preferred are alloys with gold or palladium. The alloying element is typically present in the alloy in an amount of from about 0.1 to about 40 weight percent, with from about 1 to about 15 weight percent being more preferred, based on the total weight of the alloy, with the balance of the alloy typically comprising platinum.

The platinum-containing powders may have any convenient weight average particle size within the range of the invention, which will vary depending upon the application. For most applications, the weight average particle size will be in a range of from about 0.05 micron to about 2 microns. When used to make electrically conductive features in microelectronic devices, the powder preferably has a weight average particle size of from about 0.1 micron to about 1 micron.

The metal-containing particles of the present invention may include only a single material phase, which would include the noted metal. Alternatively, the metal-containing particles may be multi-phase, or composite, particles. In multi-phase particles, the metal is present in a first material phase. The particles also include a second material phase that is different than the first material phase. The multi-phase particles may, however, include more than two material phases.

Single phase particles will typically consist essentially of a single metallic phase of the metal or an alloy including the metal. Multi-phase particles also typically include a metallic phase including the metal and also include at least one other phase. Besides the metal-containing metallic phase, the other phases that may be present are other metallic phases, that are preferably substantially free of the metal, or nonmetallic phases, that are also preferably substantially free of the metal.

For many applications, whether single phase or multi-phase particles are used, the metal-containing metallic phase will frequently comprise greater than about 50 weight percent of the metal, preferably greater than about 60 weight percent of the metal, more preferably greater than about 70 weight percent of the metal, even more preferably greater than about 80 weight percent of the metal and most preferably greater than about 90 weight percent of the metal.

Multi-phase particles may be desirable for a number of reasons, including: (1) a reduction in the amount of the an expensive metal that is used in the particle to provide electrical conductivity by incorporating a second material phase that is a less expensive filler material; (2) to improve flowability of the particles in a paste and to improve resistance of particles to deformations; (3) to modify physical properties of the particles for improved compatibility with a substrate supporting a conductive film made using the particles, including modifications of the thermal coefficient of linear expansion, modification of sintering/densification characteristics, and modification of surface energy to alter wetability of the particles; and (4) to modify electrical or dielectric properties for customized electronic components. Some examples of uses of the multi-phase, metal-containing particles include use as catalysts or catalytic supports and as particles in paste formulations used in thick film applications, including manufacture of multi-layer capacitors, multi-chip components, super capacitors and other electronic components, batteries and fuel cells.

A significant aspect of the present invention is the extremely high quality, metal-containing, multi-phase particles, preferably including at least one of palladium, silver, nickel, copper, gold and platinum (and especially including at least one of palladium, silver, nickel and copper), that may be made according to the process previously described. These multi-phase powders include multi-phase particles having at least a first material phase and a second material phase. Additional material phases may be present, if desired. The first material phase includes the metal, and is typically an electrically conductive metallic phase, with the metal being in the form of the substantially pure metal or an alloy with one or more other metal. The second material phase, which is different than the first material phase, is typically substantially free of the metal.

The second material phase may be a metallic phase. When the second material phase is a metallic phase, it may be a substantially pure single metal, or may include an alloy of two or more metals. When one of palladium, silver, nickel, copper, gold and platinum is in the first material phase, one or more of the remaining of those metals may be present in the second material phase. Examples of some other metals that may be included in the second material phase include molybdenum, tungsten, tantalum, aluminum, indium, lead, tin, bismuth, and the like.

For most applications, however, the second material phase will be nonmetallic, in which case the second material phase will also typically not be electrically conductive. Preferred in a nonmetallic second material phase are a variety of ceramic materials, glass materials or other materials that would alter the sintering and/or densification characteristics of the particles. Control of sintering and/or densification characteristics of the particles is particularly important when the particles are to be used in a thick film paste for manufacture of a metal-containing film on a substrate including a ceramic layer, which is typically dielectric, to more closely match with the sintering and shrinkage characteristics of the powder particles with those of the substrate, thereby reducing the occurrence of problems such as film cracking and delamination. This is particularly important when layers are to be cofired, such as in multi-layer ceramic capacitors and multi-chip modules.

The second material phase may include an oxide material, such as oxides of zinc, tin, barium, molybdenum, manganese, vanadium, niobium, tantalum, tungsten, iron, silver, chromium, cobalt, nickel, copper, yttrium, iridium, beryllium, silicon, zirconium, aluminum, bismuth, magnesium, thorium and gadolinium. Some preferred oxides are silica, alumina, titania, zirconia, yttria, and oxides of copper, bismuth and tin. Another preferred group of oxides includes borates, titanates, silicates (including borosilicates and aluminosilicates), aluminates, niobates, zirconates and tantalates. Examples include mullite, cordierite, barium titanate, neodymium titanate, magnesium titanate, calcium titanate, strontium titanate and lead titanate. Additional materials that could be used as the second material phase include glass materials, such as glass frits and glazes. Particularly preferred are second material phases including titanates, and especially including a titanate of one or more of barium, strontium, neodymium, calcium, magnesium and lead. The titanate may be of a single metal or may be a mixed metal titanate, such as, for example $Ba_xSr_{1-x}TiO_3$. Furthermore, a variety of other ceramic materials may be used in the second material phase, such as carbides, borides and nitrides, including silicon nitride. Also, porcelain could be used in the second material phase.

The multi-phase particles of the present invention may typically be used in place of single phase metallic particles for most application, so long as the proportion of the second material phase making up the particles is small enough not to be detrimental to the application. Often, however, the use of multi-phase particles significantly enhances the performance of films made using the particles relative to the use of single phase metallic particles.

One use for the multi-phase particles of the present invention is to form a film including the metal in a metallic phase, often electrically conductive, adjacent to a layer of nonmetallic material, often dielectric. In that case, the multi-phase particles will typically include in the second phase a nonmetallic material that enhances suitability for use with the nonmetallic layer, resulting in improved compatibility and bonding between the nonmetallic layer and the electrically conductive film including the metallic phase. For many of these applications, the multi-phase metal-containing particles will include in the second material phase a nonmetallic material that is also present in an adjacent nonmetallic layer. Thus, when the nonmetallic layer is of a dielectric material, that dielectric material is also present in the second material phase. When the nonmetallic layer is a ceramic layer, for example, the multi-phase particles could include in the second phase a ceramic material that is also present in the ceramic layer. As one specific example, titanate materials are often used in the dielectric layers of multi-layer capacitors, and the metal-containing particles used to make internal electrodes for the multi-layer capacitor could include in the second material phase the same titanate that is present in the dielectric layers. Electronic devices made using the multiphase particles of the present invention, and especially multi-layer ceramic capacitors having internal electrode layers made using the particles, and the methods for making such devices are within the scope of the present invention.

Generally, for applications involving the use of multi-phase particles to form a metallic electrically conductive phase adjacent a dielectric layer, the second material phase of the particles typically comprises less than about 30 weight percent of the particles, preferably less than about 20 weight percent of the particles, and more preferably less than about 10 weight percent of the particles.

Multiphase particles having a very low content of the second material phase are generally preferred when the particles will be used to make electrically conductive features, because the second material phase is typically dielectric and reduces electrical conductivity. In many instances, therefore, and especially those including silica, alumina or a titanate as the second material phase, the second material phase typically comprises less than about 10 weight percent of the particles, more preferably less than about 5 weight percent of the particles, and even more preferably less than about 2 weight percent of the particles; but the second material phase will typically be at least about 0.1 weight percent, and preferably at least about 0.5 weight percent, of the particles. In this way, enhanced compatibility between the dielectric layer and the electrically conductive film may be accomplished without significant detrimental impact to electrical conductivity. Also, the use of the multiphase particles to make electrically conductive films will typically result in improved adhesion for better bonding with the dielectric layer, thereby reducing the potential for delaminations.

One particularly preferred powder of multi-phase particles includes a metallic first material phase, which is preferably electrically conductive, and a second material phase including a ceramic material of at least one of silica, alumina, zirconia and titania, with the second material phase preferably being dielectric. Preferred as the first material phase is a metallic phase including at least one of palladium, silver, nickel, copper, gold and platinum. Especially preferred in the first material phase is at least one of palladium, silver, nickel and copper. When the second material phase comprises silica or alumina, the powder will typically include the first material phase as the predominant phase, especially when the particles are designed for use to make electrically conductive thick film features. When the second material phase includes zirconia or titania, however, the second material phase may be the predominant phase, especially when the particles are designed for use as catalysts.

Another particularly preferred powder of the present invention including multi-phase particles includes an electrically conductive metallic first material phase, typically as the predominant phase, and a second material phase including a titanate. Preferably, the titanate is of one or more of barium, strontium, neodymium, calcium, magnesium and lead. The first material phase preferably includes one or more of palladium, silver, nickel, copper, gold and platinum, and especially one or more of palladium, silver, nickel and copper.

Yet another particularly preferred powder of multi-phase particles includes the metallic first phase and a second phase including carbon. The carbon is typically an electrically conductive form of carbon, such as in the form of graphite or carbon black. The metallic phase preferably includes one or more of palladium, silver, nickel, copper, gold and platinum. The particles typically include the second material phase as the predominant phase. The first material phase typically is used as a catalyst. These multi-phase particles are particularly well suited for use as catalysts and, depending upon the metal, electrode materials, and especially as electrode materials in electrochemical cells. These multi-phase powders may also be advantageously used as conductive filler particles in electrically conductive adhesive formulations. One preferred powder includes silver as the metallic phase, especially for use as a cathode material for zinc-air batteries or for fuel cells. Another preferred powder includes platinum, especially for use as cathode material for fuel cells. For most applications, the powder less than about 20 weight percent of the first material phase and preferably less than about 10 weight percent of the first material phase. The particles will, however, typically include at least about 1 weight percent of the first material phase, preferably at least 2 weight percent of the first material phase and more preferably at least about 5 weight percent of the first material phase. Particularly preferred is for the powder to include from about 5 weight percent to about 10 weight percent of the first material phase, and especially about 7 weight percent of the first material phase.

Figure 45:
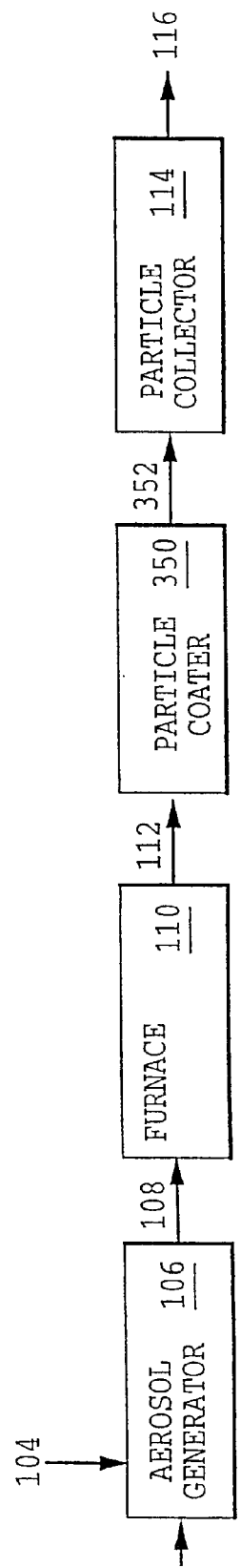
FIG. 45 is a process block diagram of one embodiment of the present invention including a particle coater.
Figure 46:
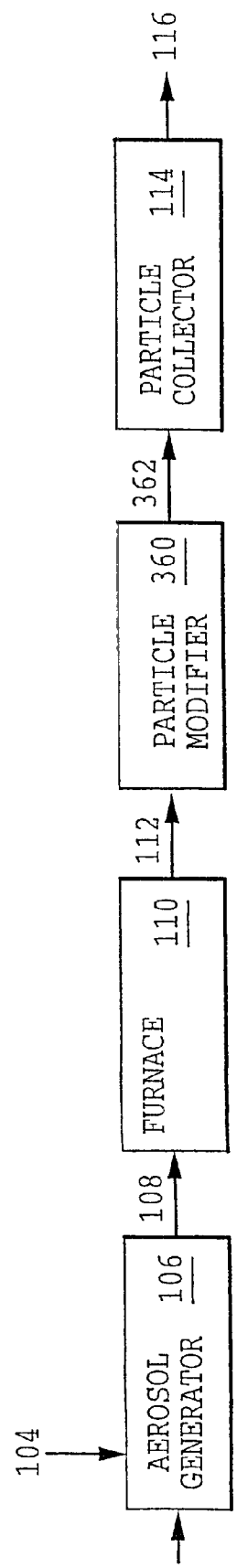
FIG. 46 is a block diagram of one embodiment of the present invention including a particle modifier.

A number of different variations of the process of the present invention are possible for making the multi-phase particles. In one embodiment, a metal-containing precursor for the first material phase and a second precursor for the second material phase may both be included in the liquid feed 102 (referring back to FIGS. 1–49 and the discussion relating thereto). In such a case, both precursors could be in solution in a flowable liquid of the liquid feed 102. Alternatively, one or both of the precursors could be particles suspended in the flowable liquid. Also, it is possible that the liquid feed 102 could include more than two precursors for the multi-phase particles. In another embodiment, the metal-containing precursor could initially be in the liquid feed 102, which is then processed in aerosol form in the furnace 110 to prepare metal-containing precursor particles. The precursor particles are then coated with the second material phase in a separate step, in a manner similar to that described previously with reference to FIG. 45. This two-step process of initially preparing metal-containing precursor particles and then coating the precursor particles on the fly in an aerosol state is particularly advantageous because problems are avoided that are encountered in particle manufacture procedures, such as liquid route precipitation, in which precursor particles would have to be collected and then redispersed prior to coating. Not only is collection and redispersion cumbersome, but problems are often encountered due to particle agglomeration, which is avoided with the on-the-fly coating of the present invention. Avoidance of particle agglomeration is very Important when a uniform particle coating is desired.

As noted previously, the multi-phase particles of the present invention may include a variety of particle morphologies. With reference again to FIG. 47, the multi-phase particles may include an intimate mixture of the first material phase and the second material phase, as in the multi-phase particle 500. Typically, with such an intimate mixture, the first material phase is a continuous phase throughout which the second material phase is dispersed. Another possible morphology is for the first material phase to be in the form of a large core that is covered by a thin coating layer of the second material phase, as shown for particles 502 and 504 in FIG. 47. Whether such coatings form a smooth coating, such as shown in particle 502, or a rough and bumpy coating, such as shown in particle 504, will depend upon the wetability characteristics of the first and second material phases and the conditions under which the materials are processed, and especially the processing temperature. For example, in gas-to-particle conversion processes, higher temperatures during the coating operation tends to result in smoother, more continuous coatings. The multi-phase particles could also include a small core of one material phase surrounded by a thick layer of the other material phase, as shown for particle 506. Also, the first and second material phase could completely segregate in a manner shown for particle 508. Furthermore, the multi-phase particles are not limited to two material phases. For example, particle 510 in FIG. 47 shows a multi-phase particle including a core of second material phase domains dispersed in a matrix of the first material phase, and with the core being coated by a third material phase.

Figure 47:
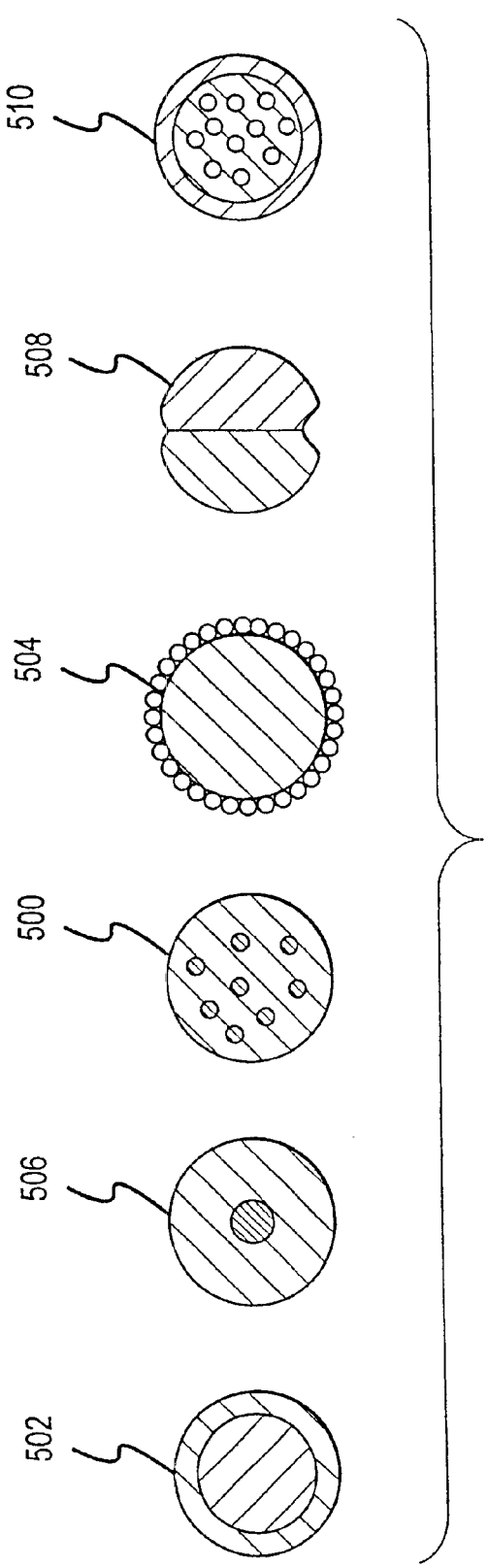
FIG. 47 shows cross sections of various particle morphologies of some composite particles manufacturable according to the present invention.

With continued reference to FIG. 47, it should be noted that the first material phase and the second material phase could constitute any of the phases in particles 500, 502, 504, 506, 508 and 510. For most applications, however, the first material phase, which includes the metal, will be the more abundant phase, and the second material phase will be the less abundant phase.

In the case of coated particles, the second material phase will often be in the form of a coating around a core including the first material phase. In the case of catalyst materials, however, the first material phase may be a coating or a disperse phase on the surface of a support of the second material phase. For particles including intimate mixtures of the two phases, the first material phase will typically be the continuous phase and the second material phase will typically be the disperse phase.

For most applications, the multi-phase particles will include greater than about 50 weight percent of the first material phase, more preferably greater than about 60 weight percent of the first material phase, even more preferably greater than about 70 weight percent of the first material phase and most preferably greater than about 80 weight percent of the first material phase. In the case of multi-phase particles including thin coating layers of the second material phase, the first material phase may comprise 90 weight percent or more of the particles. Conversely, the second material phase typically will comprise less than about 50 weight percent of the multi-phase particles, preferably less than about 40 weight percent, more preferably less than about 30 weight percent and even more preferably less than about 20 weight percent. In the case of thin coatings of the second material phase, the second material phase may comprise 10 percent or less of the particles. Even in the case of coated particles, however, the second material phase will typically comprise greater than about 0.5 weight percent, and preferably greater than about 1 weight percent, of the particles.

Because most applications for multi-phase particles of the present invention include the use of either a particle including the first material phase in a large core surrounded by a thin coating of the second material phase or an intimate mixture of the first material phase as a continuous phase with the second material as a disperse phase, those particular situations will now be discussed below in greater detail.

One preferred class of multi-phase particles are coated particles in which the first material phase forms a core and the second material phase forms a thin coating layer about the outer surface of the core. The second material phase may include any of the materials previously listed as being suitable for the second material phase.

With the present invention, the coating including the second material phase may be made as a relatively uniform layer that substantially entirely covers the core of the first material phase. One method for making multi-phase particles including the second material phase as a uniform coating is as described previously with reference to FIG. 45. In that regard, the second material phase is typically formed on a precursor particle, which includes the first material phase, by techniques as previously described. A preferred coating technique is CVD. CVD is a well known deposition technique in which a precursor for the second material phase is reacted in the vapor phase to form the second material phase. Generally, precursors for CVD are metal-containing compounds, for example, inorganic compounds, metal organics and organometallics. Examples of some vapor phase precursors for CVD of inorganic coatings include silanes, metal formates, metal acetates, metal oxalates, metal carboxylates, metal alkyls, metal aryls, metal alkoxides, metal ketonates (especially beta-diketonates), metal amides, metal hydrides, metal oxyhalides, and metal halides (especially metal chlorides and metal bromides). For example, to deposit a coating of silica, a vaporous silane precursor, such as silicon tetrachloride, may be decomposed and converted to silica at elevated temperature in the presence of oxygen or water vapor, with the silica then depositing on the surface of metal-containing precursor particles.

Typically, a coating deposited by CVD or by PVD will result in an average coating thickness of from about 10 nanometers to about 200 nanometers. Preferred coatings have an average thickness of thinner than about 100 nanometers, more preferably thinner than about 50 nanometers and most preferably thinner than about 25 nanometers.

Applications for coated multi-phase particles include the manufacture of electrically conductive films for electronic devices, such as multi-layer capacitors and multi-chip modules. In the case of many coatings such as silica, the coating is useful to beneficially alter the sintering and/or shrinkage characteristics of the particle for improved compatibility with a ceramic substrate.

Another way to make coated multi-phase particles is to provide precursors for both the first material phase and the second material phase in the feed liquid 102 (as described with respect to FIGS. 1–49). As noted previously, each precursor in the feed liquid 102 could be either in the liquid phase, e.g., in solution in a flowable liquid, or in the form of particles suspended by the flowable liquid. The multi-phase particles would then form in the furnace 110 as liquid is removed from aerosol droplets. It should be noted that, in the case of multiple phases forming simultaneously in the furnace, the different phases are typically initially formed as an intimate mixture of the phases. Generally, higher processing temperatures and longer residence times will result in redistribution of the material phases to the desired morphology of a coating of one material phase about a core of the other material phase, assuming that the two material phases have the proper wetability characteristics. Alternatively, it is possible that redistribution of the phases could result in complete segregation of the phases, as shown by the multi-phase particles 508 in FIG. 47. When redistribution of the material phases is desired to form a coated particle morphology, a processing embodiment such as that described previously with reference to FIG. 46 may be advantageous.

When making coated particles with precursors for both the first material phase and the second material phase in the liquid feed 102, a first precursor for the metal-containing first material phase could comprise preformed metal-containing particles to be coated. The precursor for the second material phase could also be in particulate form, or could be in solution in a liquid phase. For example, a soluble precursor, such as from dissolution of a metal alkoxide could be used as a precursor for the second material phase. In the case of metal alkoxides, it should be recognized that in aqueous solution the dissolved metal alkoxide usually reacts to form other soluble components, which will function as a soluble precursor. This could be the case in the preparation of particles including titania or alumina as the second material phase. In the case of silica as the second material phase, the precursor will typically be small silica particles, which are preferably of colloidal size, or silica dissolved in solution.

The manufacture of multi-phase particles with an intimately mixed morphology for the different material phases is typically accomplished by initially including a precursor for both the first material phase and the second material phase in a liquid feed 102, as previously described. As noted, the process may be substantially the same as the process used to prepare particles with a coating morphology, except the processing conditions may be altered so that the material phases do not redistribute, and are instead retained in an intimately mixed state. Generally, lower operating temperatures in the furnace 110 and shorter residence times, with rapid particle cooling, promote an intimate mixture of the phases.

Multi-phase particles of an intimately mixed morphology are particularly useful for modifying sintering/densification temperatures of the particle, reducing shrinkage that occurs during firing in thick film applications, and modifying the electrical or other properties of the particle for special applications.

Another preferred group of powders of the present invention include phosphor particles. Phosphors are materials which are capable of emitting radiation in the visible or ultraviolet spectral range upon excitation, such as excitation by an external electric field or other external energy source. Phosphors include a matrix compound, referred to as a host material, and the phosphor typically further includes one or more dopants, referred to as activator ions, to emit a specific color or to enhance the luminescence characteristics.

Particular phosphor compounds may be preferred for certain applications and no single phosphor compound is necessarily preferred for all possible applications. However, preferred phosphor host materials for some display applications include the Group II sulfides (e.g., CaS, SrS, BaS, MgS, $Mg_xSr_{1-x}S$ and $Ca_xSr_{1-x}S$) and the Group XII sulfides (e.g., ZnS, CdS and $Zn_xCd_{1-x}S$). Among these, ZnS is particularly preferred for many display applications, particularly those utilizing high voltages (i.e. greater than about 2000 volts), due primarily to the high brightness of ZnS. ZnS is typically doped with Cu, Ag, Al, Au, Cl or mixtures thereof. For example, $ZnS:Ag^{+1}$ is a common phosphor used to produce blue light in a CRT device.

Among the oxides, $Y_2O_3$ doped with $Eu^{3+}$ ($Y_2O_3:Eu^{3+}$) is often preferred for emitting red light. $BaMgAl_{11}O_{17}:Eu^{2+}$ ($BAM:Eu^{2+}$) is also a common oxide for producing red light. Other compounds that would be useful if available include $SrGa_2S_4:Eu^{2+}$, $SrGa_2S_4:Ce^{3+}$, $CaGa_2S_4:Eu^{2+}$ and $CaGa_2S_4:Ce^{3+}$. Preferred phosphor host compounds and activators for particular applications are discussed in more detail hereinbelow.

TABLE I

Examples of Phosphor Materials

| Host Material | Activator Ion | Color |
| --- | --- | --- |
| BaS | Ce | Yellow |
| CaS | Ce | Green |
| CaS | Mn | Yellow |
| SrS | Ce | Blue-Green |
| $Mg_xSr_{1-x}S$ | Ce | Blue-Green |
| ZnS | Cu | Blue-Green |
| BAM | Eu | Blue |
| ZnO | Zn | Green |
| $Y_2O_3$ | Eu | Red |
| $(Ce, Gd)MgB_5O_{10}$ | Tb | Green |
| $Y_2O_2S$ | Eu | Red |

The powder characteristics that are preferred will depend upon the application of the phosphor powders. Nonetheless, it can be generally stated that the powders should usually have a small particle size, narrow size distribution, spherical morphology, high density/low porosity, high crystallinity and homogenous dopant distribution. The efficiency of the phosphor, defined as the overall conversion of excitation energy to visible photons, should be high.

For most phosphor applications, the average particle size is more preferably from about 0.1 micron to about 4 microns and even more preferably is from about 0.5 micron to about 2 microns. The phosphor particles producible according to the present invention can be substantially single crystal particles or may be comprised of a number of crystallites. It is possible according to the present invention to produce phosphor particles having large crystallites. Crystallite size can be determined from the width of the x-ray diffraction peaks of the material. Large crystallites give rise to sharp peaks, while the peak width increases as crystallite size decreases.

It is preferred that the average crystallite size within the particles is at least about 50 nanometers and more preferably is at least about 100 nanometers. The average crystallite size most preferably approaches the average particle size such that the particles are mostly single crystals. Preferably, the average crystallite size is at least about 50 percent and more preferably at least about 80 percent of the average particle size. Highly crystalline phosphors (i.e. large crystallite size) are believed to have increased efficiency as compared to phosphors with smaller crystallites.

The phosphor particles producible according to the present invention advantageously have a high degree of purity, that is, a low level of impurities. Impurities are those materials that are not intended in the final product—thus, an activator ion is not considered an impurity. The level of impurities in the phosphor powders of the present invention is preferably less than about 0.1 weight percent and is more preferably less than about 0.01 weight percent. Further, the activator ion is homogeneously dispersed throughout the host material.

The particles of the present invention are also substantially spherical in shape. Spherical particles are particularly advantageous because they are able to disperse and coat a device more uniformly. As a result, the phosphor powder batch of the present invention is substantially non-agglomerated and has good dispersibility in a variety of media.

It is often advantageous to provide phosphor particles with a coating on the outer surface thereof. Coatings are often desirable to reduce degradation of the phosphor material due to moisture or other influences such as the plasma in a plasma display device or electron bombardment in cathodoluminescent devices. For example, metal sulfides such as ZnS are particularly susceptible to degradation due to moisture and should be completely encapsulated to reduce or eliminate the degradation reaction. Other phosphors are known to degrade in an electron beam operating at a high current density, such as in field emission displays and CRT's.

Preferred coatings include metal oxides such as $SiO_2$, MgO, $Al_2O_3$, $SnO_2$ or $In_2O_3$. Semiconductive oxide coatings such as SnO or $In_2O_3$ can advantageously absorb secondary electrons that are often emitted by the phosphor. The coatings can be either particulate coatings or non-particulate (film) coatings. The coatings should be relatively thin and uniform. Preferably, the coating has an average thickness of less than about 1 micron and more preferably the average coating thickness is from about 5 nanometers to about 100 nanometers. Further, the particles can include more than one coating substantially encapsulating the particles to achieve the desired properties.

In addition, the phosphor particles can include organic coatings such as PMMA (polymethylmethacrylate), polystyrene or the like. The organic coating should be on the order of 1 to 100 nanometers thick and be substantially dense and continuous about the particle. Such coatings can be formed after the powders are prepared by a liquid phase process. The organic coatings can advantageously prevent corrosion of the phosphor particles especially in electroluminiscent lamps and also can improve the dispersion characteristics of the particles.

The coating can also be a monolayer coating formed by the reaction of an organic or an inorganic molecule with the surface of the phosphor particles to form a coating that is essentially one molecular layer thick. In particular, the formation of a monolayer coating by reaction of the surface of the phosphor powder with a functionalized organo silane such as halo- or amino-silanes, for example hexamethyldisilazane or trimethylsilylchloride, can be used to modify/control the hydrophobicity and hydrophilicity of the phosphor powders. Such coatings allow for greater control over the dispersion characteristics of the phosphor powder in a wide variety of paste compositions.

The monolayer coatings may also be applied to phosphor powders that have already been coated with, for example, 1–100 nanometer organic or inorganic coatings thus providing better control over the corrosion characteristics (through the use of thicker coating) as well as dispersibility (through the monolayer coating) of the phosphor powder.

More specifically, doped metal sulfide phosphors (MS:M') can be prepared from an aqueous solution by the reaction of a metal carbonate (or oxide or hydroxide) with thiourea or a sulfur-containing acid such as thioacetic acid or thiocarboxylic acid (HS(O)CR) forming a water soluble complex, such as $M(S(O)CR)_2 \cdot xH_2O$. Preferably, at least about 2 equivalents of acid are added to ensure complete reaction with the metal compound. The solution, when pyrolyzed under $N_2$, leads to the metal sulfide.

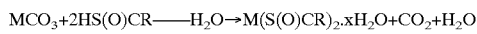

$MCO_3 + 2HS(O)CR \longrightarrow H_2O \rightarrow M(S(O)CR)_2 \cdot xH_2O + CO_2 + H_2O$

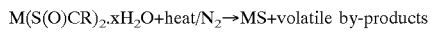

$M(S(O)CR)_2 \cdot xH_2O + heat/N_2 \rightarrow MS + \text{volatile by-products}$ The solution preferably has a phosphor precursor concentration that is unsaturated to avoid the formation of precipitates and preferably includes from about 1 to about 50 weight percent of the precursor. Preferably the solvent is aqueous-based for ease of operation, although other solvents, such as toluene, may be desirable for specific materials. The use of organic solvents can lead to undesirable carbon concentration in the phosphor particles. The pH of the aqueous-based solutions can be adjusted to alter the solubility characteristics of the precursor in the solution.

The maximum average stream temperature in the furnace when making phosphor powders are typically in a range of from about 500° C. to about 1800° C., depending upon the phosphor that is being produced.

While particles initially produced by the furnace have good crystallinity, it may be desirable to increase the crystallinity after production. Thus, the powders can be heated for varying amounts of time and in different environments to increase the crystallinity of the phosphor. Increased crystallinity will lead to increased brightness and efficiency of the phosphor. If such annealing steps are performed, the annealing temperature and time should be selected to minimize the amount of interparticle sintering that is often associated with annealing. For example, yttria-based phosphors annealed at 1400° C. under air for 58 hours can advantageously increase in brightness intensity by 160 percent or more due to an increase in the crystallite size.

Further, the crystallinity of the phosphors can be increased by using a fluxing agent, either in the precursor solution or in a post-formation annealing step. A fluxing agent is a reagent which improves the crystallinity of the material when the reagent and the material are heated together as compared to heating the material to the same temperature and for the same amount of time in the absence of the fluxing agent. The fluxing agent, for example alkali metal halides such as NaCl or KCl, can be added to the precursor solution where it improves the crystallinity of the particles during their subsequent formation. Alternatively, the fluxing agent can be added to the phosphor powder batches after they have been collected. Upon annealing, the fluxing agent improves the crystallinity of the phosphor powder, and therefore improves the brightness of the phosphor powder.

As is discussed above, it may be desirable to form phosphor particles with coatings thereon to enhance the stability or other properties of the phosphor powders. The phosphor powders of the present invention can be coated using several different methods. For example, a colloidal phosphor powder and a soluble, involatile molecular precursor to the coating can be suspended in the droplets so that the coating forms around the phosphor when passed through the heating zone of the furnace. Alternatively, a soluble precursor to both the phosphor powder and the coating can be used in the precursor solution wherein the coating precursor is involatile (e.g. $Al(NO_3)_3$) or volatile (e.g., $Sn(OAc)_4$) In another method, a colloidal precursor and a soluble phosphor precursor can be used to form a particulate colloidal coating on the phosphor.

In yet another coating method, a volatile coating precursor or precursor solution is sprayed into the furnace after a point where the phosphor particles have already been formed. The precursor reacts to form a coating on the phosphor particle surface. These coatings can be generated by two different mechanisms. First, the precursor can vaporize and diffuse to the hot particle surface and thermally react resulting in the formation of a thin-film by chemical vapor deposition (CVD). Alternatively, the gaseous precursor can react in the gas phase forming small particles (e.g. less than about 5 nanometers) which can then diffuse to the particle surface and sinter onto the surface forming a coating. This reaction mechanism is referred to as gas to particle conversion (GPC).

In addition, a volatile coating material, such as PbO, $MoO_3$ or $V_2O_5$, can be introduced into the reactor such that the coating deposits on the particle by condensation.

An additional heating zone, such as a second elongated tubular furnace, can be added after the main furnace, but before the quench system, to coat the phosphor particles with the desired coating.

EXAMPLES

The following examples are provided to aid in understanding of the present invention, and are not intended to in any way limit the scope of the present invention.

Example 1

This example demonstrates preparation of multi-phase particles of either neodymium titanate or barium titanate with various metals.

A titanate precursor solution is prepared for each of barium titanate and neodymium titanate. The barium titanate precursor solution is prepared by dissolving barium nitrate in water and then, with rapid stirring, adding titanium tetraisopropoxide. A fine precipitate is formed. Sufficient nitric acid is added to completely dissolve the precipitate. Precursor solutions of various metals are prepared by dissolving the metal salt in water. The neodymium titanate precursor solution is prepared in the same way except using neodymium nitrate.

The titanate precursor solution and the metal precursor solution are mixed in various relative quantities to obtain the desired relative quantities of titanate and metal components in the final particles. The mixed solutions are aerosolized in an ultrasonic aerosol generator with transducers operated at 1.6 MHz and the aerosol is sent to a furnace where droplets in the aerosol are pyrolyzed to form the desired multi-phase particles. Air or nitrogen is used as a carrier gas, with tests involving copper and nickel also including hydrogen in an amount of 2.8 volume percent of the carrier gas.

Results are summarized in Table 2.

Example 2

A variety of materials are made according to the process of the present invention, with some materials being made with and some being made without droplet classification prior to the furnace. Various single phase and multi-phase (or composite) particles are made as well as several coated particles. Tables 3 through 8 tabulate various of these materials and conditions of manufacture.

TABLE 2

| Composite | Metal Precursor (s) | Temperature ° C. | Carrier Gas |
|---|---|---|---|
| 75/25 Pd/BaTiO$_3$ | nitrate | 1000 | N$_2$ |
| Ag:Pd/BaTiO$_3$[1] | nitrate | 600–1100 | air |
| 75/25 Ag:Pd/BaTiO$_3$ | nitrate | 1000 | air |
| 75/25 Ni/BaTiO$_3$ | nitrate | 1200 | N$_2$ + H$_2$ |
| 75/25 Ni/Ne$_2$TiO$_7$ | nitrate | 1200 | N$_2$ + H$_2$ |
| 75/25 Cu/BaTiO$_3$ | nitrate | 1200 | N$_2$ + H$_2$ |
| 75/25 Cu/BaTiO$_7$ | nitrate | 1200 | N$_2$ + H$_2$ |
| 50/50 Pt/BaTiO$_3$ | chloroplatinic acid | 1100 | air |

[1]70:30 Ag:Pd alloy, BaTiO3 varied from 5 to 90 weight percent of the composite.
[2]30:70 Ag:Pd alloy.

TABLE 3

Phosphors

| Material | Precursor[4] | Reactor Temp ° C. | Carrier Gas |
|---|---|---|---|
| Y$_2$O$_3$:Eu dopant | Yttrium nitrate, chloride or acetate and europium nitrate[1] [2] | 500–1100 | Air |
| CaTiO$_3$ | Titanium tetraisopropoxide and calcium nitrate[1] | 600–800 | Air, N$_2$, O$_2$ |
| CaTiO$_3$ | "Tyzor"[3] and calcium nitrateitanium tetraisoperoxide and calcium nitrate[1] | 600–800 | Air, N$_2$, O$_2$ |
| CaS | Calcium carbonate and thioacetic acid, various dopants as metal salts[1] | 800–1100 | N$_2$ |
| MgS | Magnesium carbonate and thioacetic acid, various dopants as metal salts[1] | 800–1100 | N$_2$ |
| SrS | Strontium carbonate and thioacetic acid, various dopants as metal salts[1] | 800–1100 | N$_2$ |
| BaS | Barium carbonate and thioacetic acid, various dopants as metal salts[1] | 800–1100 | N$_2$ |
| ZnS | Zinc nitrate and thiourea, various dopants as metal salts[1] | 800–950 | N$_2$ |
| ZnS | Zinc nitrate and thiourea, MnCl$_2$ as dopant[1] | 950 | N$_2$ |
| Ca$_x$Sr$_{1-x}$S | Metal carbonates or hydroxides and thioacetic acid, various dopants as metal salts[1] | 800–1100 | N$_2$ |
| Mg$_x$Sr$_{1-x}$S | Metal carbonates or hydroxides and thioacetic acid, various dopants as metal salts[1] | 800–1100 | N$_2$ |
| ZnS | Zn$_x$(OH)$_y$(CO3)$_z$ particles in colloidal suspension, various dopants as metal salts, thioacetic acid | 800–950 | N$_2$ |
| ZnO:Zn[4] | Zinc nitrate[1] | 700–900 | N$_2$ + H$_2$ Mixture |

[1]In aqueous solution
[2]Urea addition improves densification of particles
[3]Metal organic sold by DuPont
[4]Some Zn reduced to Zn during manufacture, the amount of reduction being controllable.

TABLE 4

Pure Metals

| Material | Precursor | Temperature ° C. | Carrier Gas |
|---|---|---|---|
| Pd | nitrate | 900–1500 | N$_2$ |
| Ag | nitrate | 900–1400 | air |
| Ni | nitrate | 700–1400 | N$_2$ + H$_2$ |
| Cu | nitrate | 700–1400 | N$_2$ + H$_2$ |
| Pt | chloroplatinic acid (H$_2$PtCl$_6$.H$_2$O) | 900–1500 | air |
| Au | chloride | 500–1100 | air |

TABLE 5

Metal Alloys

| Material | Precursors | Temperature ° C. | Carrier Gas |
|---|---|---|---|
| 70/30 Pd/Ag | nitrates | 900–1400 | N$_2$ |
| 70/30 Ag/Pd | nitrates | 900–1500 | N$_2$ |
| 50/50 Ni/Cu | nitrates | 1100 | N$_2$ + H$_2$ |
| 50/50 Cu/Ni | nitrates | 1200 | N$_2$ + H$_2$ |
| 70/30 Cu/Zn | nitrates | 1000 | N$_2$ + H$_2$ |
| 90/10 Cu/Sn | nitrates | 1000 | N$_2$ + H$_2$ |
| 50/50 Pt/Pd | chloroplatinic acid palladium nitrate | 1100 | N$_2$ |

TABLE 6

Coated Particles

| Material | Core Precursor(s) | Coating Precursor(s) | Coating Method | Reactor Temp °C. | Carrier Gas |
|---|---|---|---|---|---|
| PbO coating on $Fe_3O_4$ core | iron sulfate in aqueous solution | $Pb(NO_3)_2$ in aqueous solution | PVD | 900 | $H_2 + N_2$ mixture |
| Pb coating on $Fe_2O_4$ core | iron sulfate in aqueous solution | lead nitrate in aqueous solution | PVD | 900 | $H_2 + N_2$ mixture |
| PbO coating on $RuO_2$ core | Ruthenium nitrosyl nitrate in aqueous solution | $Pb(NO_3)_2$ in aqueous solution | PVD | 1100 | $N_2$ |
| MgO coating on $Bi_2Ru_2O_{7.3}$ core | Bismuth and ruthenium nitrates in aqueous solution | Magnesium acetate in aqueous solution | CVD | 800 | $O_2$ |
| $SiO_2$ coating on Pd core | Palladium nitrate in aqueous solution | $SiCl_4$ | CVD | 1100–1300 | $N_2$ |
| $TiO_2$ coating on Pd core | Palladium nitrate in aqueous solution | $TiCl_4$ | CVD | 1100–1300 | $N_2$ |

TABLE 7

Composites

| Material | Precursor(s) | Reactor Temp[c] | Carrier Gas |
|---|---|---|---|
| $PbO/Fe_3O_4$ | Colloidal suspension of $Fe_3O_4$ particles in aqueous solution of $Pb(NO_3)_2$ | 500–800 | Air |
| $Pd/SiO_2$[1] | 60 nm $SiO_2$ particles suspended in aqueous solution of $Pb(NO_3)_2$ | 900–1100 | $N_2$ |
| $Pd/SiO_2$[2] | 200 nm $SiO_2$ particles suspended in aqueous solution of $Pb(NO_3)_2$ | 1100 | $N_2$ |
| $Pd/BaTiO_3$ | $Pd(NO_3)_1$ $Ba(NO_3)_2$ and $Ti(NO_3)_4$ in aqueous solution | 1100 | $N_2$ |
| $Pd/TiO_2$[4] | $Pd(NO_3)_2$ and $Ti(OiPr)_4$[3] in aqueous solution | 1100 | $N_2$ |
| $Pd/Al_2O_3$[6] | $Pd(NO_3)_2$ and $Al(OsecBu)_2$[5] in aqueous solution | 1100 | $N_2$ |
| $Pd/TiO_2$[7] | $PdNO_3$ in aqueous solution slurried with 0.25 micron $TiO_2$ particles | 1100 | $N_2$ |
| $Ag/TiO_2$[8] | $Ag(NO_3)_2$ aqueous solution with suspended 0.25 micron $TiO_2$ particles | 900 | $N_2$ |
| $Pt/TiO_2$[9] | $K_2PtCl_4$ aqueous solution with suspended 0.25 micron $TiO_2$ particles | 1100 | $N_2$ |
| $Ag/TiO_2$[10] | $AgNO3$ aqueous solution with colloidal $TiO_2$ particles | 900 | $N_2$ |
| $Au/TiO_2$[11] | Colloidal Au and $TiO_2$ particles in aqueous liquid. | 900 | $N_2$ |

[1]Morphology of particles changes from intimately mixed $Pd/SiO_2$ to $SiO_2$ coating over Pd as reactor temperature is increased.
[2]Coating of Pd on $SiO_2$ particles.
[3]Titanium tetraisopropoxide.
[4]Metal dispersed on high surface area $TiO_2$ support.
[5]Al[OCH $(CH_3)C_2H_5]_3$.
[6]Metal dispersed on high surface area $Al_2O_3$ support.
[7]Pd coating on $TiO_2$ particles.
[8]Ag coating on $TiO_2$ particles.
[9]Pt coating on $TiO_2$ particles.
[10]$TiO_2$ coating on Ag particles.
[11]$TiO_2$ coating on Au particles.

While various specific embodiments of the process of the present invention and the apparatus of the present invention for preparing powders are described in detail, it should be recognized that the features described with respect to each embodiment may be combined, in any combination, with features described in any other embodiment, to the extent that the features are compatible. For example, any or all of the aerosol concentrator, aerosol classifier, particle cooler, particle coater, particle modifier and other described process/apparatus components may be incorporated into the apparatus and/or process of the present invention. Also, additional apparatus and/or process steps may be incorporated to the extent they do not substantially interfere with operation of the process of the present invention or the apparatus useful therefor.

Also, while various embodiments of the present invention have been described in detail, it is apparent that modifications and adaptations to those embodiments will occur to those skilled in the art. It is to be expressly understood, however, that such modifications and adaptations are within the scope of the present invention, as set forth in the claims below. Further, it should be recognized that any feature of any embodiment disclosed herein can be combined with any other feature of any other embodiment in any combination.

What is claimed is:

1. A particulate product comprising multi-phase particles including at least two different material phases, a first material phase being metallic, and comprising as a first component a metal in a metallic form, a second material phase being nonmetallic and and comprising as a second component elemental carbon, the particulate product characterized in that said multi-phase particles have a weight average particle size of from about 0.1 micron to about 4 microns and said multi-phase particles comprise a third component that is different than the metal and the carbon.

2. The particulate product of claim 1, wherein said metallic first material phase comprises a metallic form of at least one of palladium, silver, nickel, copper, gold and platinum.

3. The particulate product of claim 1, wherein said metallic first material phase comprises a metallic form of at least one of palladium, silver, nickel and copper.

4. The particulate product of claim 1, wherein said multi-phase particles, as manufactured, are substantially free of organic contaminants.

5. The particulate product of claim 1, wherein said multi-phase particles, as manufactured, are substantially free of surfactants.

6. The particulate product of claim 1, wherein said multi-phase particles having been made in an aerosol state by pyrolysis.

7. The particulate product of claim 1, wherein said multi-phase particles comprise less than about 20 weight percent of said first material phase and greater than about 80 weight percent of said second material phase.

8. The particulate product of claim 1 wherein said multi-phase particles comprise less than about 10 weight percent of said first material phase and greater than about 90 weight percent second material phase.

9. The particulate product of claim 1, wherein said multi-phase particles comprise greater than about 1 weight percent of said first material phase.

10. The particulate product of claim 1, wherein said multi-phase particles have a weight average particle size of from about 0.1 micron to about 1 micron.

11. The particulate product of claim 1, wherein said multi-phase particles have a size distribution such that at least about 90 weight percent of said multi-phase particles are smaller than twice said weight average particle size.

12. The particulate product of claim 1, wherein said multi-phase particles have a weight average particle size of from about 1.0 micron to about 4 microns.

13. The particulate product of claim 1, wherein said multi-phase particles have a weight average particle size of from about 0.5 micron to about 2 microns.

14. The particulate produce of claim 1, wherein the first material phase is formed by gas-to-particle conversion on precursor particles comprising the second material phase.

15. The particulate produce of claim 1, wherein the first material phase is formed by chemical vapor deposition on precursor particles comprising the second material phase.

16. The particulate produce of claim 1, wherein the first material phase is formed by physical vapor deposition on precursor particles comprising the second material phase.

17. The particulate product of claim 1, wherein said multi-phase particles are of spheroidal shape.

18. The particulate product of claim 1, wherein said multi-phase particles have a size distribution such that at least about 75 weight percent of said multi-phase particles are smaller than twice said weight average particle size.

19. The particulate product of claim 1, wherein said multi-phase particles comprise at least about 2 weight percent of said first material phase.

20. The particulate product of claim 1, wherein said multi-phase particles comprise at least about 5 weight percent of said first material phase.

21. The particulate product of any one of claims 1, 4, 5, 6, 12, 17 18 and 20, wherein said metal is platinum.

22. The particulate product of claim 21, wherein said platinum is a first metal and said first material phase further comprises the third component, the third component being a second metal that is different than said first metal.

23. The particulate product of claim 22, wherein said first metal and said second metal are in the form of an alloy.

24. The particulate product of claim 22, wherein said second metal is selected from the group consisting of palladium, silver, nickel, copper, tungsten, molybdenum and gold.

25. The particulate product of claim 21, wherein the platinum is a first metal and the multi-phase particles comprise an additional phase, in addition to said first material phase and said second material phase, said additional material phase comprising the third component, the third component being a second metal that is different than said first metal.

26. The particulate product of claim 21, wherein the platinum is a first metal and the multi-phase particles comprise an additional phase, in addition to said first material phase and said second material phase, said additional material phase comprising the third component, the third component being an oxide material.

27. The particulate product of claim 21, wherein the multi-phase particles are in a dry particulate form.

28. The particulate product of any one of claims 1, 4, 5 6, 12, 17, 18, and 20 wherein said metal is derived from thermal decomposition of at least a first precursor comprising a compound including said metal.

29. The particulate product of claim 28, wherein said compound comprises a platinum compound.

30. The particulate product of claim 28, wherein the multi-phase particles comprise an additional phase, in addition to said first material phase and said second material phase, said additional material phase comprising the third component.

31. The particulate product of any one of claims 1, 4, 5, 6, 12, 17, 18 and 20, wherein said first material phase is a catalyst supported on the surface of said second material phase.

32. The particulate product of any one of claims 1, 4, 5, 6, 12, 17, 18 and 20, wherein the multi-phase particles are in a dry particulate form.

33. An electrode comprising the particulate product of any one of claims 1, 4, 5, 6, 12, 17, 18 and 20.

34. An electrochemical cell including at least one electrode comprising the particulate material of any one of claims 1, 4, 5, 6, 12, 17, 18 and 20.

35. A fuel cell comprising the particulate product of any one of claims 1, 4, 5, 6, 12, 17, 18 and 20.

36. A fuel cell cathode comprising the particulate product of any one of claims 1, 4, 5, 6, 12, 17, 18 and 20.

37. The particulate product of any one of claims 1, 4, 5 6, 12, 17, 18 and 20 wherein the multi-phase particles comprise an additional phase, in addition to said first material phase and said second material phase, said additional material phase comprising the third component.

38. The particulate product of any one of claims 1, 4, 5, 6, 12, 17, 18 and 20 wherein the metal is a first metal and said first material phase further comprises the third component, the third component being a second metal that is different than said first metal.

39. The particulate product of claim 38, wherein said first metal and said second metal are in the form of an alloy.

40. The particulate product of claim 1, wherein said multi-phase particles comprise from about 5 weight percent to about 20 weight percent of said first material phase.

* * * * *

UNITED STATES PATENT AND TRADEMARK OFFICE
CERTIFICATE OF CORRECTION

PATENT NO.      : 6,635,348 B1
DATED           : October 21, 2003
INVENTOR(S)     : Hampden-Smith et al.

It is certified that error appears in the above-identified patent and that said Letters Patent is hereby corrected as shown below:

<u>Title page,</u>
Item [56], References Cited, please insert the following: -- U.S. Patent Application No. 09/030,051 by Kodas et al., filed on February 24, 1998, entitled, "Copper Powders, Methods for Producing Powders and Devices Fabricated from Same", including a copy of allowed claims. (Attorney Docket No. 41890-00980).

U.S. Patent Application No. 09/532,917 by Hampden-Smith et al., filed on March 22, 2000, entitled, "Electrocatalyst Particles, Methods for Producing Powders and Devices from Same", including a copy of allowed claims. (Attorney Docket No. 41890-00710).

U.S. Patent Application No. 09/698,363 by Kodas, filed October 27, 2000 entitled "Gold Powders, Method for Producing Powders and Devices Fabricated from Same", including a copy of allowed claims. (Attorney Docket No. 41890-00990).

Kodas, et al., Synthesis of Fullerene-Rhodium Nanocomposites via Aerosol Decomposition, Chem Mater. 1993, 5, 214-216. --

Signed and Sealed this

Eleventh Day of May, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,635,348 B1 Page 1 of 1
DATED : October 21, 2003
INVENTOR(S) : Hampden-Smith et al.

It is certified that error appears in the above-identified patent and that said Letters Patent is hereby corrected as shown below:

<u>Column 1,</u>
Line 19, insert the following paragraph:

-- STATEMENT REGARDING FEDERALLY-SPONSORED RESEARCH/ DEVELOPMENT
This invention was made with Government support under contracts N00014-95-C-0278 and N00014-96-C-0395 awarded by the Office of Naval Research. The Government has certain rights in the invention. --

Signed and Sealed this

Fifth Day of April, 2005

JON W. DUDAS
*Director of the United States Patent and Trademark Office*